(12) United States Patent
Goldberg et al.

(10) Patent No.: US 9,870,928 B2
(45) Date of Patent: Jan. 16, 2018

(54) SYSTEM AND METHOD FOR UPDATING AN ARM SCAN PROFILE THROUGH A GRAPHICAL USER INTERFACE

(71) Applicant: VEECO PRECISION SURFACE PROCESSING LLC, Horsham, PA (US)

(72) Inventors: David A. Goldberg, Horsham, PA (US); Jonathan Yutkowitz, Horsham, PA (US)

(73) Assignee: VEECO PRECISION SURFACE PROCESSING LLC, Horsham, PA (US)

( * ) Notice: Subject to any disclaimer, the term of this patent is extended or adjusted under 35 U.S.C. 154(b) by 0 days.

(21) Appl. No.: 14/928,079

(22) Filed: Oct. 30, 2015

(65) Prior Publication Data

US 2016/0126150 A1    May 5, 2016

Related U.S. Application Data

(60) Provisional application No. 62/073,727, filed on Oct. 31, 2014.

(51) Int. Cl.
*H01L 21/66* (2006.01)
*H01L 21/306* (2006.01)

(52) U.S. Cl.
CPC ........ *H01L 21/30604* (2013.01); *H01L 22/12* (2013.01); *H01L 22/20* (2013.01)

(58) Field of Classification Search
CPC ... H01L 22/26; H01L 21/30604; H01L 22/12; H01L 22/20
See application file for complete search history.

(56) References Cited

U.S. PATENT DOCUMENTS

| 6,123,865 | A | 9/2000 | Lin et al. |
| 8,617,348 | B1 | 12/2013 | Liu et al. |
| 2003/0084918 | A1 | 5/2003 | Kim |
| 2005/0048800 | A1 | 3/2005 | Wagener |

(Continued)

FOREIGN PATENT DOCUMENTS

WO    WO 2014/172835 A1    10/2014

OTHER PUBLICATIONS

Mauer et al., "Wet silicon etch process for TSV reveal", IEEE, Published in Electronic Components and Technology Conference (ECTC), 2014 IEEE 64th, May 27-30, 2014. pp. 1-5.

(Continued)

*Primary Examiner* — Peter Bradford
(74) *Attorney, Agent, or Firm* — Leason Ellis LLP

(57) ABSTRACT

A system and method for performing a wet etching process is disclosed. The system includes multiple processing stations accessible by a transfer device, including a measuring station to optically measure the thickness of a wafer before and after each etching steps in the process. The system also includes a controller to analyze the thickness measurements in view of a target wafer profile and generate an etch recipe, dynamically and in real time, for each etching step. In addition, the process controller can cause a single wafer wet etching station to etch the wafer according to the generated etching recipes. In addition, the system can, based on the pre and post-etch thickness measurements and target etch profile, generate and/or refine the etch recipes.

27 Claims, 30 Drawing Sheets

Wafer Profile Editor | 180mm wafer measured across diameter

(56) References Cited

U.S. PATENT DOCUMENTS

| | | |
|---|---|---|
| 2006/0003566 A1 | 1/2006 | Emesh |
| 2006/0097355 A1 | 5/2006 | Bauer et al. |
| 2006/0191637 A1 | 8/2006 | Zajac et al. |
| 2008/0078427 A1 | 4/2008 | Matsunaga |
| 2008/0185103 A1 | 8/2008 | Bornstein et al. |
| 2011/0222071 A1* | 9/2011 | Grotkopp .............. B24B 37/013 356/503 |
| 2011/0261371 A1* | 10/2011 | Schoenleber ........... B24B 49/12 356/630 |
| 2012/0053717 A1* | 3/2012 | Duboust ............... B24B 37/013 700/100 |
| 2012/0119355 A1 | 5/2012 | Chung et al. |
| 2012/0285482 A1 | 11/2012 | Beck |
| 2012/0285483 A1 | 11/2012 | Liu et al. |
| 2013/0267099 A1* | 10/2013 | Yu ....................... H01L 21/6708 438/748 |
| 2014/0242731 A1* | 8/2014 | Mauer .................... H01L 22/12 438/8 |

OTHER PUBLICATIONS

Mauer et al., "Lowering cost of silicon etch for revealing TSVs", Chip Scale Review, Nov./Dec. 2013. pp. 1-4.

* cited by examiner

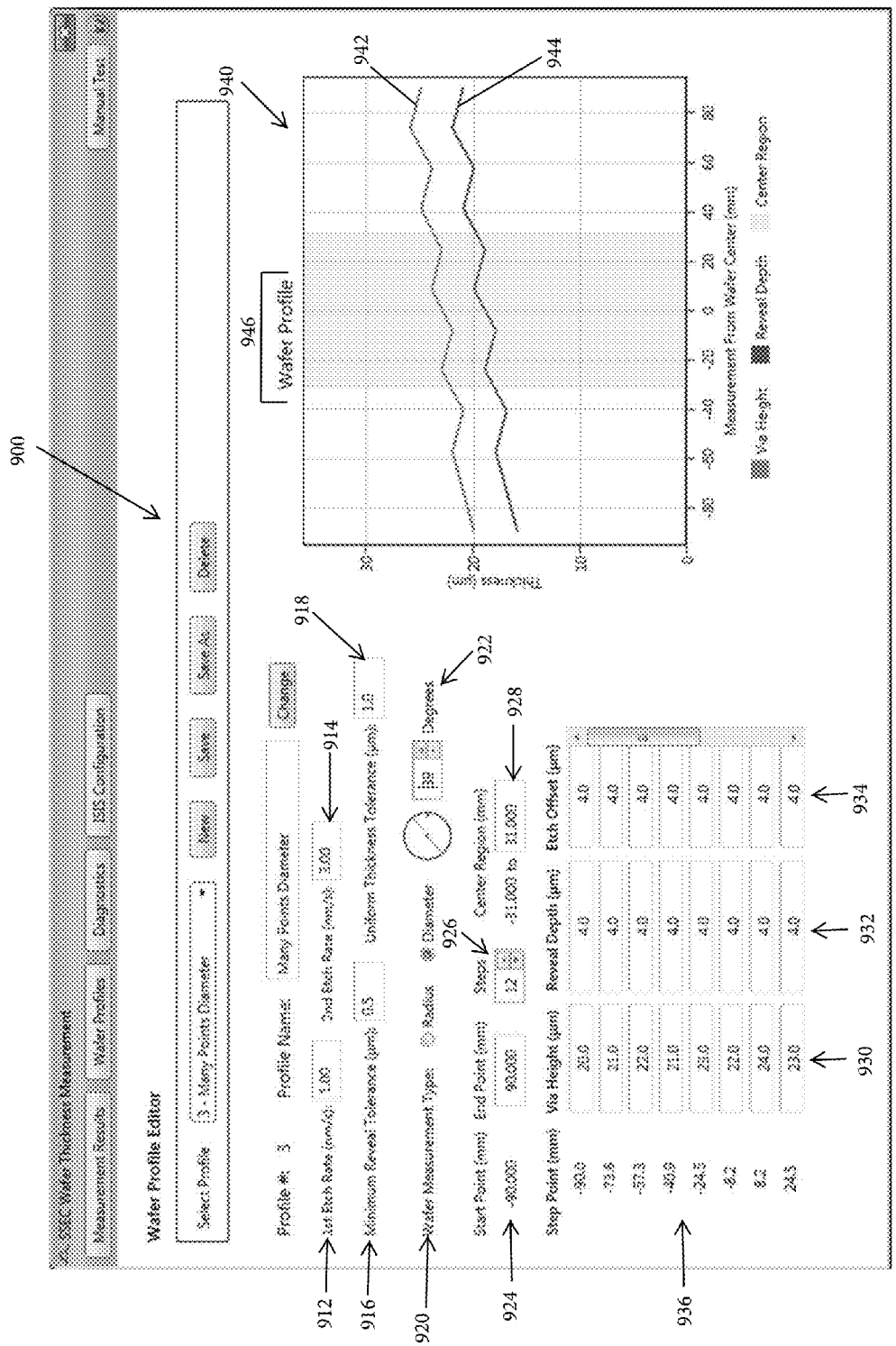
Fig. 9A - Wafer Profile Editor | 180mm wafer measured across diameter

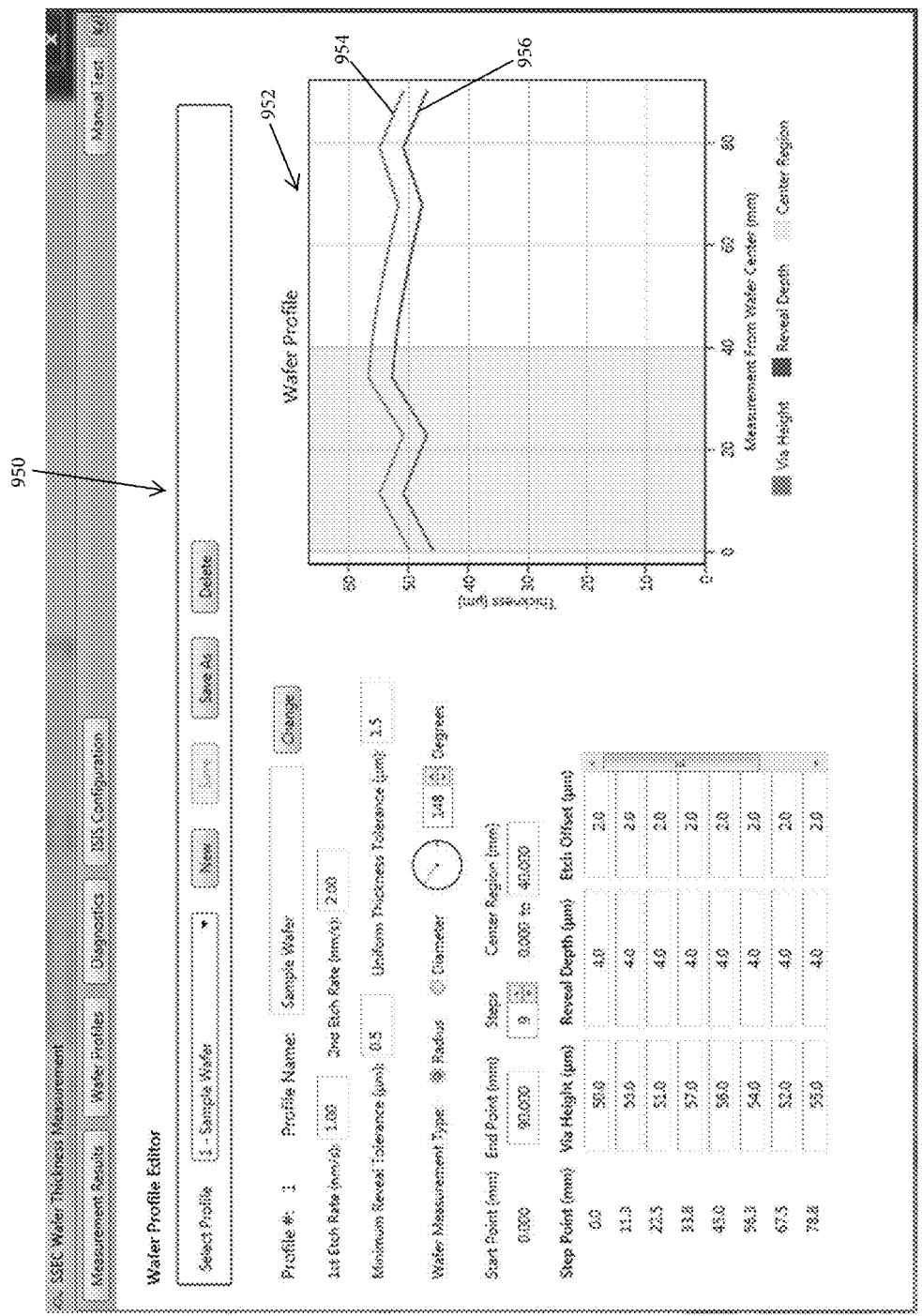
Fig. 9B - Wafer Profile Editor | 180mm wafer measured across radius

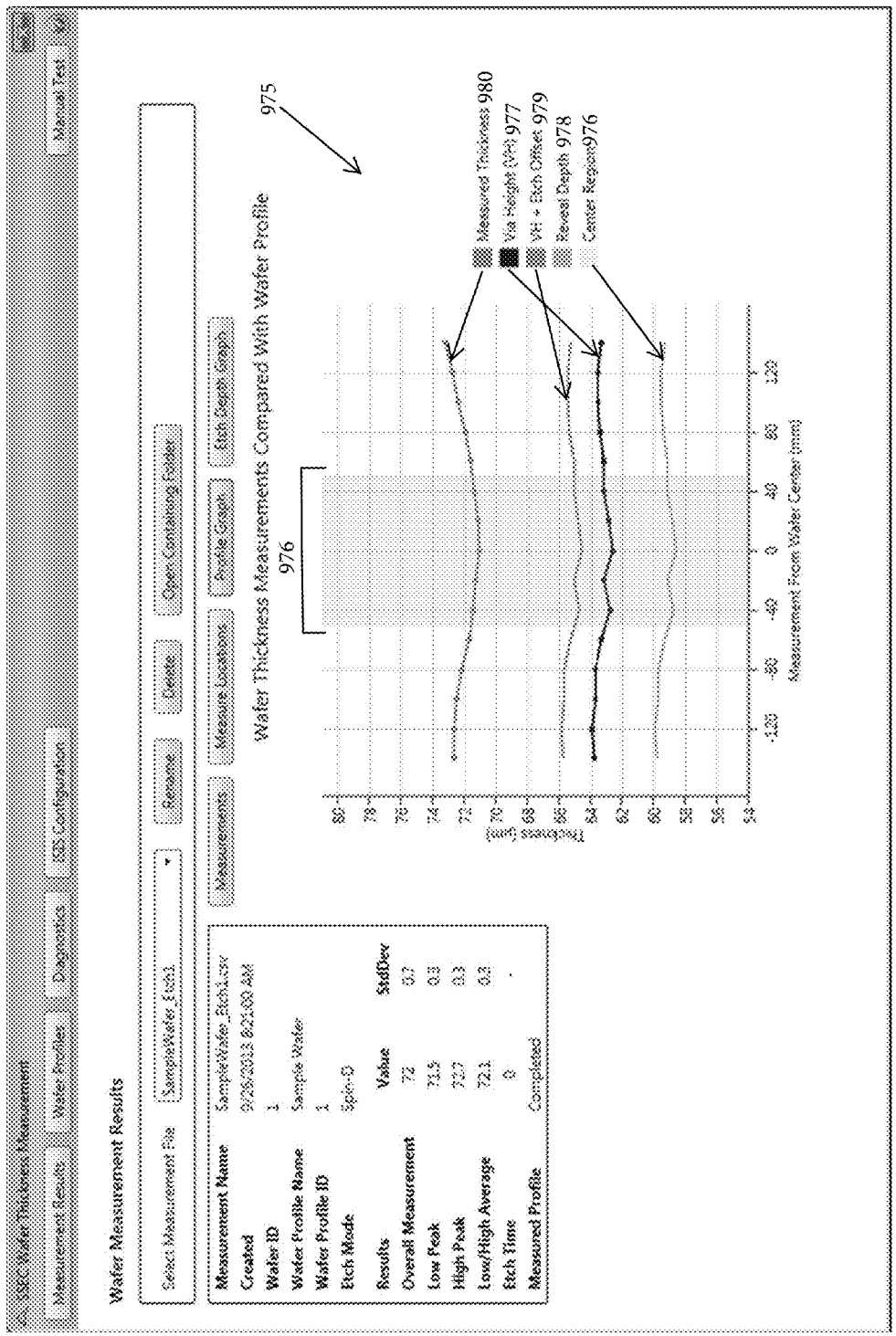
Fig. 9D – Measurement Results | Profile Graph (measurements taken across diameter of the wafer)

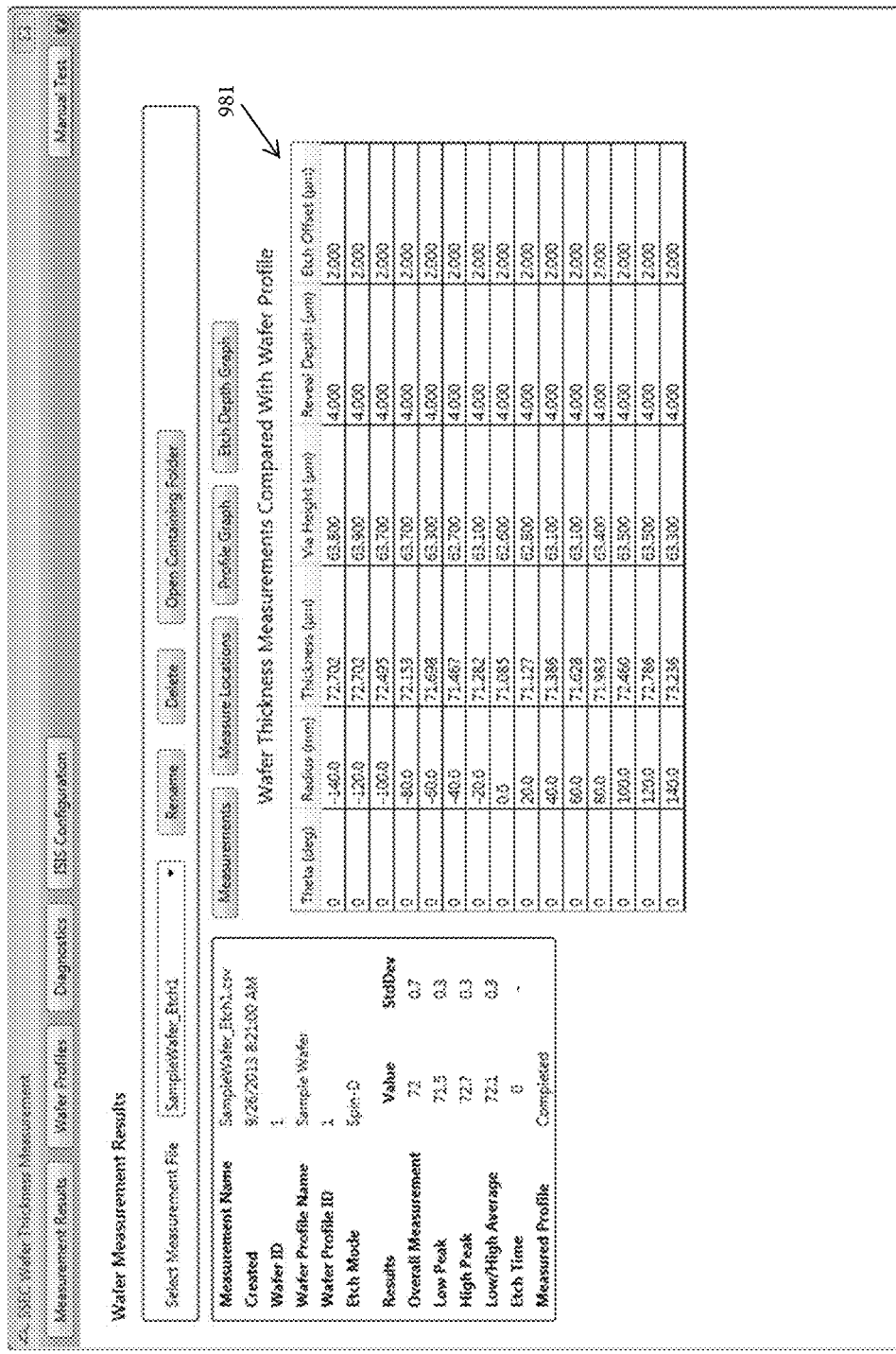
Fig. 9E – *Measurement Results | Raw Wafer Measurements View (right 3 columns are from wafer profile)*

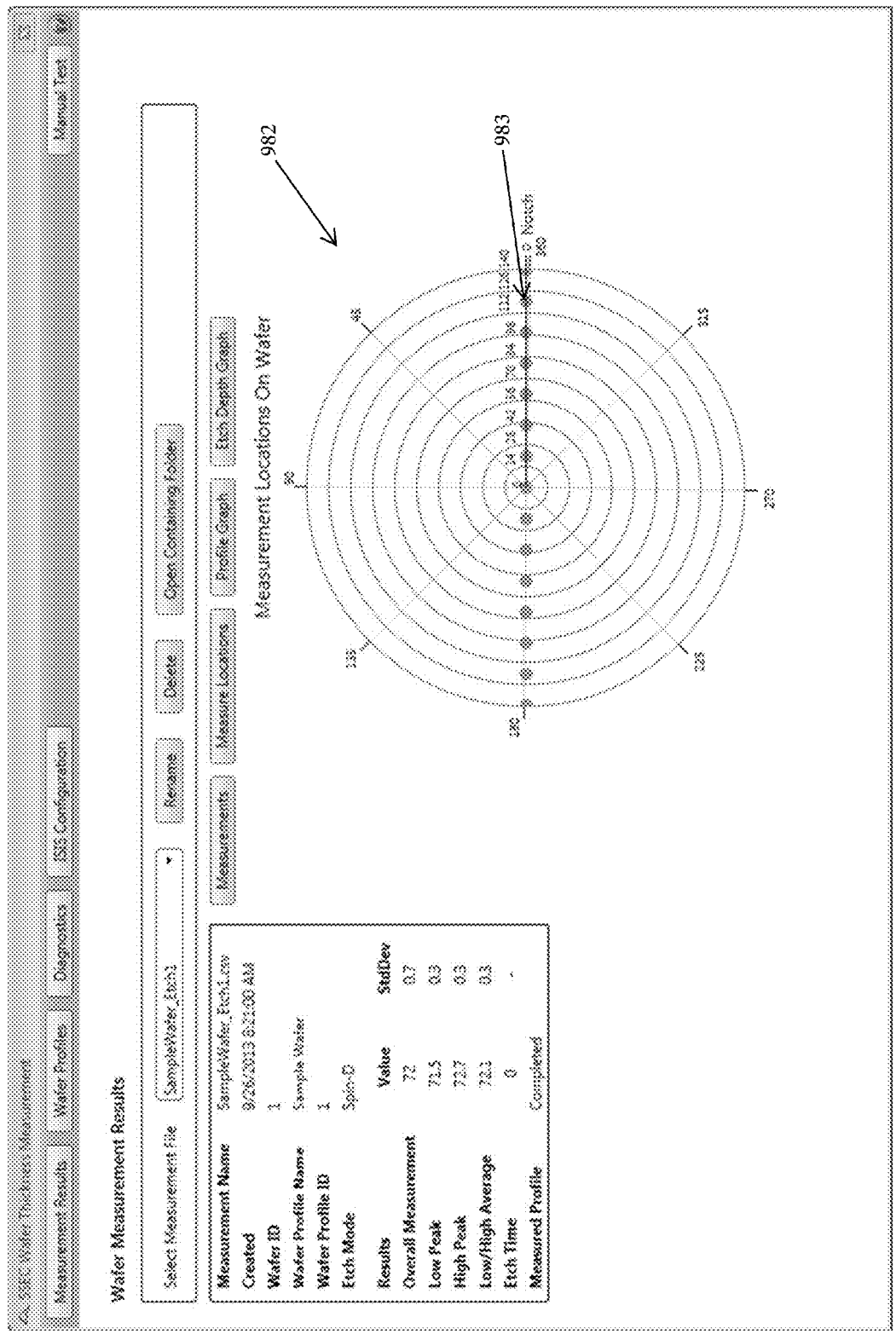
Fig. 9F - Measurement Results | Measurement Locations View

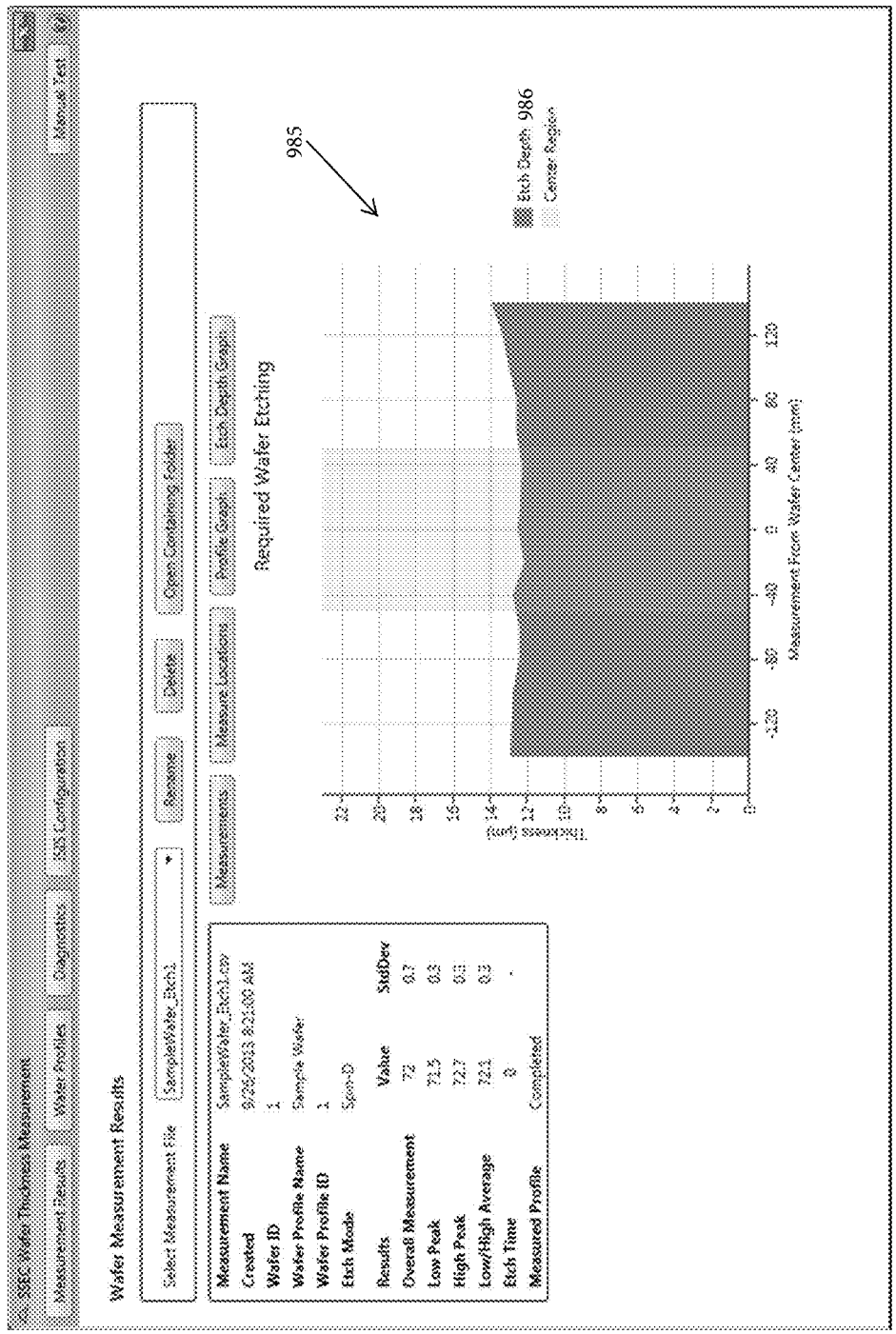
Fig. 9G – Measurement Results | Etch Depth Graph (remaining etching required)

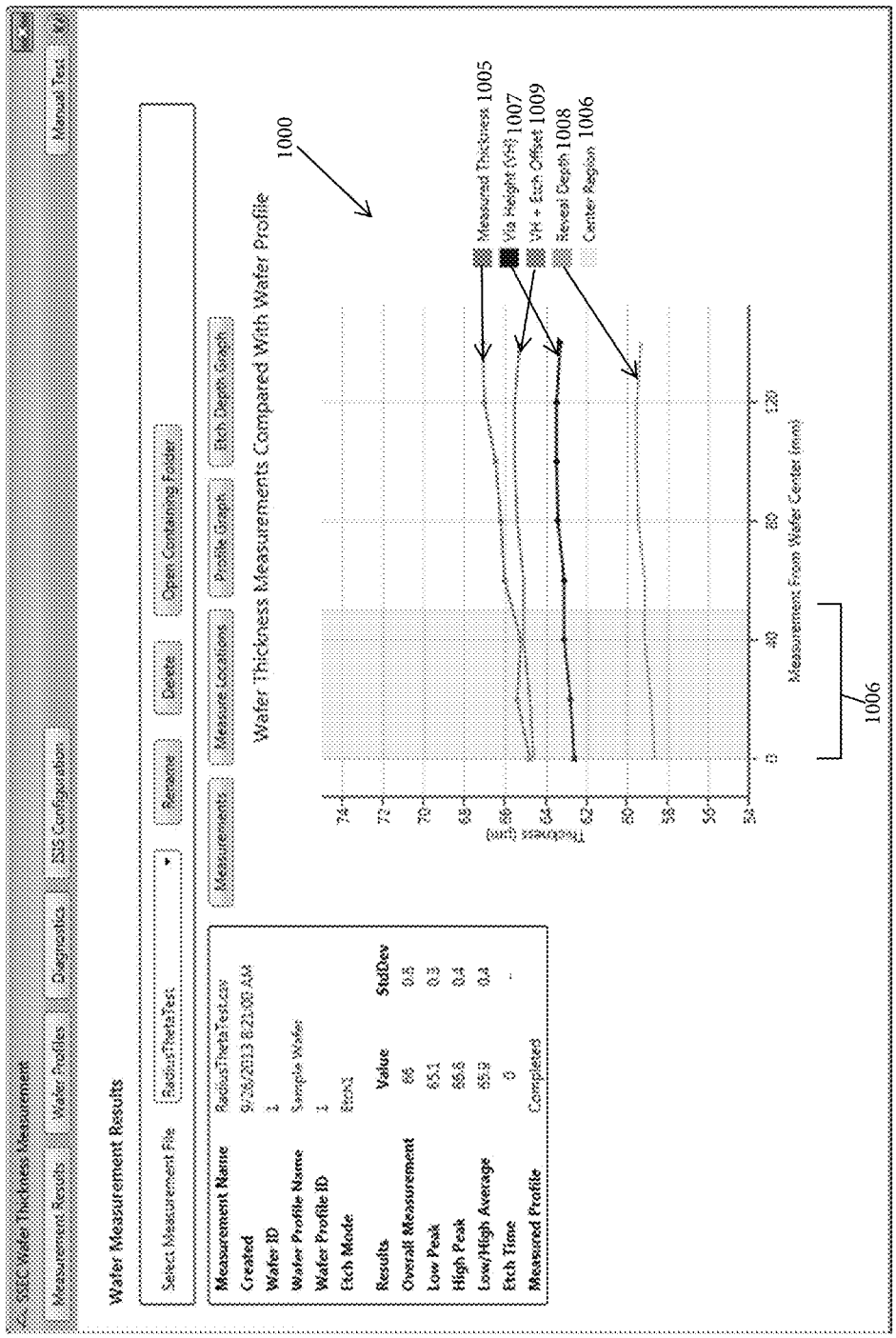
Fig. 9I – Measurement Results | Profile Graph (measurements taken along the radius of the wafer)

SYSTEM AND METHOD FOR UPDATING AN ARM SCAN PROFILE THROUGH A GRAPHICAL USER INTERFACE

CROSS-REFERENCE TO RELATED APPLICATIONS

The present application claims priority to U.S. patent application Ser. No. 62/073,727, filed Oct. 31, 2014, which is hereby incorporated by reference in its entirety.

TECHNICAL FIELD

The present invention generally relates to a system and method for etching semiconductor wafers for integrated circuits and, more specifically, relates to a system and method for etching semiconductor wafers (integrated circuit substrates) using a wet etching process that results in the etching of the wafer to a precise and uniform thickness. In accordance with the present invention, the wet etching process can be a two-stage process.

BACKGROUND 2.5 and 3D Integration is becoming a reality in device manufacturing. A critical process step is the thinning of the silicon wafer to reveal the metal filled Through Silicon Via (TSV). Grinding is used to remove the bulk of the silicon wafer. Currently a multistep sequence of processes that includes chemical mechanical planarization (CMP) and plasma etching has been used to complete the final thinning of the silicon. However, this conventional process has a number of disadvantages associated therewith including but not limited to the complexity of the process and the associated costs. As described hereinafter, the present invention is directed at overcoming these deficiencies associated with the conventional process by providing a simple, cost effective method to wet etch the remaining silicon to reveal the TSVs.

TSV wafers (wafers are also referred to herein as substrates) are manufactured by creating vias (holes) in the top surface of the wafer. These vias extend part way through the thickness of the wafer. The holes are then filled in with a conductive material (studs), with or without an insulating liner. The conductor-filled vias are referred to herein as TSVs. The bottom side of the wafer, opposite of where the TSVs were created, is then put through a grind process where mechanical grinding reduces the thickness of the substrate, effectively reducing the distance from the bottom of the via to the bottom surface of the substrate. Complete grinding of the substrate to expose the conductor is undesired as this would result in ions from the conductive material being smeared across the substrate surface, thereby altering the electrical properties at the contaminated sites and reducing yield. Any number of manufacturing steps can be performed on the top side of the wafer prior to further processing of the bottom side depending on the application. For example, for a device wafer, the full device structure and metallurgical components can be added to the top surface of the wafer. For 2.5D interposer applications, the top side wiring/interconnects can be completed. The wafer with TSVs is then typically mounted using an adhesive layer on a carrier wafer with the top of the wafer toward the carrier wafer.

The grinding process leaves a layer of substrate material above the TSVs that can have variations in thickness that is radially dependent, for instance, thicker at the edge of the wafer, uniform across the wafer or thicker at the center of the wafer than at the edge (within wafer thickness variation). Likewise there can be a difference in height of the substrate material above the TSVs on a wafer to wafer basis (wafer to wafer thickness variation). These differences in the layer above the TSVs can be greater than the allowable difference in height of the exposed TSVs.

Integrated circuit wafers, which typically are in the form of flat round disks (although other shapes are possible) and often are made from silicon, Gallium Arsenide, or other materials, may be processed using various chemicals. One process is the use of liquid chemical etchant to remove material from or on the substrate, this process is often referred to as wet etching. Commonly used methods include submerging the wafers in chemical baths (referred to as "batch processing" or "immersion processing"), or dispensing fluid on a wafer while spinning (referred to as "single wafer processing"). As wafer sizes increase and geometry sizes decrease, substantial benefits can be realized by employing single wafer processing inasmuch as the processing environment may be better controlled.

The etch rate of wet etch process will vary with changes in etchant concentration. The addition of small amounts fresh chemical etchant to sustain the etch rate is a common practice when the chemical etchant is recirculated. Typically the addition is based on a mathematical model based on wafers processed or elapsed time from etchant preparation. If there is no measurement feedback the etch rate will hold only as well as the mathematical model can predict the need to inject fresh chemical etchant. Likewise any external influences will not be accounted for and the etch rate will not remain constant. The depth of the etch process is a function of etch rate and time. Time is well controlled but the etch rate can vary based on several factors. Likewise the required depth to etch will vary as there will be within wafer thickness variation and wafer to wafer thickness variations. The foregoing impacts the ability of existing wet-etching process systems to precisely etch wafers to the desired thickness and uniformity and consistently in a production environment. Accordingly the lack of a method to process wafers according to etch recipes that are accurately tailored to the amount of material to be removed from each wafer limits the capability of existing systems to expose a precise depth on each wafer processed.

Similar to thinning TSV wafers, the conventional process for thinning non TSV wafers involves grinding to remove the bulk of the wafer and a multistep sequence of processes that includes chemical mechanical planarization (CMP) and plasma etching to complete the final thinning of the wafer. However, this conventional process has a number of disadvantages associated therewith including but not limited to the complexity of the process and the associated costs. As described hereinafter, the present invention is directed at overcoming these deficiencies associated with the conventional process by providing a simple, cost effective method to wet etch the remaining substrate to a desired thickness and surface uniformity. Thus, there exists a need for a system and method for: (1) determining quantity and pattern of material to be removed from the substrate; (2) removing the material to the desired depth and uniformity efficiently in a production environment. The present invention achieves these objectives as described below.

SUMMARY

In one embodiment, the present invention is directed a method for wet etching a wafer using a wet etching processing system that includes a plurality of stations to produce a wafer having a desired final target wafer thickness profile. As described herein, this method can employ a dual etching step (two stage etching) in that the wafer is etched in at least two discrete steps to achieve two different objectives.

One exemplary method includes the steps of: measuring, at a measurement station, an initial thickness of the wafer; etching, at a first etching station, the surface of the wafer according to a first etch recipe and using a first etchant to thin the wafer material and leave a layer of residual wafer material having a prescribed residual substrate material thickness (RST) above the TSVs, wherein the first etch recipe is based on the measured initial thickness; etching, at a second etching station, the surface of the wafer according to a second etch recipe using a second etchant to thin the wafer material such that a respective portion of each of the TSVs having the prescribed reveal height extend from the surface; and wherein the plurality of stations are disposed within a housing and are accessed by an automated wafer transfer device that is configured to controllably move the wafer between stations, thereby allowing measurements of the wafer in real-time as the wafer is undergoing etch processing.

Another exemplary method includes the steps of: providing, at a process controller including a memory and a processor configured by executing instructions in the form of code therein, a reference height for one or more of the TSVs, the prescribed reveal height and a prescribed residual substrate material thickness (RST), wherein the prescribed RST is a measure of the target thickness of the layer of residual wafer material at each of the plurality of radial locations after a first etching step; measuring, at a measurement station, an initial thickness of the wafer; calculating, by the process controller, a respective first etch depth for each of the plurality of radial locations, wherein the respective first etch depth for a particular radial location is the amount of material to be removed at the particular radial location during the first etching step and is a function of the measured initial thickness of the particular radial location, the reference height of one or more of the TSVs and the prescribed RST, and wherein the respective first etch depths are non-uniform; generating, with the process controller, a first-etch recipe based on the calculated respective first etch depths, wherein the first etch recipe controls movement of a nozzle during the first etching step causing the nozzle to selectively dispense a first etchant onto each of the plurality radial locations thereby thinning the wafer at each radial location the respective first etch depths; etching, at a first etching station, the surface of the wafer according to the first etch recipe and using the first etchant; etching, at a second etching station, the surface of the wafer according to a second etch recipe using a second etchant to thin the wafer material such that a respective portions of each of the TSVs having the prescribed reveal height extend from the surface; and wherein the plurality of stations are disposed within a housing and are accessed by an automated wafer transfer device that is configured to controllably move the wafer between stations, thereby allowing measurements of the wafer in real-time as the wafer is undergoing etch processing.

According to another aspect, an exemplary method includes the steps of: providing, at a process controller including a memory and a processor configured by executing instructions in the form of code therein, wafer profile data including a prescribed etch offset and a target final wafer thickness profile that defines a target final thickness parameter for each of a plurality of radial locations on a surface of the wafer after the second etch step; measuring, at a measurement station, an initial thickness of the wafer at a plurality of points across the surface of the wafer; calculating, using the configured processor, a first etch profile according to the etch offset, the target final wafer thickness parameter of each radial location and the measured initial thickness of each radial location; generating, using the configured processor, an etch recipe for the first etch step according to the first etch profile; etching, at an etching station using a first etchant having a first etch rate, the wafer according to the first etch recipe; measuring, at the measurement station, a post-etch thickness of the wafer at a plurality of points across the wafer; determining, using the configured processor, that the post-etch thickness of the wafer matches the final wafer thickness profile; etching, at an etching station using a second etchant and having a second etch rate, the wafer according to a second etch recipe; and wherein the plurality of stations are disposed within a housing and are accessed by an automated wafer transfer device that is configured to controllably move the wafer between stations, thereby allowing measurements of the wafer in real-time as the wafer is undergoing etch processing.

The present process, in at least one aspect, is thus directed to a wet etch process as a simple and cost-effective alternative to the CMP/plasma etch TSV reveal process.

BRIEF DESCRIPTION OF THE DRAWINGS

FIG. 9A is a screenshot of a graphical user interface in accordance with at least one embodiment disclosed herein;

FIG. 9B is a screenshot of a graphical user interface in accordance with at least one embodiment disclosed herein;

FIG. 9D is a screenshot of a graphical user interface in accordance with at least one embodiment disclosed herein;

FIG. 9E is a screenshot of a graphical user interface in accordance with at least one embodiment disclosed herein;

FIG. 9F is a screenshot of a graphical user interface in accordance with at least one embodiment disclosed herein;

FIG. 9G is a screenshot of a graphical user interface in accordance with at least one embodiment disclosed herein;

FIG. 9I is a screenshot of a graphical user interface in accordance with at least one embodiment disclosed herein;

DETAILED DESCRIPTION OF CERTAIN EMBODIMENTS OF THE INVENTION

FIGS. 1-5 illustrate a system 100 for performing a wet etching process in accordance with one embodiment of the present invention. The system 100 can thus be thought of as being a wet-etching facility for manufacturing semiconductor devices.

It will be appreciated that the teachings disclosed in the commonly owned U.S. patent application serial numbers which have been incorporated herein previously, can be implemented in the system 100.

In a wafer wet treatment process of a semiconductor device manufacturing process, there is generally an etching process and a cleaning process as mentioned hereinbefore. A single wafer wet treatment apparatus used in an etching process dispenses chemical etchant in a controlled manner on a substrate for inducing a chemical reaction during a fixed time. It will be understood that the terms "wafer" and "substrate" are used interchangeably herein. A single wafer wet treatment apparatus used in a cleaning process causes a chemical solution to be dispensed onto a substrate and can also include a scrubbing device to mechanically scrub the substrate. Each of the wet treatment apparatuses can include a bath that collects fluids that overflow and discharge to an outer tank (or bath) or recirculate. The single wafer wet treatment apparatuses are further composed of conduits (e.g., pipes) which supply or discharge fluids (e.g., chemicals, water, solutions and the like) in the bath, and various kinds of control means for controlling fluid temperature or concentration and other process parameters as further described herein. The wafer wet treatment process can also include a measuring step whereby the wafers are measured for thickness.

In conventional systems for performing wet etching, there are a number of pieces of equipment that are used; however, there is generally a lack of integration between the pieces of equipment. More specifically, while the measurement step is performed at a first location, there is often the need for physically transferring the wafer to another remote station for the etching process using a wafer wet etching apparatus, and there is often a need for physically transferring the wafer to another remote station prior to completion of the etching process, for example, to clean the wafer or measure the wafer. This adds additional delay to the process since there can be wait times before reintroducing the wafer back to the wafer wet treatment apparatus. This conventional process is largely a manual process in which a technician manually moves the wafers between different pieces of equipment.

In direct contrast to the largely non-integrated conventional systems, the system 100 of the present invention is for the most part a largely or fully integrated system, thereby greatly reducing or eliminating unnecessary wait or down times, etc. between processing steps.

Figure 1:
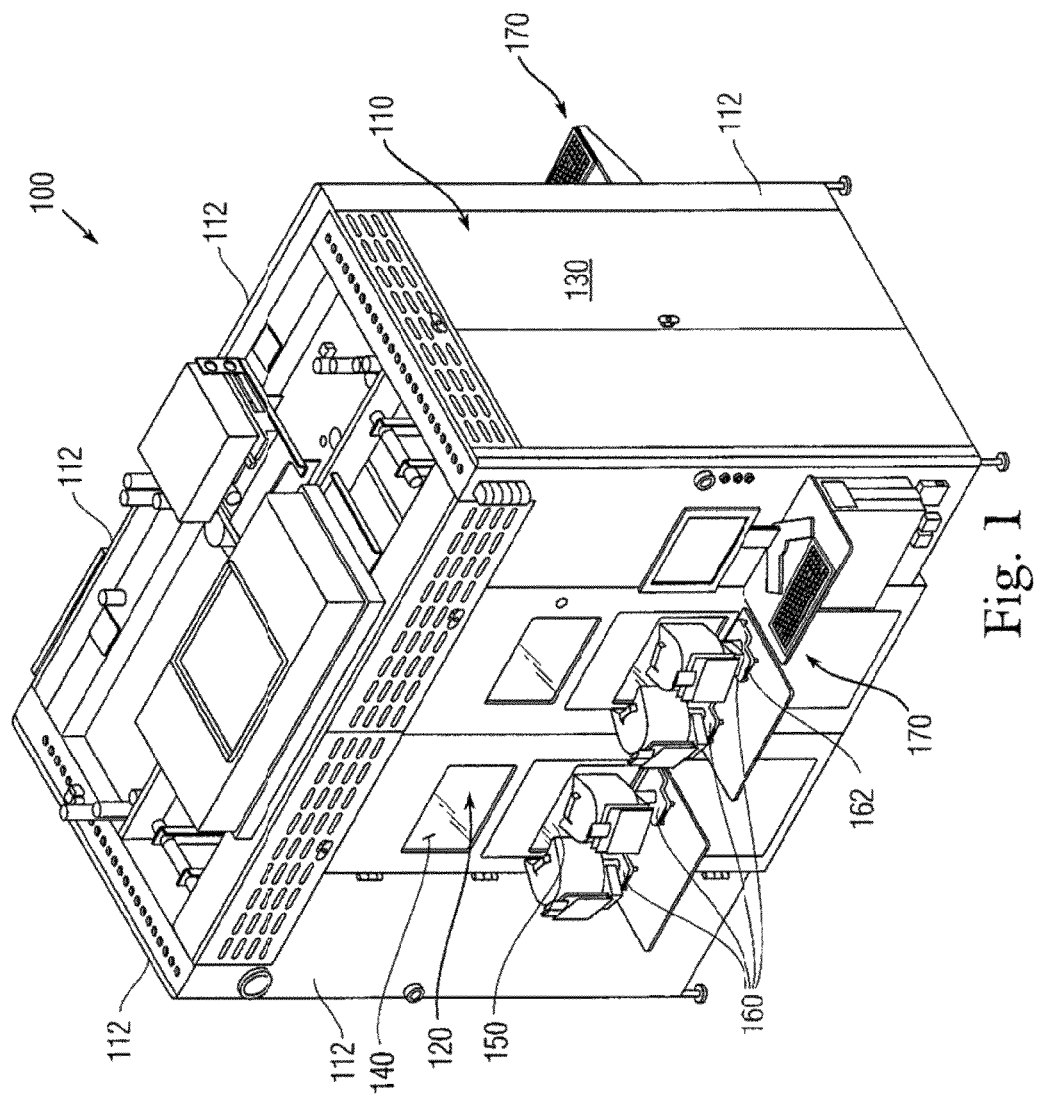
FIG. 1 is a perspective view showing a system for performing a wet etching process in accordance with one embodiment disclosed herein.
Figure 2:
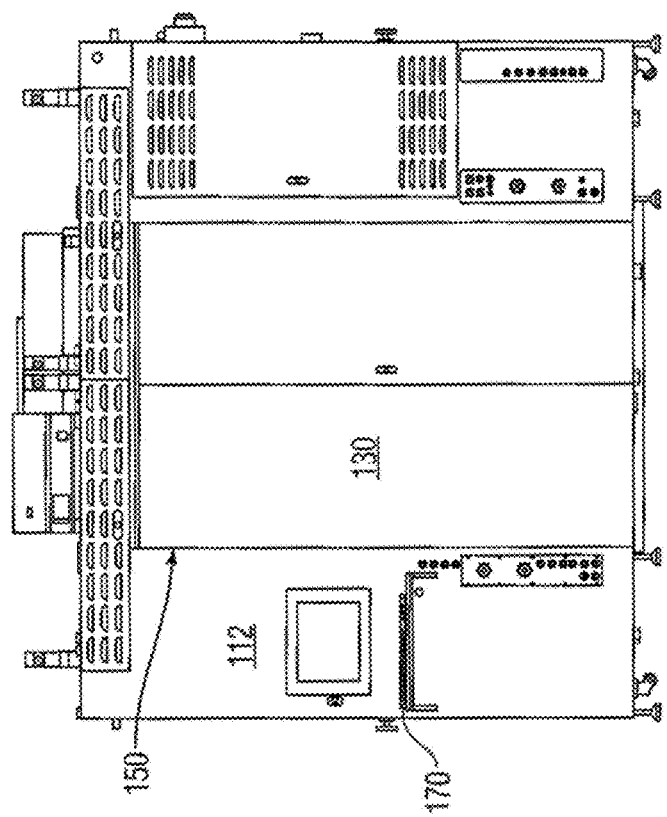
FIG. 2 is a front plan view showing a system for performing a wet etching process in accordance with one embodiment disclosed herein.

The system 100 is an integrated system that is defined by a number of different devices (equipment pieces) that are located at different stations within a housing 110. As shown in FIG. 1, the housing 110 is generally in the form of an upstanding cabinet or the like that has a plurality of walls 112 that define a hollow interior 120. The hollow interior 120 can be accessible through a number of different access points, including but not limited to a door assembly 130 shown at one end of the housing 110 and one or more side walls 112 can include windows 140 to allow direct access and viewing of the hollow interior 120 and more particularly, the equipment and processing stations included therein. In one embodiment, as illustrated, one side wall 112 can include transparent windows 140 and one or more access points 150. The opposite side walls 112 can include an access point 150 of a different form, such as a set of doors as shown in FIG. 2.

Each access point 150 can be in the form of an opening that provides an entrance into the hollow interior 120 and in addition, a wafer holding and loading device (loadport) 160 can be provided at such location along one side wall 112. The device 160 can be any number of conventional devices that are designed to hold and permit access to wafers contained therein and can be in the form of a FOUP loadport, with FOUP being an acronym for Front Opening Unified Pod or Front Opening Universal Pod. A FOUP is a specialized plastic enclosure with a cassette therein designed to hold silicon wafers securely and safely in a controlled environment, and to allow the wafers to be removed for processing or measurement by tools equipped with appropriate loadports and robotic handling systems. As illustrated in FIG. 1, the device 160 can be in the form of an input/output cassette device.

The wafer holding and loading device (loadport) 160 can be in the form of an input/output wafer cassette device which includes a housing which is configured to receive and hold a cassette holding a plurality of wafers. For example, the housing can include a door 162 at each end thereof, with one door 162 facing outwardly away from the hollow interior 120 so as to allow a technician to load one or more wafers, into the loadport 160. Another door 162 faces and is accessible within the hollow interior 120 so as to permit automated removal (and reloading) of the wafer from within the hollow interior 120 to allow the wafer to be transferred to the various stations contained within the hollow interior 120. The wafer holding and loading device 160 can be of the type that includes a plurality of racks or the like for holding a plurality of wafers in a vertically stacked manner.

The housing (cabinet) 110 can also include one or more computer terminals 170 which operate in the manner described below and allow the technician to both control and monitor the processing of the wafer within the housing 110 as the wafer is subjected to the various processing steps at the different stations.

It will also be appreciated that the system 100 can include a number of different conventional operating systems to provide for power, cooling, heating, fluid flow (plumbing architecture), etc. The system 100 also includes a number of different safety features including an emergency off button and audible and/or visual alarms to alert the technician when an abnormal condition is observed within the system 100.

Figure 3:
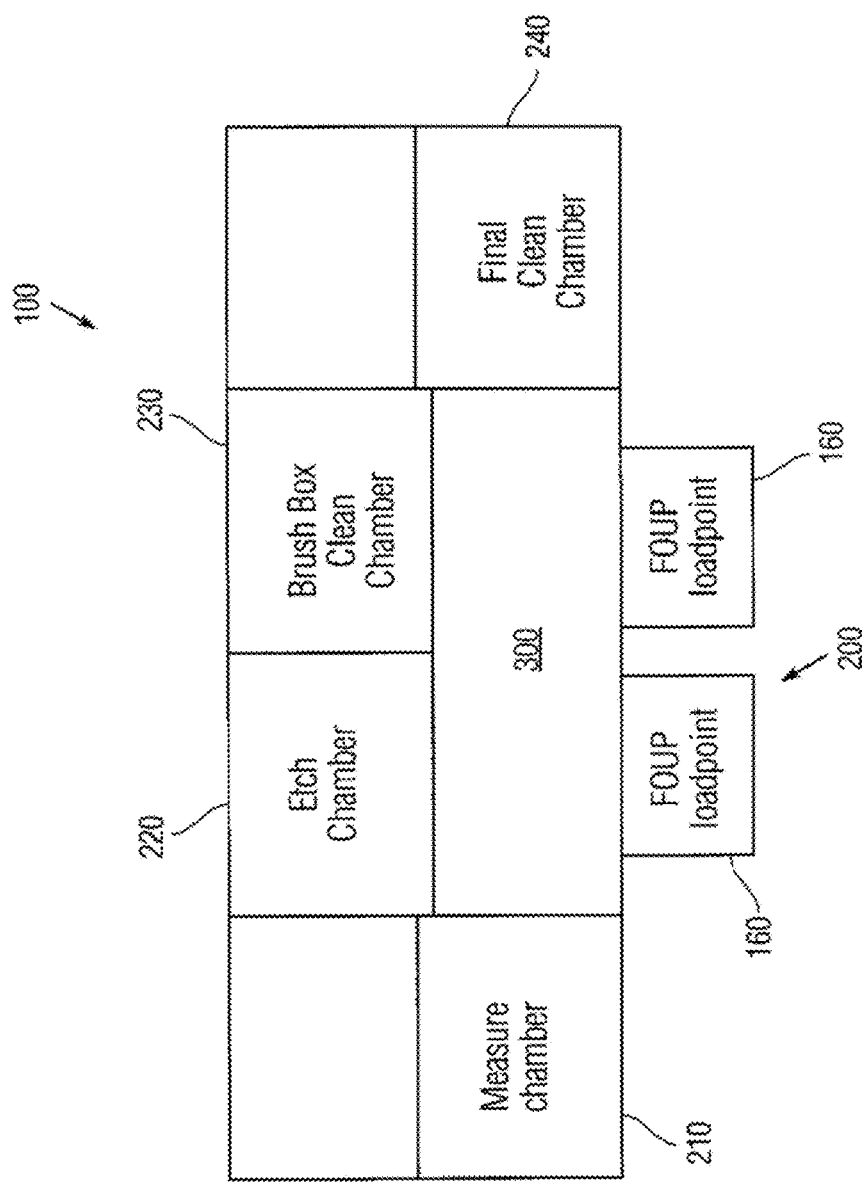
FIG. 3 is a block diagram showing an exemplary configuration of a system for performing a wet etching process in accordance with one embodiment disclosed herein.

FIG. 3 is a schematic view showing exemplary stations that are contained within the housing (cabinet) of the system of the present invention. In general, the system 100 includes a first station 200 that contains one or more devices 160 for holding wafers (e.g., FOUP loadports) and providing direct access to the interior 120 of the housing 110 as described above. A second station 210 is in the form of one or more measuring chambers for measuring different properties of the wafer as described below. A third station 220 contains one or more etch chambers for performing a single wafer wet-etching process on the wafer. A fourth station 230 and optionally also a fifth station 240 are cleaning chambers in which the processed wafer is cleaned. As a result of the system 100 being an automated system, a wafer transfer device 300 is provided and is configured to move one or more wafers from between the various stations of the system 100. The wafer transfer device 300 can take any number of different forms but generally is in the form of an automated device, such as a robot, that is configured to controllably grasp, move and release one or more wafers. Generally, the wafer transfer device 300 includes a robotic arm that has a grasp (holding) mechanism for grasping and holding a wafer and has a base about which the robotic arm can move in multiple directions (multiple degrees of freedom). It should be understood that one or more of the process stations/chambers can be combined to have multiple process functions. For example, the measuring apparatuses used in the measuring chamber can be incorporated into the wet etch chamber to provide a combined measuring and etch station. By way of further example, the etch chamber and cleaning chamber can be combined into multi-process chambers as would be understood by those skilled in the art.

Thus, the wafer transfer device 300 can thus be thought of as being an automated wafer handler. It will also be appreciated that the wafer transfer device is a computer operated device and therefore, as described below, operates in accordance with the execution of a software application, etc. In addition, it will also be appreciated that the wafer transfer device 300 can be operated in response to user generated commands, such as commands that are generated by the technician at a user interface, such as the computer terminal 170.

While in FIG. 3, the wafer transfer device 300 is shown as being centrally located within the interior of system 100, it is not limited to assuming such a position within the system so long as the wafer transfer device 300 is located at a position that allows the device 300 to access each of the stations of the system and transfer the wafer between all of the necessary stations.

Each of the individual stations mentioned above is described in greater detail below.

First Station 200

As mentioned above, the first station 200 includes one more wafer holding and loading devices (FOUP loadport or input/output cassettes) 160 for holding wafers in a sealed and secure manner. Any number of different conventional wafer holding and loading devices (FOUP loadport) 160 can be used in system 100. Typically, the wafer holding and loading device (FOUP loadport) 160 is of a type that contains a cassette holding the wafers. The door 162 is positioned such that the wafer transfer device (robot) 300 can directly access the wafers from the FOUP. The wafer holding and loading device (FOUP loadport) 160 can also include recognition features, such as RFID tag, barcode reader, etc. to allow it to be identified by readers on tools, etc. It should be understood that loadport 160 is not limited to being of an FOUP type. Various wafer holding and loading mechanisms can be used in addition to FOUPs having built in cassettes such as wafer boxes having removable cassettes as would be understood by those skilled in the art.

While FIG. 3 shows two blocks as constituting the station 200, it will be understood that this is only for illustrative purposes and is not limiting of the present invention since, as shown in FIG. 1, system 100 can include more than one wafer holding and loading device (FOUP loadport) 160. Moreover, it should be understood that each loadport 160 can be configured to receive one or more cassettes.

Second Station 210

As mentioned above, the second station 210 is a measuring station (wafer inspection station) in which a property of the wafer can be measured and in particular, the thickness of the wafer can be measured. The second station 210 thus includes a measuring device 600 for measuring one or more properties of a wafer. Any number of different types of measuring devices can be used. In accordance with one embodiment of the present invention, the measuring device 600 is in the form of an imaging device that is configured to measure one or more properties (e.g., wafer thickness and surface profile) of the wafer.

Figure 4:
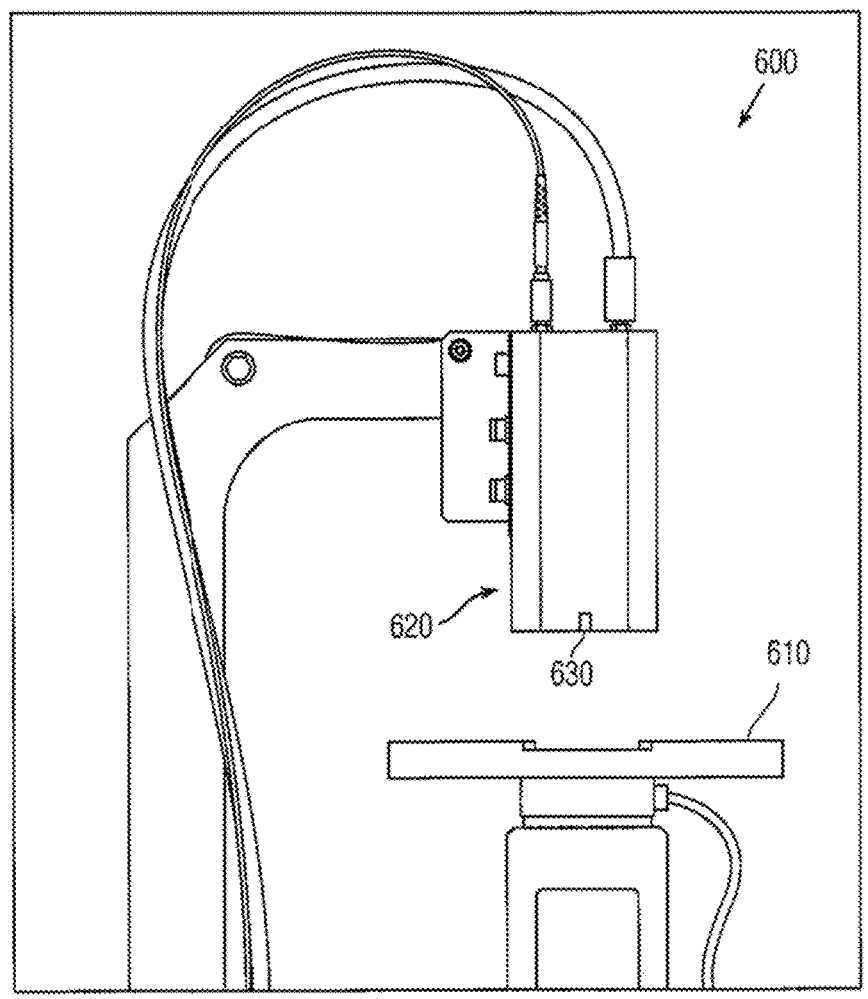
FIG. 4 is a front plan view showing a measurement station in accordance with one embodiment disclosed herein.

FIG. 4 shows one exemplary measuring (imaging) device 600 that includes a platform 610 for receiving and holding a wafer in a fixed orientation (e.g., in a horizontal orientation). The platform 610 can be of an adjustable type to accommodate different sized wafers. For example, the diameters of wafers can vary considerably and thus, the platform 610 is constructed to allow different sized wafers to be placed and supported thereon. In addition, the platform 160 can move in any number of different directions (x, y, z) (i.e., the platform 610 has multiple degrees of freedom of movement) and is rotatable such that the wafer can be rotated during the measuring process.

The imaging device 600 also includes a non-contact measurement component 620 that measures at least the thickness of the wafer and is also configured to detect (measure) and generate a surface profile for the wafer. The non-contact measurement component 620 includes imaging equipment and can be part of an automated device to allow movement of the component 620 with respect to the wafer on the platform 610. For example, the non-contact measurement component 620 can be in the form of an arm or the like that can move in any number of different directions (x, y, z) with respect to the wafer (i.e., the component 620 has multiple degrees of freedom of movement). Alternatively or in addition, the component 620 can be held in a stationary position and platform 610 supporting the wafer can be moved in any number of different directions (x, y, z) with respect to the component 620 and/or rotated.

The non-contact measurement component 620 includes one or more sensors 630, such as an optical sensor (e.g., an IR light sensor) and a light source that is directed at the surface of the wafer. The reflected light (after contacting the wafer) is collected by the imaging device and based on the collected information (and after processing thereof in accordance with execution of software), a number of different measurements of the wafer can be taken and recorded. More particularly, light is reflected at the top and bottom of each surface in the film stack (the layers of material that form the wafer) and the distance in reflected light is corrected according to the refractive index of the material in order to calculate depth. For example, the imaging device can measure the following properties (which is not an exhaustive list): wafer thickness; bow, warp, flatness; surface roughness; total thickness variation (TTV); optical inspection pattern recognition; and TSV depth, etc. One commercial source for one or more components of the imaging device is ISIS Sentronics gmbH, Germany; however, other commercial sources are available.

The operation of the imaging device 600 is described in greater detail hereinafter.

In accordance with one aspect of the present invention and in direct contrast to conventional systems, the measuring station 210 is directly incorporated into and contained within the housing (cabinet) 110. As a result, the second station 210 and the imaging device 600 contained thereat is within reach of the wafer transfer device (robot) 300. This positioning allows the automated wafer transfer device 300 to easily move a wafer between the second station 210 and any of the other stations of the system 100. This is in direct contrast to conventional system in which measuring equipment is located at a remote location and requires wafers to be removed from the etch process in order for a measurement to be taken. After such measurement is taken, there is a wait period in which the wafer is held before being introduced back into the etch processing equipment. This leads to complexity and time delays, thereby directly and adversely impacting the number of wafers that can processed in a given time period. Moreover, in a production setting, these inefficiencies lead to batch processing of wafers, wherein multiple wafers are measured prior to being returned to the etch processing equipment. Accordingly any feedback regarding the etching process is only obtainable on a batch to batch basis and not in real time (i.e., on a wafer to wafer basis) thereby preventing the adjustment of process parameters in real time (on a wafer to wafer basis) and resulting in a decrease in quality and an increase in waste. Incorporating the measuring device into system 100 and implementing a process that includes a measuring step for each wafer before and after etching in a single wafer wet etch chamber as further described herein provides a system capable of tailoring the etch process parameters to the specific characteristics of each wafer and feedback concerning previously etched wafers in real time. Accordingly the system can achieve higher quality, minimize waste and the benefits generally associated with a single wafer wet etch process and in the case of the present invention as described herein can be implemented as part of a dual wet etch process which includes at least two etching steps.

Third Station 220

The third station 220 is an etch station in which the wafer undergoes the single wafer wet etching process. As mentioned before, a single wafer wet etching process is generally performed by dispensing a certain amount of chemical etchant onto a wafer disposed within the station, and causing a chemical reaction with a contacted surface of the wafer so that the unnecessary portion of the contacted surface is etched by the chemical.

Figure 5:
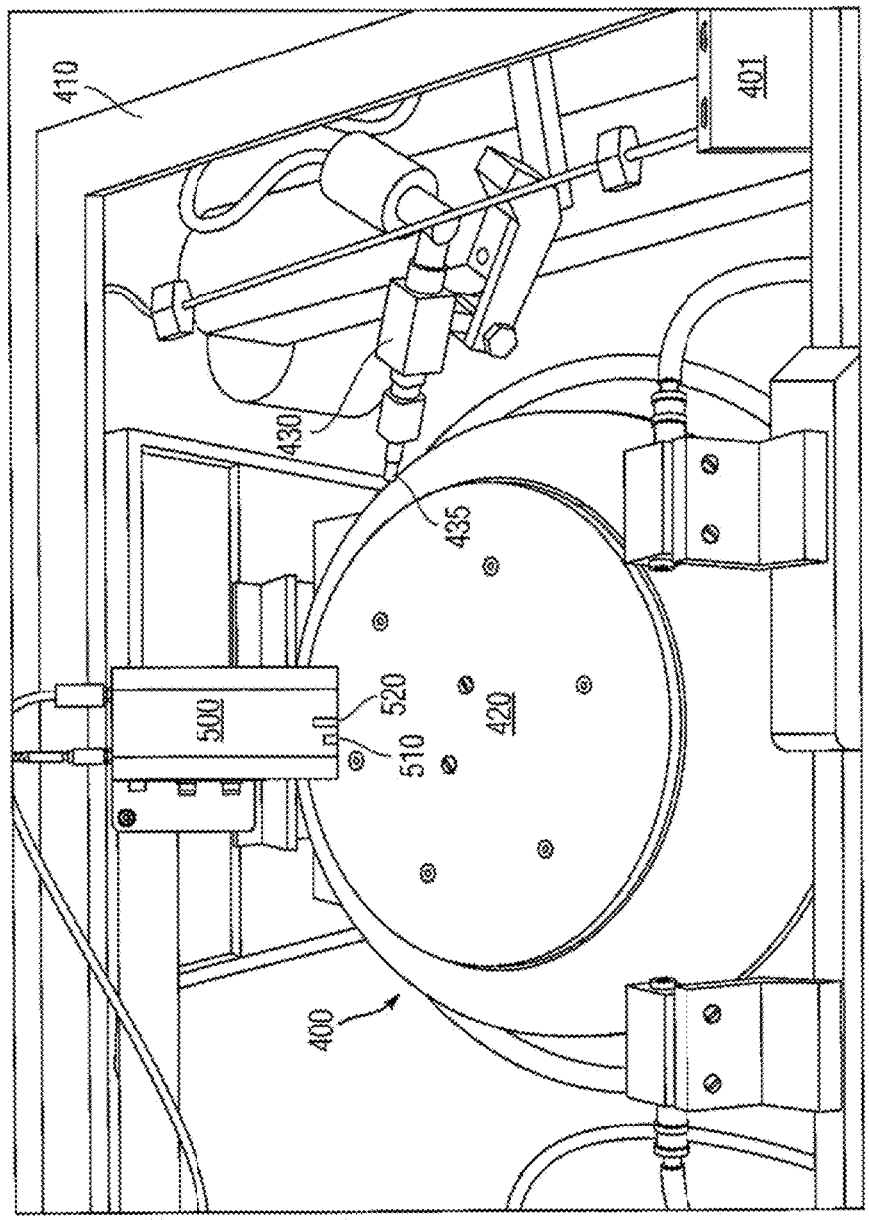
FIG. 5 is a perspective view showing a wet etching station in accordance with one embodiment disclosed herein.

As shown in FIG. 5, the third station 220 includes a single wafer wet etching apparatus 400 that includes an etch chamber (enclosure) 410 that contains the equipment and chemical etchant used in the wet etching process. The etch chamber 410 can thus be thought of as a chemical containment structure. It will be understood that third station can hold a plurality of etching apparatus' 410, such as is a vertically stacked orientation, to allow wet etching to be performed simultaneously on more than one wafer. The enclosure 410 also collects and contains the chemicals used in the etching process.

The wet etching apparatus 400 located at the third station 220 also includes spin chuck 420 (variable speed controlled by an etch controller 401 which is part of the overall process control system described herein) on which the wafer rests, as well as an etch tool (arm) 430 that includes one or more nozzles (orifice) 435 that dispenses a fluid (e.g., one or more liquids, preferably the chemical etchant). The etch tool 430 can be in the form of an arm that is movable along multiple directions (x, y, z directions) and thus, has multiple degrees of freedom. The etch tool 430 is a controllable tool in that it is controlled by a computing device such as etch controller 401 and is part of the overall programmable computer system employed in the system 100 as described herein. As a result, the etch tool 430 can be driven to any specific location of the wafer, etc.

The wet etching apparatus 400 also includes a fluid delivery and fluid removal system for both introducing the etch chemicals and removing such chemicals from the chamber. These components are implemented using a conventional fluid plumbing scheme in which conduits are provided for supplying fluid (e.g., one or more liquids, preferably a chemical etchant) to the nozzle 435. In addition, the wet etching apparatus 400 includes conduits and mechanisms for discharging fluid(s) that accumulate within the enclosure 410 during the wet etching process.

The mechanical chuck 420 permits the chuck 420 to hold the wafer. The chuck 420 includes a main shaft (not shown) which can be joined to a driving shaft of a motor so as to allow the wafer held by the spin chuck 420 to make a spin rotation about a Z-axis. A power source switch of the motor is connected to an output side of the etch controller 401, with the result that the rotation speed of the motor is controlled by the controller 401. Also, the spin chuck 420 can be supported by a lift mechanism (not shown) so as to be movable in a direction of the Z-axis.

Traditionally, around the outer periphery and bottom portion of the spin chuck 420 a structure is provided for receiving and collecting the etchant solution, which is centrifugally separated from the wafer and is then discharged to the outside. Part of the mechanism for discharging fluid(s) from the enclosure 410 can be an exhaust gas passageway and drain pipes that are formed in the bottom portions of the collector structure that surrounds the chuck 420. The liquid stored in the collector structure can be discharged to the outside through one or more drain pipes or re-circulated.

In accordance with the present invention, any number of suitable etching solutions can be used so long as they are suitable for a wet etching process and for the intended substrate and application. Thus, different chemistries can be used based on a number of different parameters, including in view of the properties of the wafer.

With respect to the delivery of the etchant solution, the wet etching apparatus 400 also includes means for controlling the flow properties (flow rate) and temperature of the etchant solution. The operating system can include one or more first flow rate control sections, including but not limited to a pump or valve, that extend from a liquid supply source to a nozzle. The operating section of the flow rate control section can be connected to the output side of the etch controller 401 so as to control the flow rate of the etchant solution supplied to the nozzle. In addition, other control mechanism can be used to control the concentration of the etchant solution. The control of the concentration of the etchant is one means for controlling the overall etch rate and etch process for a given wafer.

Fourth and Fifth Stations 230, 240

After the wafer undergoes processing at the etch station 220, the wafer is then cleaned at one or more wafer cleaning stations. FIG. 3 shows two distinct cleaning stations 230, 240; however, this is merely representative of one embodiment and it will be appreciated that a single cleaning station can be used. In such a construction, the single cleaning station can still employ one or more different cleaning techniques for cleaning the wafer.

Figure 6A:
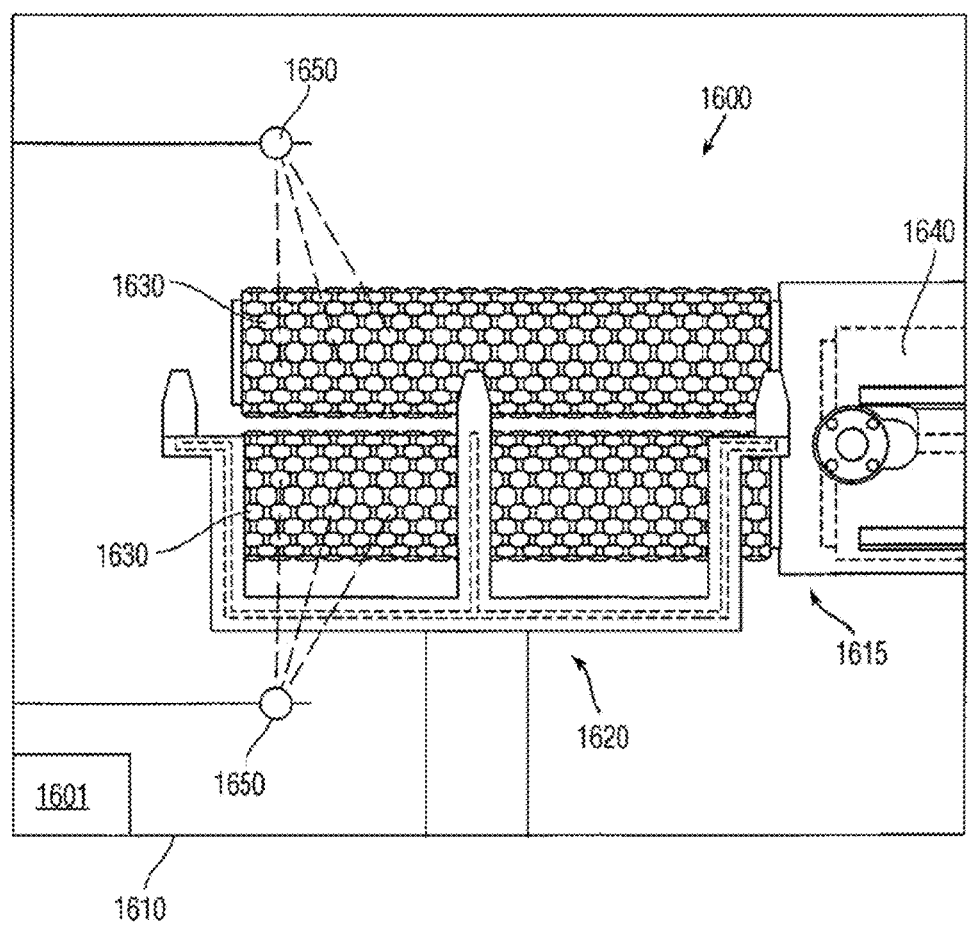
FIG. 6A is a front plan view showing a cleaning station in accordance with one embodiment disclosed herein.

As shown in FIG. 6A, the cleaning station 230 can be of a wafer cleaning apparatus 1600 (of the scrubbing or brush box type) in which the wafer is scrubbed while a cleaning solution is dispensed on the wafer to remove larger residual particles and etch residue. More specifically, the wafer cleaning apparatus 1600 can include a chamber (enclosure) 1610 that contains the equipment and contains the injected cleaning solution used in the cleaning process. The chamber thus at least partially is a sealed environment and can include a wafer scrubbing device 1615 which comprises a chuck 1620 (e.g., spin, rotating chuck) for supporting a wafer to be cleaned. The wafer scrubbing device also comprises a brush mechanism which includes one or more brushes 1630 for scrubbing the wafer. The brush mechanism also includes a drive mechanism 1640 for rotating the brushes, a clamping mechanism for clamping and unclamping the brushes, and a motor for driving the brushes, according to one or more controlled directions (e.g., radially) across the surfaces of the wafer.

During an exemplary scrubbing process, it is desirable to direct streams of water or streams of a cleaning solution at both surfaces of the spinning wafer to wash away particulates. This is typically accomplished by providing spray nozzles 1650 positioned above and/or below the wafer. The spray nozzles are preferably connected to a source of pure water or cleaning solution through supply pipes. The flow rate of the water or cleaning solution can be controlled by a pump and valve arrangement (not shown) which is, in turn, controlled by a cleaning controller 1601 (which is part of the overall process control system described herein). Alternatively, a pressurized fluid source can be used to provide fluid flow.

The cleaning station 240 can be a physically different station that is located proximate to the cleaning station 230 and is of a type in which the wafer is subjected to a different cleaning process than the one employed in the cleaning station 230. The cleaning station 240 can be thought of as being a final clean station. As mentioned above, the first cleaning step involves a scrubbing process which primarily removes the larger particles and residual etchant. The wafer can be transferred wet from the first cleaning station 230 to the final cleaning station 240.

Figure 6B:
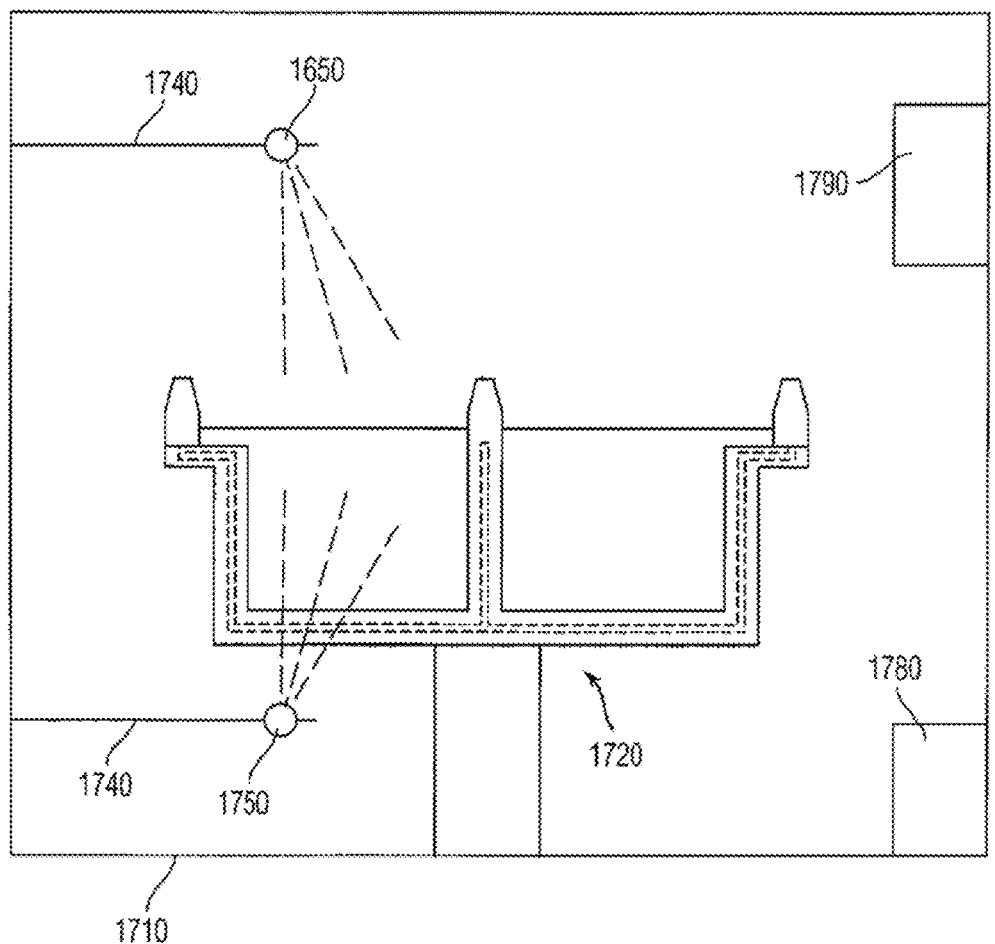
FIG. 6B is a front plan view showing a cleaning station in accordance with one embodiment disclosed herein.

As shown in FIG. 6B, similar to cleaning station 230, the final cleaning apparatus 1700 can be in the form of a chamber 1710 and includes one or more arms 1740 and nozzles 1750 to dispense a high velocity spray onto the wafer and/or use a megasonic cleaning apparatus 1780 for the removal of small particles from the wafer surface. In addition, station 240 can include a drying apparatus 1790 to dry the wafer at the end of the final cleaning process.

The Wet Etch Process Using System 100

Figure 7A:
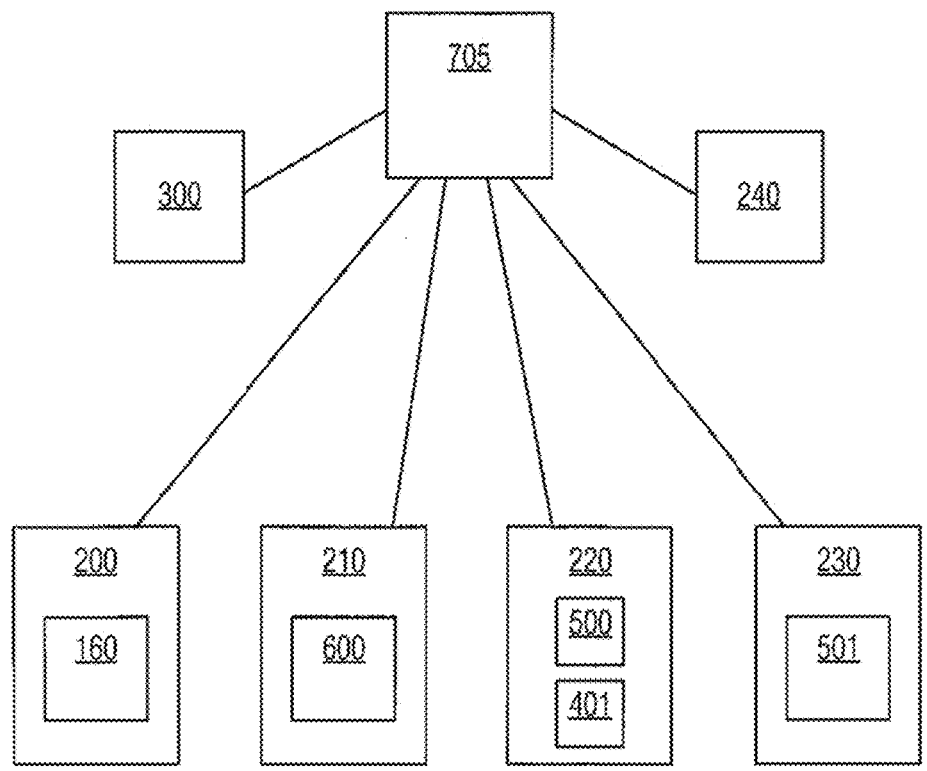
FIG. 7A is a block diagram showing an exemplary configuration of a system for performing a wet etching process in accordance with one embodiment disclosed herein.

FIG. 7A is a high-level diagram illustrating an exemplary configuration a process control system 700 for use with the system 100 for performing a wet etching process. In contrast to previous design, the present invention utilizes at least in some embodiments, a multi-step wet etch process as described herein. In one arrangement, the process control system consists of one or more computing devices including a process controller 705. It should be understood that process controller 705 can be practically any computing device and/or data processing apparatus capable of embodying the systems and/or methods described herein.

Process controller 705 can be configured to communicate with the various computer-controlled components of the system 100, including first station 200, second station 210, third station 220, fourth station 230, fifth station 240, and the computer controlled devices or controllers associated therewith including but not limited to wafer transfer device 300, FOUP loadports 160, imaging device 600, etch controller 401 and cleaning controller 1601 transmitting electronic information to and receiving electronic information from the various components.

It should be noted that while FIG. 7A depicts the process control system 700 with respect to a process controller 705, it should be understood that any number of process controllers can interact with the process control system 700 and the constituent computer controlled components of system 100 in the manner described herein. It should be further understood that while the various computing devices and machines referenced herein, including but not limited to computer terminal 170, process controller 705, first station 200, second station 210, third station 220, fourth station 230, fifth station 240, and the computer controlled devices or controllers associated therewith including but not limited to wafer transfer device 300, FOUP loadports 160, imaging device 600, etch controller 401 and cleaning controller 1601 are referred to herein as individual/single devices and/or machines, in certain implementations the referenced devices and machines, and their associated and/or accompanying operations, features, and/or functionalities can be arranged or otherwise employed across any number of devices and/or machines, such as over a direct connection or network connection, as is known to those of skill in the art.

Figure 7B:
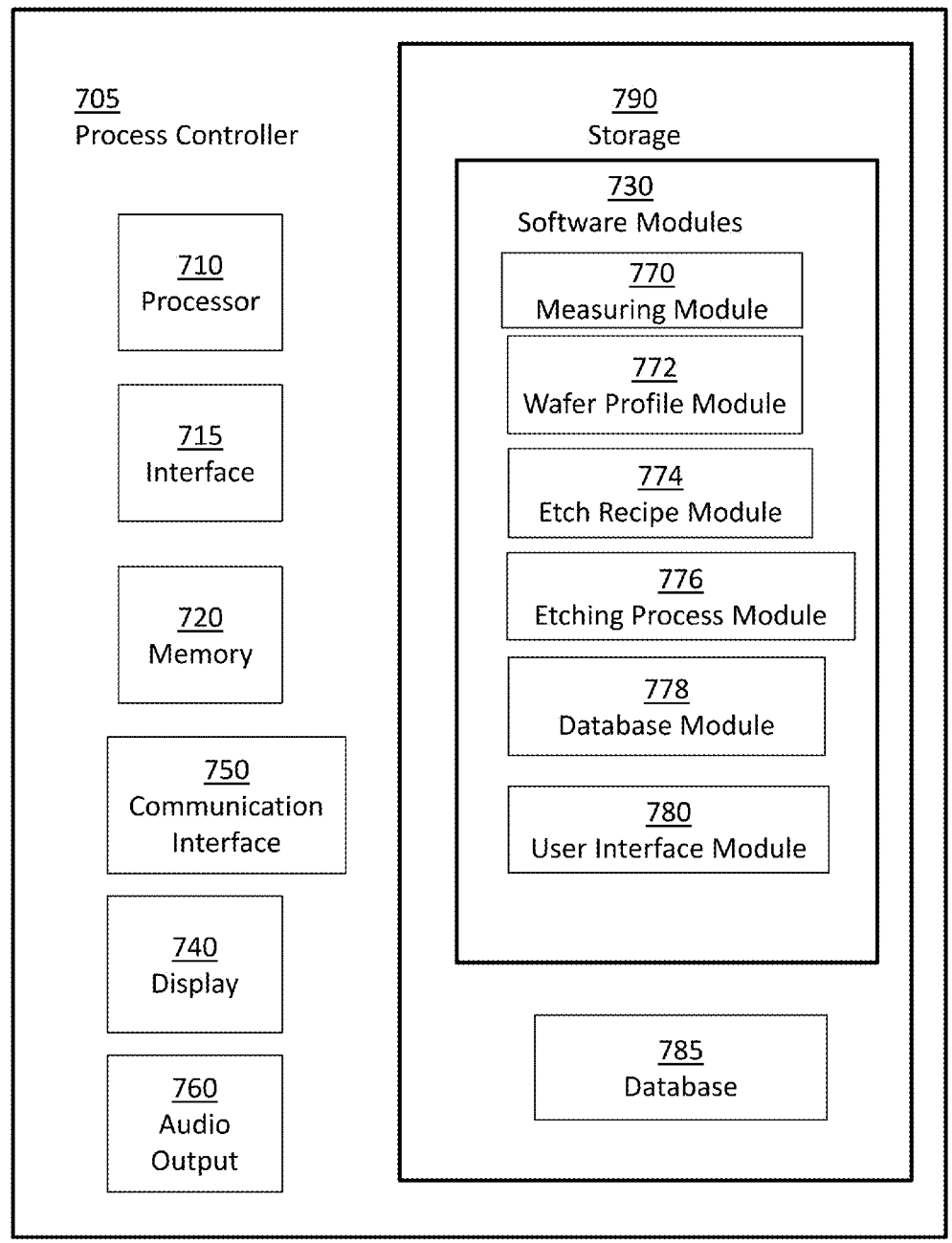
FIG. 7B is a block diagram showing an exemplary configuration of a process control system in accordance with one embodiment disclosed herein.

FIG. 7B is a block diagram illustrating an exemplary configuration of process controller 705 of the system 100 for performing a wet etching process. Process controller includes various hardware and software components that serve to enable operation of the system, including a processor 710, memory 720, display 740, storage 790 and a communication interface 750. Processor 710 serves to execute software instructions that can be loaded into memory 720. Processor 710 can be a number of processors, a multi-processor core, or some other type of processor, depending on the particular implementation.

Preferably, memory 720 and/or storage 790 are accessible by processor 710, thereby enabling processor to receive and execute instructions stored on memory and/or on storage. Memory can be, for example, a random access memory (RAM) or any other suitable volatile or non-volatile computer readable storage medium. In addition, memory can be fixed or removable. Storage 790 can take various forms, depending on the particular implementation. For example, storage can contain one or more components or devices such as a hard drive, a flash memory, a rewritable optical disk, a rewritable magnetic tape, or some combination of the above. Storage also can be fixed or removable.

One or more software modules 730 are encoded in storage 790 and/or in memory 720. The software modules can comprise one or more software programs or applications having computer program code or a set of instructions executed in processor 710. Such computer program code or instructions for carrying out operations for aspects of the systems and methods disclosed herein and can be written in any combination of one or more programming languages. The program code can execute entirely on process controller 705, as a stand-alone software package, partly on process controller, or entirely on another computing/device or partly on another remote computing/device. In the latter scenario, the remote computing device can be connected to process controller through any type of direct electronic connection or network, including a local area network (LAN) or a wide area network (WAN), or the connection can be made to an external computer (for example, through the Internet using an Internet Service Provider).

Preferably, included among the software modules 730 is a measuring module 770, a wafer profile module 772, an etch recipe module 774, an etching process module 776, and a database module 778 and a user interface module 780 that are executed by processor 710. During execution of the software modules 730, the processor configures the process controller 705 to perform various operations relating to the system 100 for performing a wet etching process, as will be described in greater detail below.

It can also be said that the program code of software modules 730 and one or more computer readable storage devices (such as memory 720 and/or storage 790) form a computer program product that can be manufactured and/or distributed in accordance with the present invention, as is known to those of ordinary skill in the art.

It should be understood that in some illustrative embodiments, one or more of software modules 730 can be downloaded over a network to storage 790 from another device or system via communication interface 750 for use within the system 100. In addition, it should be noted that other information and/or data relevant to the operation of the present systems and methods (such as database 785) can also be stored on storage, as will be discussed in greater detail below.

Also preferably stored on storage 790 is database 785. As will be described in greater detail below, database contains and/or maintains various data items and elements that are utilized throughout the various operations of the system 100. The information stored in database can include but is not limited to, parameter adjustment algorithms, recipes, chemical mixture details, set-points, settings, alarms, actual values for process variables, and historical data collected and analyzed by the process controller (e.g., batch records, substrate thickness measurement information, via depth measurement information) as will be described in greater detail herein. It should be noted that although database is depicted as being configured locally to process controller 705, in certain implementations database and/or various of the data elements stored therein can be located remotely (such as on a remote computing device or server—not shown) and connected to process controller through a network or in a manner known to those of ordinary skill in the art.

An interface 715 is also operatively connected to the processor 710. The interface can be one or more input device(s) such as switch(es), button(s), key(s), a touch-screen, microphone, etc. as would be understood in the art of electronic computing devices. Interface serves to facilitate the capture of commands from the user such as on-off commands or settings related to operation of the system 100.

Display 740 is also operatively connected to processor 710. Display includes a screen or any other such presentation device which enables the user to view information relating to operation of the system 100 including control settings, command prompts and data collected by various components of the system 100 and provided to process controller. By way of example, display can be a digital display such as a dot matrix display or other 2-dimensional display.

By way of further example, interface and display can be integrated into a touch screen display. Accordingly, the screen is used to show a graphical user interface, which can display various data and provide "forms" that include fields that allow for the entry of information by the user. Touching the touch screen at locations corresponding to the display of a graphical user interface allows the person to interact with the device to enter data, change settings, control functions, etc. So, when the touch screen is touched, interface communicates this change to processor, and settings can be changed or user entered information can be captured and stored in the memory.

Audio output 760 is also operatively connected to the processor 710. Audio output can be any type of speaker system that is configured to play electronic audio files or generate audio tones as would be understood by those of ordinary skill in the art. Audio output can be integrated to the process controller 705 or external to the process controller 705.

Communication interface 750 is also operatively connected to the processor 710 and can be any interface that enables communication between the process controller 705 and external devices, machines and/or elements including [robot, imaging device, etch controller, clean controller, chemistry controller]. Preferably, communication interface includes, but is not limited to, Ethernet, IEEE 1394, parallel, PS/2, Serial, USB, VGA, DVI, SCSI, HDMI, a Network Interface Card (NIC), an integrated network interface, a radio frequency transmitter/receiver (e.g., Bluetooth, cellular, NFC), a satellite communication transmitter/receiver, an infrared port, and/or any other such interfaces for connecting process controller 705 to other computing devices and/or communication networks such as private networks and the Internet. Such connections can include a wired connection (e.g. using the RS232 standard) or a wireless connection (e.g. using the 802.11 standard) though it should be understood that communication interface can be practically any interface that enables communication to/from the process controller 705.

At various points during the operation of the system 100 for performing a wet etching process, process controller 705 can communicate with one or more computing devices, for instance, computing devices used to operate the various process stations and constituent devices as will be further described in greater detail herein. Such computing devices can transmit and/or receive data to/from process controller 705 and between one another, thereby preferably initiating maintaining, and/or enhancing the operation of the system 100, as will be described in greater detail below.

The operation of the system 100 for performing a wet etching process and the various elements and components described above will be further appreciated with reference to the process for exposing TSVs as described below, in conjunction with FIGS. 7, 8, 9A-9I and 10, 11.

Figure 8A:
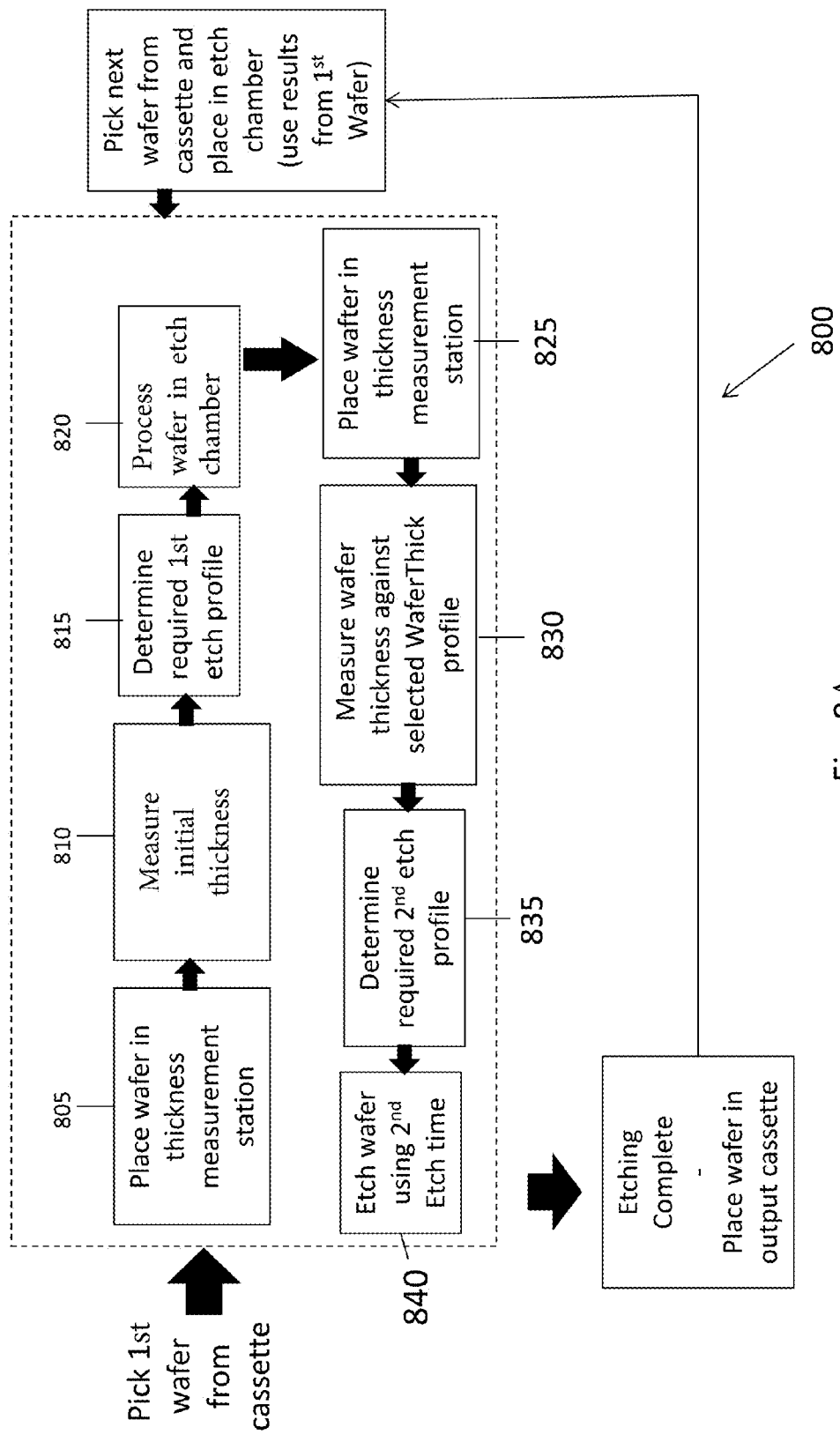
FIG. 8A is a flow diagram showing a routine for performing a wet etching process in accordance with at least one embodiment disclosed herein.

FIG. 8 is a flowchart illustrating a process flow 800 for etching wafers using system 100 in accordance with an embodiment of the invention. It should be understood that the exemplary process can be performed on post grind TSV substrates (i.e., wafers) in which the TSVs are not exposed on the top surface of the wafer due to a layer of residual substrate material (also referred to as overburden). Moreover, the bottom surface of the wafer is mounted to a carrier with an adhesive layer that can vary in thickness from one wafer to another. However, it should be understood that wafers are not limited to this particular carrier configuration as the exemplary process is operable on wafers in alternative carrier configurations and non-carrier configurations as would be understood by those skilled in the art. The exemplary process provides specialized metrology to determine the thickness of the overburden and wet etch wafers in multiple stages using the system 100 to expose the TSVs to a desired depth and wafer thickness uniformity. As described herein, the present system can employ two or more discrete wet etching stages (steps) that are performed in the same or different wet-etching stations in the system for performing a wet etching process 100 to expose the TSVs to the desired depth.

As further described herein, the system 100 is configured to measure the wafer thickness, calculate a residual substrate material thickness RST at respective radial locations (as defined herein) (e.g., the thickness of the overburden above the top of the TSVs) generate one or more etch recipes and, through multiple etching steps, selectively etch the wafer to minimize any radially dependent non-uniformities in RST and reveal the TSVs to a prescribed reveal height and tolerance. Two very different chemistries can be chosen for the specific attributes that each offers and the target of each etch step. In one exemplary implementation, the first etch step can be performed to eliminate the non-uniformities in RST thickness that result from TSV formation and the non-uniformity of the wafer thickness from the grinding step. The required etch time and etch profile will therefore be different for each wafer and be non-uniform in profile. This highly targeted non-uniform etch can be accomplished through the use of an isotropic etchant. The chemistry selected (e.g., HF:HNO3 with viscosity agents, strong acid) is a non-selective silicon etchant that is very responsive to the location that it is dispensed onto by the nozzle with a high etch rate. In other words, dispensing etchant onto a particular radial location will concentrate (i.e., localize) the etching to the particular radial location that the stream of etchant is dispensed onto. Accordingly, this yields the ability to quickly and accurately sculpt the wafer to the target first wafer profile, in other words, thinning the non-uniform overburden layer and leaving a thin but uniform layer of substrate material remaining above the TSVs. If no substrate layer remained above the TSVs, this etchant could attack the oxide liner and conductive via materials and ruin the wafer.

In some implementations, another task accomplished during the first etch is a smoothing of the wafer surface. Again the properties of the etchant permit the incoming rough wafer surface to be smoothed during this etch. As the surface can be sufficiently smoothed by the first etching stage, the exemplary process can eliminate the need for a polishing CMP (Chemical Mechanical Planarization) step prior to the etch step. This reduces the cost of the process by eliminating another manufacturing step in the etching process.

The second etch (i.e. "reveal etch") in contrast is a methodic, anisotropic and repeatable process. This can be performed using a highly alkaline etchant. The etchant is preferably selective to etch the silicon and not the TSV or liner materials. The second etch removes the small amount of substrate material that remained to protect the TSV materials and continues to etch so that the TSVs become exposed to a prescribed reveal height. The second etch can have very little impact on the smoothness of the remaining silicon and no significant impact (or no impact) on the TSV materials (e.g., the liner or the conductive material filled in the via). Since the first etch step corrected the non-uniformities in the wafer thickness, the second etch can be configured such that it is essentially uniform and repeatable across a batch of wafers and selective.

Although process flow is generally discussed in relation to TSV wafers, it should be understood that the exemplary process can be performed on non-TSV wafers and provides specialized metrology to determine the thickness of the wafer and wet etch non-TSV wafers using system 100 to a desired final thickness and wafer thickness uniformity. As further described herein, process 800 measures the thickness of a wafer before and after various stages in the wet etching process to dynamically adjust the etching of the wafer in subsequent etch steps to more precisely obtain the desired final wafer profile. In addition the thickness measurements of previous wafers can be analyzed so as to dynamically adjust the processing parameters implemented for etching subsequent wafers in the batch accordingly. In addition or alternatively, the remaining wafers can undergo one or more of the measuring and etching steps described in routine 800 so as to process one or more of the wafers in view of their respective measurements indicating respective etching results.

In process block 805, the system 100 places the wafer into the wafer thickness measurement station. In process block 810, the system measures the initial thickness of a wafer and calculates the required etch depth for the wafer (the first etch profile) in accordance with the thickness measurements and wafer profile. The wafer profile includes parameters that define a first set of target physical characteristics of the wafer after the first etching stage (first target wafer profile) and a final set of target physical characteristics after the secondary etching stage (final target wafer profile). In process block 815, the system generates a first etch recipe for the wafer to achieve the first target wafer profile for the wafer after the first etch step (the first etching stage is referred to herein as "Spin-D"). In process block 820, the system etches the wafer according to the first etch recipe. In process block 825, the system 100 places the wafer into the wafer thickness measurement station. In process block 830, the system re-measures the thickness of the processed wafer. In addition the measurement station provides the thickness measurements to the process controller to analyze the actual physical properties of the wafer and calculate the required etch depth for the wafer in accordance with the desired physical characteristics of the wafer after the second etching step (referred to herein as "Etch-1"). In process block 835, the system generates a second etch recipe for the wafer to achieve a second etch profile and, as a result, the final target wafer profile after the second etch step (referred to herein as "Etch-1"). In process block 840, the system etches the wafer according to the second etch recipe. In some implementations thickness measurements after the Spin-D and Etch-1 etching step can be used to evaluate the efficacy of the respective etch recipes and adjust the etch recipe for subsequent wafers being put through process flow 800 accordingly. In some implementations, the post-etch thickness measurements can be used to re-calculate the preceding etch recipe and re-run the preceding etch step one or more times until the respective target wafer profile is achieved.

By combining silicon thickness measurement, wet etch, and cleaning in a single-wafer process system, the system described herein provides a low cost-of-ownership for TSV reveal.

As would be understood by those in the art and further described herein, a wafer profile refers to the physical properties of a wafer at a plurality of locations or areas on the surface of the wafer (e.g., as measured at specific points or areas referred to as radial locations). An "initial" profile of a wafer is intended to refer to the actual physical properties of the wafer at a plurality of locations on the surface of the wafer. A "target" or "desired" wafer profile is the intended physical properties of the wafer after one or more etching steps. Accordingly, it can be appreciated that an etch profile represents the difference between the initial wafer profile and the target wafer profile after one or more etching steps and, as would be understood by those in the art, represents the physical properties of the wafer material (e.g., thickness at one or more of a plurality of locations) that are intended to be etched away by one or more etching steps. In general, the physical characteristics for a wafer or etch profile generally relate the thickness of the wafer. In some implementations, a wafer profile can be expressed in terms of the total thickness of the wafer material (e.g., thickness from a surface of the wafer mounted to a carrier and to the surface to be etched). However, it can be appreciated that wafer thickness, or the amount of material to be removed by etching, can be expressed in terms of other parameters. For instance, in regard to TSV substrates, thickness can be defined relative to a reference height of the TSVs (e.g., the RST of the overburden above the top of the TSVs) or the target "reveal height" of the TSVs after etching.

The two stage etching process allows for varying degrees of etching precision and, using in-line measurement, adjustments to the first and second etching recipes can be made to achieve optimized results and efficiency. For example, the first etch stage can be a preliminary etch or "rough etch" to efficiently reduce the thickness of the overburden, minimize radial dependent non-uniformities in wafer thickness and, in some cases, partially expose the TSVs, preferably, without over exposing the TSVs. The second etching step can be run according to a more precise and more controlled etch recipe to achieve the final target wafer profile upon completion of process 800 (the final wafer profile). In addition if the post Spin-D and/or Etch-1 wafer does not meet the final wafer profile, the system can repeat process steps 825-840 until the respective target wafer profile is achieved.

In other words, the first etch stage can be used to effectively and with speed, etch the wafer overburden and at a select point, the first stage is stopped and the second etch stage begins. Variations in the depth of the silica overburden can occur due to non-uniformities in post-grind thickness, via depth/height and bonding. Integration of wafer thickness measurements before and after etching—within the single-wafer equipment—provides the high-accuracy process control needed for high-volume manufacturing. Improvement in surface roughness and etch uniformity are achieved with this wet process through the combination of chemistry performance and process optimization.

The specific steps followed in process 800 will be described in further detail in conjunction with FIGS. 8B, 9A-9I. It should be appreciated that more or fewer operations can be performed than shown in the figures and described herein. These operations can also be performed in a different order than those described herein, combined into multi step processes or broken into sub-routines. The steps are described in the context of system 100 however practice of the steps is not limited to the exemplary configuration of system 100 as described in FIGS. 1-7.

Before processing the wafer, a user can be prompted to create a "Wafer Profile." The wafer profile includes information about the desired profile of the wafer after each of the etching processes and specifies various processing parameters for the measuring and etching steps that are performed by the system 100. The wafer profile can be input by the user using the user interface and received by the processor 710 of the process controller 705, which is configured by executing one or more software modules 730, including, preferably the user interface module 780 and the wafer profile module 772. FIG. 9A depicts an exemplary graphical user interface (GUI) 910 for displaying the wafer profile 900 by the display 740. The GUI includes interactive forms that can be edited by the user to adjust the wafer profile 900 using the user interface 715.

As shown the wafer profile can include the following information:
Profile Name
$1^{st}$ Etch Rate, 912
$2^{nd}$ Etch Rate, 914
Minimum Reveal Tolerance, 916
Uniform Thickness Tolerance, 918
Wafer Measurement Type: Radius or Diameter, 920
Degrees: measurement theta rotation from wafer notch, 922
Wafer radius or diameter, 924
Steps: Number of measurements to be taken across the radius or diameter of the wafer, 926
Center region of wafer: measurement area on wafer which is used to determine Center Heavy, Center Light, or Uniform thickness. 928
Via Height 930, Reveal Depth 932, and Etch Offset 934, for each measured point along the radius/diameter of the wafer 936.

As noted above, the first step in the exemplary process is a measuring step to determine the physical properties of the wafer, namely the thickness of the wafer prior to etching. Because the measuring device is configured to measure the actual thickness of the wafer over the surface by optically scanning the wafer, the measurement resolution (e.g., the number of data-points collected over the wafer surface) can be adjusted depending on the level of detail required by the application of the processed wafer, and can range from a detailed scan of the entire surface to just a few data points over the surface. As shown in the exemplary GUI depicted in FIG. 9A, various measuring parameters can be input or adjusted by the user using the user interface, including: the size of the wafer 924, the number of scan steps between the start point and end point of the wafer scan 926 (e.g., scan resolution defining the distance between measurements) and the angle across the wafer that the thickness measurements are taken along 922. In addition the user can specify the measurement type 920 which instructs the measuring device to measure across a radius of the wafer or across a diameter of the wafer.

The wafer profile 900 can also include information about the wafer's physical characteristics, including the TSV height 930 (also referred to as via height). The reference height of the TSVs in the wafer can be obtained from the manufacturer of the wafer and input manually by the user or automatically collected and entered into the wafer profile by the processor from a database storing such information. Alternatively, or in addition, the reference height can also be a function of measurements of the actual height of the TSVs of one or more etched wafers and automatically collected and entered into the wafer profile by the processor from a database storing such information. The wafer profile defined by the user can also define the size (e.g., diameter) of the "center region" of the wafer.

The wafer profile 900 can also include information about the desired physical characteristics of the wafer after processing the wafer. The desired physical characteristics can be defined for each etch step as well as the final wafer profile that is desired. The physical characteristics can include: Minimum Reveal Tolerance 916 and Uniform Thickness Tolerances 918 and, for each incremental step of the scan, the Reveal Depth 932, and the Etch Offset 934. Reveal depth is the final target thickness of the wafer after the etching process is complete. Etch Offset can be used to define the amount of wafer material that is to be removed in the first etching stage (e.g., "Spin-D"). For example, when etching a TSV substrate as further described herein, the etch offset can be expressed in terms of the amount of residual substrate material above the TSVs after the first etch (e.g., 4 micrometers relative to the top of the TSVs at respective radial locations). By way of further example, etch offset can be expressed relative to the final substrate thickness (e.g., 8 micrometers from the reveal depth). The reveal height, which corresponds to the reveal depth and is also relative to the TSV height, specifies the desired height of the exposed portion of the TSVs at respective radial locations after processing. The Minimum Reveal tolerance 916 is the maximum tolerated deviation between reveal height across the wafer, and the Uniform Thickness Tolerance 918 concerns the difference between the minimum and maximum thickness of the wafer material after processing (e.g., the deviation of the reveal depth at respective radial locations). These and other such thickness tolerances can be specified by the user when defining the wafer profile 900. In addition, as shown in FIG. 9A, the GUI displaying the wafer profile 900 can also include a graphical representation 940 of various parameters defined in the wafer profile. In particular, in FIG. 9A, which displays the wafer profile for a 180 mm wafer measured across a diameter, the graph 940 depicts a line 942 which corresponds to the reference via height 930 and a line 944 which corresponds to the reveal depth 932. As shown, the value for respective parameters are graphed as a function of distance from wafer center. The graph also depicts an area that corresponds to the defined center region 946. FIG. 9B depicts an alternative representation of an exemplary wafer profile 950 for a 180 mm wafer measured across a radius. Accordingly the graphical representation 952 of the line corresponding to the TSV height 954 and the reveal depth 956 is represented in radius format.

Figure 8B:
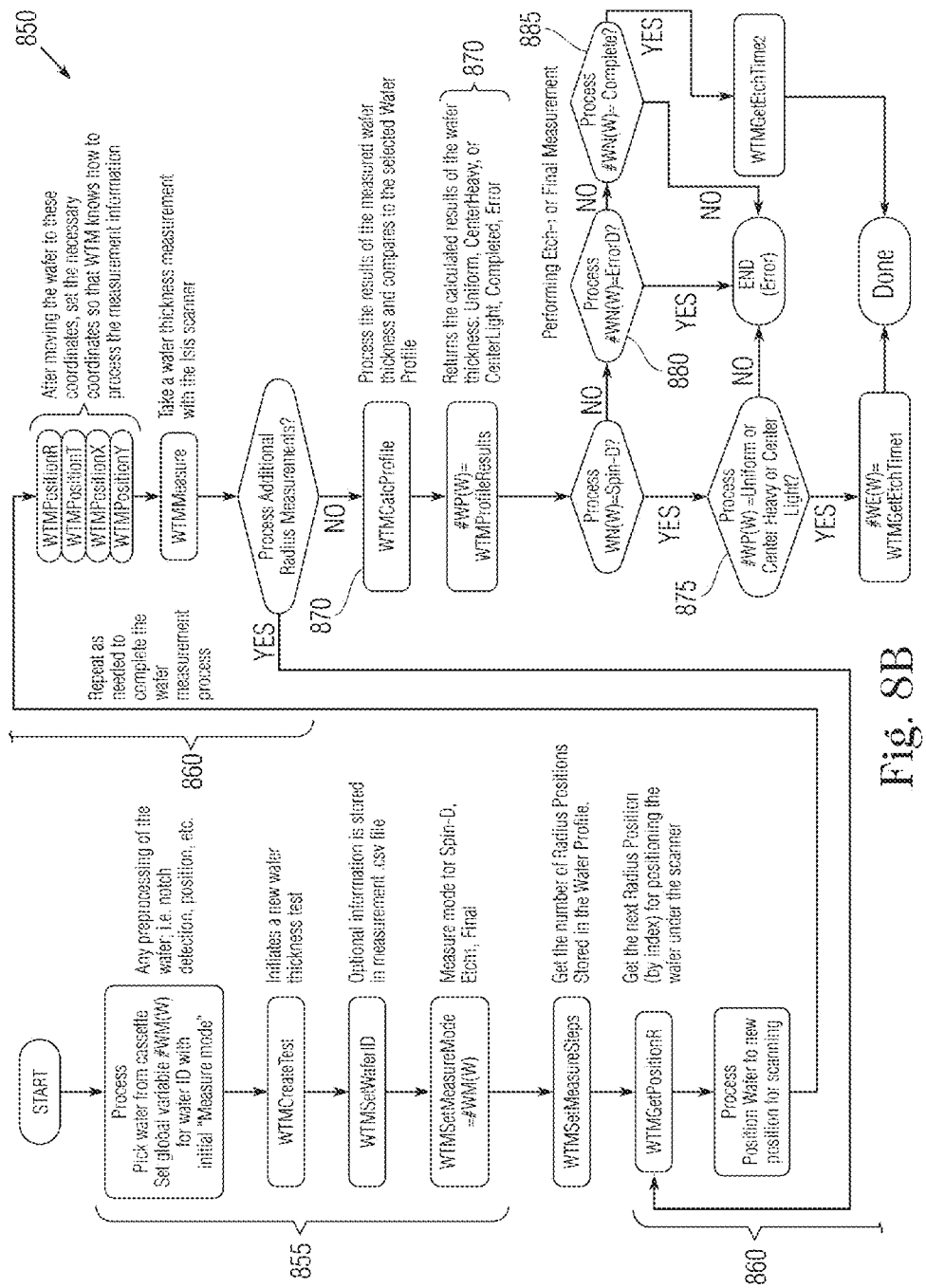
FIG. 8B is a flow diagram showing a routine for performing a wet etching process in accordance with at least one embodiment disclosed herein.

FIG. 8B shows a routine 850 for processing a wafer in greater detail. At step 855, the processor 710, which is configured by executing one or more software modules 730, including, preferably, the measuring module 770 and the wafer profile module 772 and the database module 778, initializes the wafer measurement process. This can include loading the wafer profile from memory to identify the wafer profile to be achieved by each ensuing etch step (e.g., Spin-D and, at later stages, Etch-1) and measure the wafer thickness in view of the desired wafer profile. Accordingly, it can be appreciated that the particular etch step and corresponding parameters set forth in the wafer profile guides the measurement process and the calculation of thickness and calculation of various processing parameters by the configured processor.

Then at step 860 the system measures the wafer thickness prior to the Spin-D etch step. In particular, the processor 710, which is configured by executing one or more software modules 730 including, preferably the measurement module 770 and the database module 778, causes the imaging device 600 to collect thickness information for a wafer and record the measurements to storage 790 or memory 720 for further processing by the processor.

Various methods for optically scanning the wafer can be implemented to determine the thickness of the wafer and calculate thickness-related parameters concerning the various etching steps. The thickness information can include: the wafer's radial thickness at various radii; total thickness variation (TTV, which represents the difference between the minimum and maximum thickness measured on the wafer); wafer flatness (e.g., wafer bow); surface roughness and other measurements about the topography of a wafer as would be understood by those skilled in the art and are suitable for use in the present invention. Preferably, imaging device 600 scans a representative sample of the surface of the wafer and collects thickness information, including preferably, the wafer thickness over the representative sample and provides the thickness information to the processor 710 of the process controller 705.

Thickness measurements can be collected at various radial locations on a wafer. In some implementations, the measurements can be used to calculate an average thickness at each radial location as well as an average thickness of the entire wafer. In the parlance of the subject disclosure, "radius" or "radial" relates to a distance from the center of the wafer. It should be understand that "radial location," as described herein, is an area on the surface of the wafer that surrounds center at a given radius (e.g., radius=20 mm) or range of radial distances from center (e.g., radius=20 mm-30 mm). One of skill in the art would readily recognize that due to the fact that the wafer is spinning during the etch processes, a radial location is manifested in the form of an annular region (e.g., a ring surrounding the center) defined on the wafer at a prescribed radial distance or distances from the center of the wafer. Similarly, as further described herein, radial thickness refers to the thickness of a wafer at a given radial location (e.g., the thickness of the wafer measured at one or more points that fall within the radial location).

Radial thickness can be calculated according to an algorithm that is a function of the measured thickness of the wafer at a given radius from the center of the wafer. In addition, radial thickness can be an average of plural thickness measurements at a radial location. In addition, thickness measurements collected at various radial locations on a substrate, can be used to interpolate the thickness at intermediate locations as a function of the distance between the two data points and the respective thickness at the points. In other words, the configured processor can perform an interpolation operation for generating such intermediate measurements. By way of further example, a thickness measured at a particular scan point can be interpreted to reflect the general thickness of the substrate around the entire radial location. The beginning wafer thickness can also be calculated according to an algorithm that is a function of the measured average thickness of the wafer at a given radius of the wafer. For example, the beginning wafer thickness can be represented by the following equation:

BeginningWaferThickness=average(Measured Wafer Thickness)

Then at step 865 the system calculates, for each measured point on the wafer, various parameters based on the thickness of the wafer and the desired wafer profile after the ensuing etch process. In some implementations, prior to the Spin-D etch step, the processor 705, which is configured by executing one or more of software modules 730, including, preferably the measuring module 770 and the wafer profile module 772, calculates the various thickness parameters in view of the particular stage in the etching process and corresponding processing parameters set forth in the wafer profile.

In some implementations, prior to the first etching stage (referred to herein as "Spin-D") the configured processor can determine the Residual Substrate Thickness (RST) for each scan point, wherein the RST is the amount of substrate material above the TSVs. The RST at each scan point can be partially or entirely removed during the Spin-D etch process. For example, the Spin-D etch can be defined to remove the bulk of the material above the TSVs and a prescribed amount of additional substrate material (e.g., as defined by the Etch Offset in the wafer profile) from the wafer without completely revealing the TSVs to the final target reveal height. Alternatively, the etch offset can be defined such that the Spin-D etch stage only removes a certain amount of material above the TSVs without exposing the TSVs and leaves a layer of residual substrate material having the thickness specified by the etch offset at each of the radial locations. Accordingly, the RST can be calculated at various points across the wafer, and a corresponding etch depth can also be calculated to determine the amount of material to be removed by the Spin-D etch step based on the measured thickness, the TSV height and the etch offset. The following are exemplary equations for calculating RST and Etch Depth at a particular radial location(x):

$RST[x]=MeasuredSi[x]-ViaHeight[x]$ $Etch\ Depth[x]=MeasuredSi[x]-ViaHeight[x]-EtchOffset[x]$ As noted above, etch depth is the desired amount of wafer material to be removed from the surface at each of the radial locations in one or more of the ensuing etch step. Accordingly, the etch depth for the various radial locations of the wafer can be referred to as the etch profile. As noted above, the method of determining etch depth and the etch profile can vary depending on the stage in the etching process and the target wafer profile after the particular etch step. For example, as further described herein, the etch profile for the Etch-1 step (e.g., second etch profile) can be calculated based on the post-Spin-D wafer thicknesses and the target final wafer profile. The second etch step can thus be thought of as a selective step that is used reveal the TSV to the desired height in contrast to the first etch step, which is primarily directed to reducing the overburden and minimizing radially dependent non-uniformities in thickness (e.g., non-uniformities in thickness between various radial locations or non-uniformities in RST across the radial locations) without revealing the TSVs. However, as mentioned previously, the Spin-D etch step can, in some implementations reveal a portion of the TSVs.

Figure 9C:
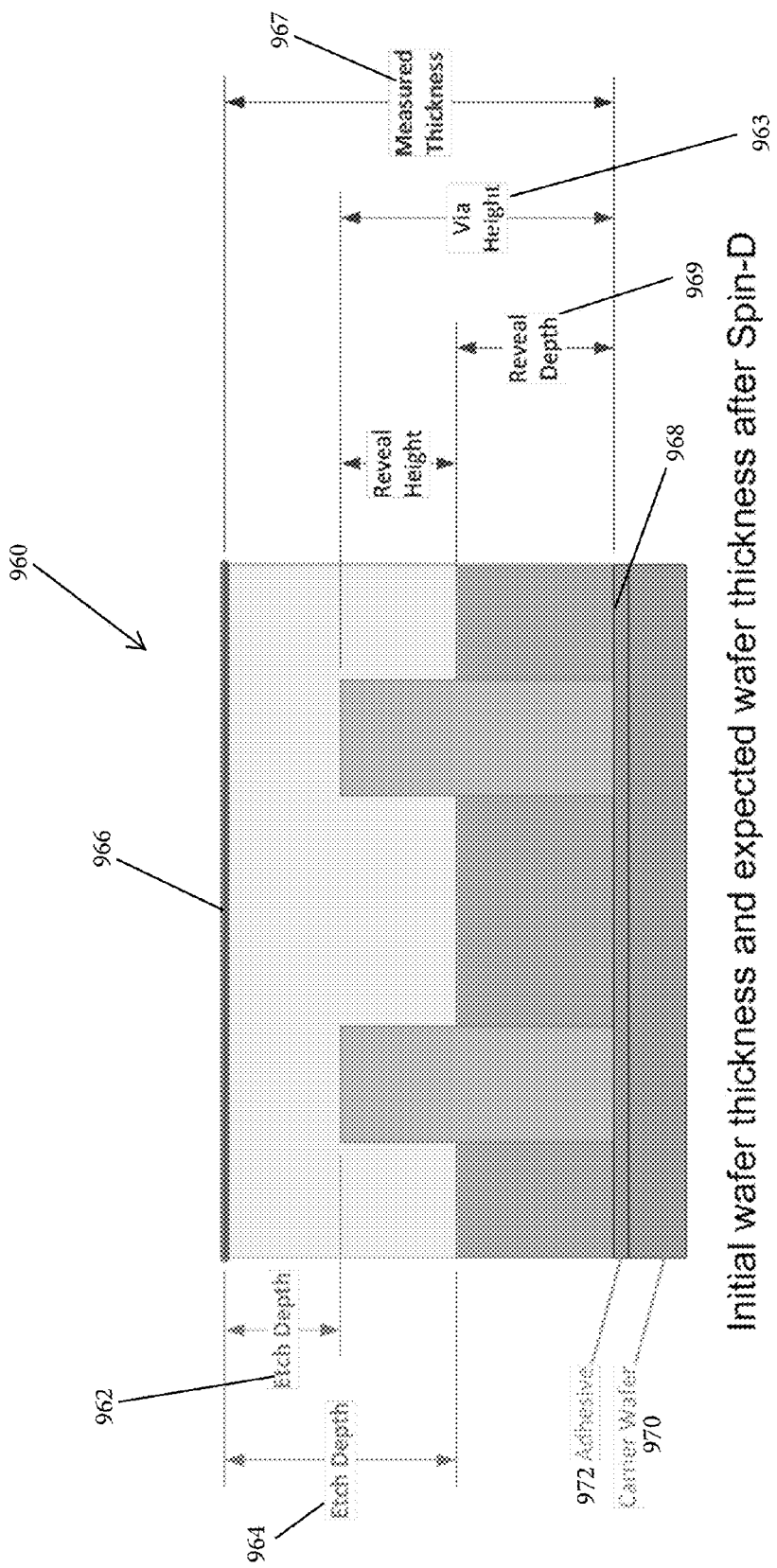
FIG. 9C is a cross-section view showing an exemplary silicon substrate having TSVs in accordance with one embodiment disclosed herein.

FIG. 9C depicts a cross section of a portion of an exemplary post grind TSV wafer 960 prior to the Spin-D etch process. Also depicted is the desired etch depth of the Spin-D etch step as well as the total/final etch depth 964 after the process is complete (e.g., after one or more subsequent Spin-D or Etch-1 steps). As shown, the wafer includes a top surface 966, a bottom surface 968 that is mounted to a carrier 970 by an adhesive layer 972 and TSVs 974 spaced throughout the wafer 960. Also depicted is the TSV height 963, the reveal height 965, the measured thickness 967 and the reveal depth 969 for the wafer. As noted previously, the grinding process leaves a layer of overburden (e.g., wafer material above the TSVs) that could vary in thickness (e.g., within wafer thickness variations such as: thicker at the edge, uniform across the wafer or thicker at the center of the wafer than at the edge,). Likewise, there can be a difference in height of the wafer material above the TSVs on a wafer to wafer basis (wafer to wafer thickness variation). These differences in the layer above the TSVs can be greater than the allowable difference in height of the exposed TSVs. In addition, the adhesive layer can also vary in thickness and uniformity, rendering exterior measurements ineffective at determining the thickness and uniformity of the material remaining in the top silicon wafer, above the end of the via.

The processor 710 executing one or more software modules 730 including, preferably the measurement module 770, the wafer profile module 772, and the user interface module 780, can be configured to output information concerning the wafer measurements and calculated thicknesses related to ensuing etching steps to an operator/user via the display 740 in a variety of graphical formats. For example, FIG. 9D depicts a graph 975 of the initial wafer thickness measurements compared to the wafer profile prior to the Spin-D processing step. As shown, the graph 970 depicts the center region 976, a line corresponding to the TSV height 977, and a line corresponding to the reveal depth 978 (e.g., final reveal depth), a line corresponding to the TSV height plus the etch offset 979 (e.g., the target wafer thickness at each radial location after the first etch step) and a line corresponding to the measured thickness 980 across the diameter of the wafer. FIG. 9E depicts a GUI displaying the information depicted in FIG. 9D in a table 981. FIG. 9F depicts a GUI showing a graphical representation of the circular wafer surface 982 and the measurement locations 983 across a diameter of the wafer. FIG. 9G depicts a GUI displaying a chart 985 depicting the etch profile 986 (e.g., the etch depth at each measurement location) across the diameter of the wafer for the Spin-D etching stage.

In general, the etch profile includes etch depth as determined above. Etch profile can also define other changes that need to be made to the particular substrate to achieve the desired physical characteristics including but not limited to surface uniformity. Accordingly, etch profile is a function of application dependent physical characteristics of the processed wafer, by example and without limitation, desired TSV reveal height, desired substrate thickness, roughness and also a function of actual physical characteristics of the particular substrate including via height and wafer thickness. For example, as shown in FIG. 9G, the intended etch depth for the wafer during the Spin-D etching step is greater at the edges of the wafer than the center. Accordingly, it can be appreciated that the wafer can be characterized as "edge heavy" because there is a thicker layer of overburden above the top of the TSVs toward the edges of the wafer than the center region of the wafer.

In addition, at step 870, the processor 710 executing one or more software modules 730, including preferably the wafer profile module 772, and the etch recipe module 774, can configure process controller 705 to generate an etch recipe for the wafer that can be executed by the etching apparatus 400 to etch the wafer the amount specified by the etch depth at respective radial locations and obtain the target wafer profile. It can be appreciated that the actual thickness at various locations across the surface of the substrate can be referred to as a "wafer profile" and, accordingly, the desired amount of material to be removed at such locations to achieve the target wafer profile is commonly referred to as the "etch profile."

An etch recipe consists of a variety of single wafer wet etch processing parameters that control the radial location on the surface of the wafer where material will be removed and how much material will be removed at such locations.

A variety of parameters can be defined and/or adjusted in the etch recipe to control the radial location on the surface of the substrate where etching is concentrated and the amount of material removed at that location, including but not limited to, the radial position of the etch tool 430 (also referred to as the arm) and nozzle 435 dispensing the chemical etchant onto the substrate, the path of the etch tool, which is referred to as the arm scan, the arm scan speed, acceleration, deceleration and nozzle height. It is understood that dispensing an etchant onto a substrate at a particular radial location generally localizes the etching process to that particular radius of the substrate and, as such, the position and movement of the arm and nozzle over the wafer (e.g., "arm scan profile") can control the location of etching.

Arm scan speed is the speed at which the arm and nozzle dispensing the chemical etchant moves from one position on the substrate to another, and acceleration and deceleration is the rate of change of the arm scan speed over a period of time, and the nozzle height is the distance between the nozzle and the substrate.

The parameters that can be adjusted to control etch rate (i.e., the rate at which the substrate material is chemically removed), include but are not limited to, the etchant selected, the spin speed of the substrate, the concentration of the chemical etchant, the temperature of the chemical etchant, and dwell time.

Spin speed is the speed at which the chuck 420 and the substrate thereon are spinning while chemical etchant is being deposited on the substrate surface. The chemical etchant concentration is the concentration of the chemical etchant that is used to chemically remove the top surface of the substrate. KOH (Potassium Hydroxide) is one exemplary etchant typically used to etch silicon TSV substrates because of its property to etch silicon selectively as opposed to conductors (such as Copper) and insulators (such as silicon oxide). As discussed herein, the selection of the etchant can be made in view of the particular stage that the etchant is being used in. For example, the first etchant used in the SpinD stage is selected to accomplish the stated objective of the first etch stage in that the first etchant has a fast etch rate to remove said overburden and is suitable for localized etching to reduce non-uniformities in the radial thickness. The second etch used in the second stage is selected to accomplish the stated objective of the second etch stage which is a TSV reveal stage. The second etch thus selectively etches the silicon as opposed to the conductors and insulators, and thereby reveals the TSV as described herein. Other exemplary etchants are further described herein.

Dwell time is the amount of time the nozzle is dispensing the etchant on a particular radial portion of the substrate. Increasing dwell time at a particular radial location of the substrate causes the substrate to be etched more at that radial location. Dwell time can be controlled by adjusting process parameters such as arm scan speed, acceleration of the arm (and/or chuck) and the spin speed of the chuck. More specifically, due to the circular shape of the substrate that is spinning on the chuck during the etching process, less time is required to deposit the chemical etchant necessary to etch the center of the substrate than the edge of the substrate and as such the speed of the arm. Accordingly the time at a particular radial location as well as the speed and acceleration/deceleration from one radial position to another can be adjusted to vary the amount of time the etchant is dispensed at a particular radial location.

The parameters that can be adjusted to control the etch uniformity (e.g., the uniformity of the amount etched across respective radial locations and the thickness of the resulting wafer) include but are not limited to, the spin speed of the wafer and the dwell time of the arm depositing chemical etchant on the radial locations of the wafer being etched. For example, in a wafer that is, say, center light (edge heavy), the etch profile can provide that the dwell time is increased near the edge of the wafer, and/or spin speed can be decreased to achieve a greater etch depth at the edge. Referring to the exemplary etch profile for depicted in FIG. 9G, an etch recipe is generated such that, during the Spin-D etch step, the wafer is selectively etched a greater amount towards the edges of the wafer than is etched in the center region of the wafer so as to compensate for the radial location dependent non-uniformities in thickness and to yield a wafer having the target thickness characteristic (e.g., target RST for each of the radial locations and a prescribed thickness uniformity).

Returning to FIG. 8B and step 870, in one or more embodiments, generating an etch recipe can include, characterizing, by the configured processor, the variation in thickness across the wafer based on the thickness measurements and wafer profile resulting from the ensuing etch step. As previously noted, the grinding process leaves a layer of wafer material above the TSVs that can be thicker at various locations on the surface of the wafer. Accordingly, the configured processor can, based on the size of the center region defined in the wafer profile and calculated RST across the wafer, identify the radially defined locations of the wafer where the overburden is thicker or thinner and characterize the radially dependent variation in thickness across the wafer. For instance, the thickness variation can be characterized as center heavy, uniform, or center light (i.e., edge heavy).

In addition, generating the etch recipe can further include calculating the etch time for the Spin-D etching process in view of the average of RST across the wafer (e.g., beginning wafer thickness) and the first etch rate (e.g., the etch rate for the Spin-D etching process). The following is an exemplary equation for calculating Spin-D Etch Time:

$$SpinD\ EtchTime = \frac{\text{average}(RST[x])}{FirstEtchRate}$$

Etch rate can be defined by the user, and can also be calculated as a function of the concentration of the chemical etchant that is used to chemically remove the top surface of the wafer. Because the concentration of etchant decreases as wafers are processed, the configured processor can store the calculated Spin-D Etch Time and starting etch rate so that the etch rate can be periodically updated as the wafers are processed and concentration decreases. The following is an exemplary equation for defining the Previous Spin-D Etch Time:

PreviousSpinDEtchTime=SpinDEtchTime

In addition, generating the etch recipe can include selecting, by the configured processor, one or more of a number of prescribed etch recipes. In particular, the etch recipe can be selected based on the determined radial thickness variation characteristics. For example, pre-defined etch recipes can be stored in memory that are defined to compensate for a particular type of radial thickness variation of the wafer. For example, certain etch recipes can be suitable for etching, say, a center heavy wafer, whereas others are more suitable for uniform wafers or center light wafers and the like. In addition, the etch recipe can also be selected or defined based on other parameters, including without limitation, the calculated etch time and the defined etch rate. For example, a particular etch recipe can be pre-defined for processing a wafer that is, say, center heavy and a given calculated etch time, or ranges of etch times.

In one or more embodiments, the process controller can generate a customized etch recipe for the wafer based on the particular etch profile. In order to generate a custom etch recipe, the processor executing one or more software modules 730, including preferably etch recipe module 778, can configure process controller 705 to define one or more of the aforementioned parameters that control etching location, etch rate, dwell time and the like to generate an etch recipe to selectively etch the overburden across the radial locations on the surface of the particular substrate in order to achieve the desired etch depth at each radial location and intermediate locations. In particular, based on the etch profile, which identifies the radial locations and corresponding amount of material to be etched at those radial locations, can generate an arm scan profile that defines how the arm should move across each of the radial locations and thereby controls the amount of etchant dispensed at those radial locations (and intermediate locations).

As noted above, the parameters that can be adjusted to control the etch uniformity (i.e., the uniformity of the etch and thus the thickness of the resulting wafer) include but are not limited to, the arm movement, the spin speed of the wafer and the dwell time of the arm depositing chemical etchant on the radial locations of the wafer. For example, in a wafer that is, say, edge heavy, the etch profile can provide that the dwell time is increased near the edge of the wafer, and/or spin speed can be decreased to achieve a greater etch depth at the edge.

It should be understood that the parameters can be defined as a function of arm location or other variables and are therefore can be varied throughout the course of the etching process. For example, in a substrate with a radial thickness that is, say, heavy around a particular radial location, the etch recipe can provide that the dwell time is increased at that location by decreasing the speed at which the arm travels across that location to achieve a greater etch depth.

Additionally, the customized etch recipe can include an etch time. Etch duration is the amount of time that the etch process is being performed on the particular substrate and can be varied to control the amount of material that is removed during the etching process. The longer a given etch recipe is executed on a substrate the more substrate is removed and as such, the overall thickness is reduced.

Accordingly, the custom etch recipe can be generated by generating an arm scanning profile. In particular, the configured processor can, using the thickness measurements and corresponding radial locations, set points along a path that the arm will be programmed to pass. In addition, based on the etch depth for each of the radial locations, the configured processor can also define the speed of the arm as it moves across each point and in between the points so as to precisely control the amount of material etched at each of the radial locations. It can also be appreciated that the etch recipe including the arm scan profile can also define other parameters to adjust etch rate for each point/radial location such as spin speed, concentration, acceleration/deceleration and the like as discussed above.

Then at step 875, processor 710, which is configured by executing one or more software modules 730, including preferably the etching process module 776, can cause the etching apparatus 400 to etch the wafer according to the generated etch recipe and for the calculated Spin-D Etch-Time.

After the wafer is processed during the Spin-D etch step, steps 855-875 can be repeated for one or more ensuing etch steps, referred to herein as Etch-1. Preferably the Etch-1 step is the final etch step that reveals the TSVs to the desired reveal height/depth, however, in some implementations, prior to performing the Etch-1 reveal etching step, additional Spin-D etch steps can be performed until a wafer having the desired physical characteristics is achieved.

More specifically, the wafer can be loaded into the scanner and re-measured prior to the in Etch-1 step, for example in a similar manner as steps 855-860. In addition the processor 710, which is configured by executing one or more software modules 730, including preferably the measuring module 770, can determine the PostSpinDThickness. The PostSpinDThickness can be the Average radial thickness of the wafer (MeasuredThickness) at various radial locations of the wafer.

The processor 710 executing one or more software modules 730, including preferably the measuring module 770, wafer profile module 772, the etch recipe module 774, can analyze the measured thickness in view of the Spin-D process parameters to adjust the spin-D etch recipe for subsequent wafers. More specifically, the configured processor can compare the post-processing thickness of the wafer to the implemented etch profile to determine whether the etch recipe executed by the etching apparatus successfully etched the desired amount of wafer at the desired locations and resulted in a processed wafer having the desired physical characteristics, including thickness uniformity. Accordingly, the feedback can be used by the configured processor to adjust the etch recipe to more effectively etch ensuing wafers. As noted above, depending on the previous Spin-D etch rate and amount of material etched, the process controller can adjust parameters to maintain a known or consistent etching environment such as recalculate and/or restore the concentration of the chemical etchant and adjust chemical etchant temperature as would be understood by those skilled in the art. The following is an exemplary equation for re-calculating the Etch Rate based on the First Etch Rate, the change in wafer thickness and the etch time of the Spin-D etch process:

$$FirstEtchRate = (.9 * FirstEtchRate) + 0.1 * \left( \frac{BeginningWaferThickness - PostSpinDThickness}{PreviousSpinDEtchTime} \right)$$

The processor 710 executing one or more software modules 730, including preferably the measuring module 770, wafer profile module 772, an etch recipe module 774, etch recipe module 774, can also analyze the measured thickness in view of the target wafer profile for the Etch-1 process (e.g., final wafer profile) to define the etch recipe for the ensuing Etch-1 process. For example, similar to the process described in relation to step 865 and 870, the configured processor can calculate the etch depth for the Etch-1 process based on the measured PostSpinDThickness and the Reveal height defined in the wafer profile for each of the radial locations of the wafer. The following is an exemplary equation for calculating the Etch depth:

EtchDepth[$x$]=Measured[$x$]−RevealHeight[$x$]

Figure 9H:
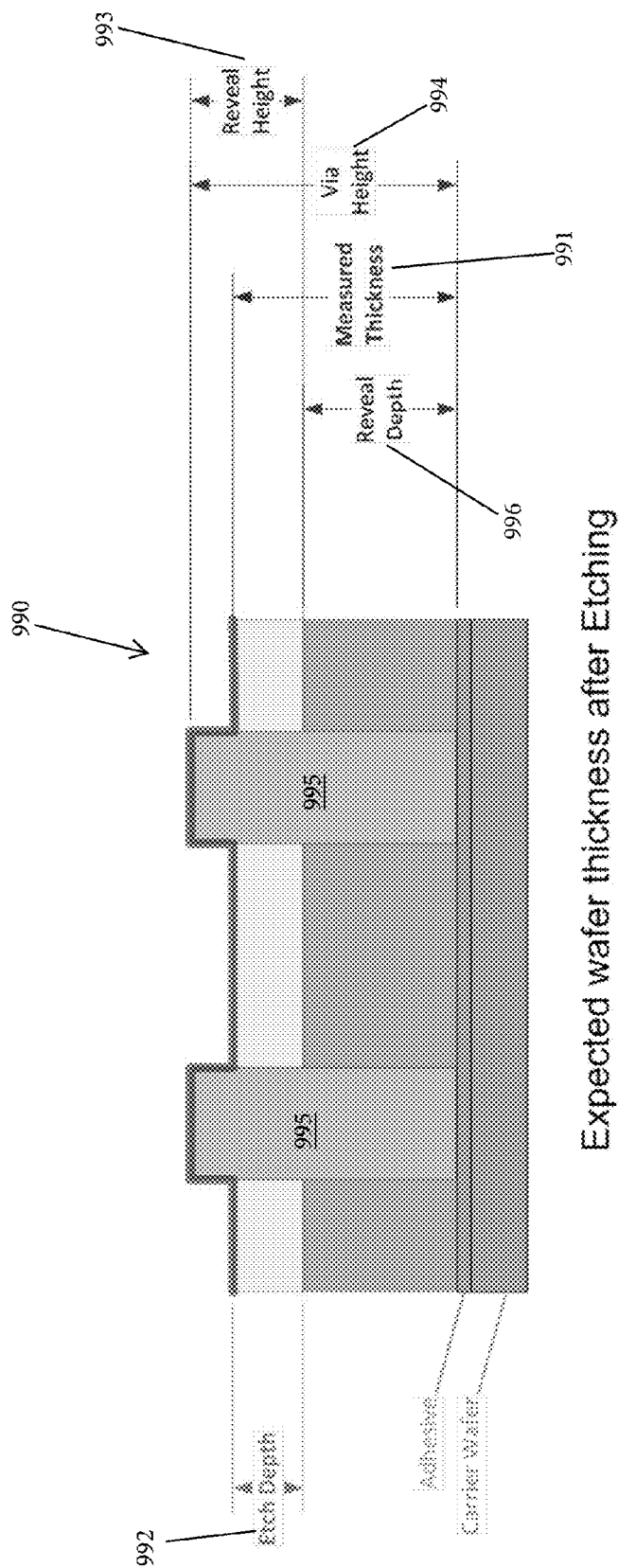
FIG. 9H is a cross-section view showing an exemplary silicon substrate having TSVs in accordance with one embodiment disclosed herein.

As previously noted, in some implementations, the Spin-D etch step can be performed to produce a processed wafer that includes a protective layer of substrate material remaining over the top of the TSVs, for instance, as described herein in relation to FIG. 9I. However, in the alternative, the Spin-D etch step can be configured to partially reveal the TSVs. FIG. 9H depicts a cross section of a portion of an exemplary post Spin-D wafer 990 prior to the Etch-1 etch step and showing partially exposed TSVs 995, the measured thickness of the wafer 991, the reveal height 993, the via height 994 the etch depth 992 for the Etch-1 etching step and the desired wafer thickness after the Etch-1 etch (e.g., Reveal depth 996).

The processor 710 executing one or more software modules 730 including, preferably the measurement module 770, the wafer profile module 772, and the user interface module 780, can be configured to output information concerning the wafer measurements and calculated thicknesses related to the ensuing Etch-1 etching steps to an operator/user via the display 740 in a variety of graphical formats. For example, FIG. 9I depicts a GUI including a graph 1000 of the wafer thickness measurements taken along a radius of the wafer compared to the wafer profile prior to the Etch-1 processing step. As shown, the graph depicts the center region 1006, a line corresponding to the TSV height 1007, and a line corresponding to the reveal depth 1008 (e.g., the final target wafer profile), a line corresponding to the TSV height plus the etch offset 1009 (e.g., the first target wafer profile to be produced by the Spin-D etch) and a line corresponding to the measured thickness 1005 across the radius of the wafer (e.g., the actual/current thickness after the Spin-D etch).

In addition, as described in relation to step 870, the configured processor can calculate the etch time specifically for the Etch-1 process based on the measured PostSpin-DThickness and the Reveal Height defined in the wafer profile. The following is an exemplary equation for calculating the Etch-1 Etch time:

$$Etch1EtchTime = \frac{\text{average}(EtchDepth[x])}{SecondEtchRate}$$

In addition the configured processor can select the appropriate etch recipe based on whether the wafer thickness measurements indicates that the wafer is edge heavy (i.e., center light), center heavy (i.e., edge light) or uniform as described in relation to step 870. The configured processor can also Store the Previous Etch-1 Etch Time, which can be used to adjust the second etch rate after the Etch-1 etch process. The following is an exemplary equation for defining the Previous Etch-1 Etch time:

PreviousEtch1EtchTime=Etch1EtchTime

It can also be appreciated that, as described in relation to step 870, the configured processor can generate a customized etch recipe including an arm scan profile that is specifically tailored to the wafer, as measured, and in view of the target final wafer profile.

Then at step 880, processor 710 executing one or more software modules 730, including preferably etch recipe module 778, can configure process controller 705 to cause the etching apparatus 400 to etch the wafer according to the previously selected etch recipe and the calculated etch time.

After the wafer is processed in the Etch-1 etch step, at step 885, the measurement steps 855-865 can be repeated to confirm that the Etch-1 process achieved the target final wafer profile. In particular, the post Etch-1 steps can include: position the wafer under the Isis Scanner; set wafer measurement type to "Final;" measure wafer thickness for final analysis; determine the PostEtch1Thickness which is the average of the measured thickness; adjust the second etch rate, for example, according to the following equation: SecondEtchRate=(0.9*SecondEtchRate)+0.1*((PostSpin-DThickness−PostEtch1Thickness)/PreviousEtch1EtchTime).

In addition, the analysis of the post Etch-1 thickness measurements can include validating the wafer's thickness to determine if are all TSVs were revealed and if the wafer meets all the prescribed criteria such as reveal depth, reveal tolerance, uniform thickness tolerance and the like to determine that the wafer processing has been completed. After a wafer is complete, the process can be repeated for subsequent wafers. However, if the wafer requires additional etching, the system can repeat the steps of calculating etch depth and etch profile and the Etch-1 etching process can be performed again until the wafer is completed.

Accordingly, it can be appreciated that by comparing the post-processing thickness information to the pre-processing thickness information, at each stage of the etching process in view of the desired results of the respective etch step, the configured processor can determine whether the etch recipe executed by the etching apparatus successfully etched the desired amount of wafer at the desired locations and resulted in a processed wafer having the desired physical characteristics, including thickness uniformity. Based on the comparison, the configured processor can adjust the etch recipe for the ensuing etch step to compensate for any deficiencies in the previous etching step. Moreover, as noted above, the configured processor can analyze the thickness measurements taken throughout the process 850 and adjust the wafer profile parameters and etch recipes for subsequent wafers being processed. For example, the configured processor can adjust the first and second etch rate as previously mentioned. In addition, information about the actual height of the TSVs can be input to the wafer profile. In addition, preferably, the first and/or second etch recipes for processing the subsequent wafers can be adjusted based on the actual results from processing the preceding wafers. More specifically, the processor can compare the post-etch step thickness measurements to the pre-processing thickness measurements and the respective wafer profiles to determine whether the etch recipe executed by the etching apparatus successfully etched the desired amount of wafer at the desired locations and resulted in a processed wafer having the desired physical characteristics, including thickness uniformity. In the event that the respective etching steps were not successful, the process controller can adjust the etch recipes for subsequent wafers.

Although the process described in relation to step 870-880 includes steps for generating the etch recipe specifically for the Etch-1 etch step based on the measured PostSpin-DThickness of a wafer and whether the post Spin-D wafer meets the target wafer parameters, it can be appreciated that the steps for calculating a Spin-D etch recipe and etching the wafer in the Spin-D etching step can be repeated until the first target wafer profile is met to a prescribed degree. For instance, a wafer having a layer of overburden with the prescribed surface roughness and prescribed RST can be achieved through one or more specifically tailored Spin-D etching steps. As a result, the Etch-1 etch recipe can be more uniformly applied from wafer to wafer and can be implemented to produce wafers meeting the target final wafer profile parameters with minimal adjustments to the etch recipe.

Accordingly, system 100 executing process flow 800 and 850 provides a fully automated, production grade, solution that: uses specialized metrology to generate, in real time for each etch step, etch recipes that are specifically tailored to each wafer based on the etching steps that have already been performed on the wafer and/or based on previously etched wafers; and etches the wafers using a single wafer wet etch apparatus. As a result, the system can achieve a precise etch depth, thickness uniformity and in general produce higher quality wafers, minimize waste and realize the benefits associated with a single wafer wet etch process.

As mentioned above, the measurement steps and etching steps are all performed as part of an integrated system defined by complementary devices that are located within a single housing.

At this juncture, it should be noted that although much of the foregoing description has been directed to a system for performing a wet etching process and methods for wet etching wafers to reveal TSVs, the systems and methods disclosed herein can be similarly deployed and/or implemented in scenarios, situations, and settings far beyond the referenced scenarios. It can be readily appreciated that the system for performing a wet etching process can be effectively employed in practically any scenario in which a wafer is to be etched in one or more single wafer wet etching stations to a target wafer profile (e.g., a desired surface roughness, thickness uniformity, reveal height, and overall thickness and the like).

It can also be readily appreciated that one or more of the steps described in relation to the step of generating an etch recipe, modifying wafer profiles and arm scan profiles and the like are not limited to wet etching processes. In particular, generating an arm scan profile, as described above, can be implemented in practically any scenario where it is desirable to create a customized path for an arm to travel in a processing environment. For example, an arm scan profile can be generated substantially in the same manner as described above can be applied to wafer cleaning applications in which the arm scan profile controls the dispensing of cleaning solution onto a wafer. Commonly owned U.S. patent application No. 62/073,727, incorporated by reference previously, discloses the generation of arm scan profiles and the teachings therein can be implemented with the present teachings.

The following examples are exemplary of the implementation of the process described herein; however, it will be understood that these Examples are not limiting of the present invention in any way.

EXAMPLES

Mobility and performance demands from semiconductor end users have continually driven the semiconductor device geometry to smaller dimensions. The same pressure has also resulted in many innovations from the semiconductor packaging industry. One of these innovations is the Through Silicon Via (TSV) 3D packaging technology. Through Silicon Via has become the key enabling technology in 3D packaging by reducing interconnect length to increase device speed, and by increasing interconnect density to reduce the package form factor. There are three different integration schemes with the TSV process: via-first, via-middle, and via-last. The via-first process forms the TSV in the substrate silicon before the front-end process. The via-middle process forms the TSV at the front end or interconnect steps with the regular wafer process flow. The via-last process makes the TSV from the backside of the wafer after completing the BEOL processing. In via-first and via-middle TSV integration flows, Si wafers must be thinned from the backside to reveal the Cu TSVs for the wafer to make contact with another wafer or chips. Typically, this thinning is accomplished by grinding the back side of the wafer, CMP polishing to remove the subsurface damage and to eliminate stress in the wafer, then etching with a plasma or wet process to reveal the Cu TSVs. The CMP process involves using expensive slurries and critical post cleaning steps to remove the slurry particles and other introduced contaminants. Dry etch processes usually require expensive equipment and etching gases. On the other hand, wet chemicals such as KOH and TMAH have been used as cost-effective wet etch alternatives for plasma etching to reveal the TSV. While KOH is a suitable etchant, during the KOH etching process, the KOH adds metal ion (K+) contamination on wafer surfaces. Typically, a cleaning process is required after the KOH etch, to remove the residual K+, particularly when KOH is used as to reveal TSVs. The additional cleaning process reduces the tool throughput and, therefore, is not desired in mass production. Tetramethylammonium hydroxide (TMAH) has been used to replace the KOH in TSV reveal wet processing to eliminate metal contamination. However, TMAH is toxic. Some semiconductor fabricators try to avoid it whenever possible. Other TSV reveal etchants are commercially available and suitable for use in the present invention, including a TSV reveal etchant that is available under the trade name SMC6-42-1 from SACHEM, this etchant does not contain TMAH or metal-containing (inorganic) hydroxide. As noted above, in performing a reveal etch, the etchant is preferably selective for etching the wafer material (e.g., silicon) and not the material forming the TSVs including, for example and without limitation, a conductive material (e.g., copper) and an oxide liner around the conductive material. As further described herein, suitable anisotropic reveal etchants include highly alkaline etchants.

Coupon Tests

Coupons of about 20×20 mm made from P-type single-crystal Si wafers with [100] orientation were used in all lab tests. A coupon was premeasured for surface area, pretreated with 2% HF to remove native oxide, and preweighed. The coupon was then submerged in an etch solution in a PTFE beaker for a specified time. Temperature was controlled at 75° C. for all tests unless otherwise indicated. After the specified etch period, the coupon was removed from the etchant and immediately rinsed with DI water and then IPA. The coupon was then dried using N2, and weighed to calculate the total etch amount and etch rate.

Wafer Tests

Ground wafers and Si test wafers (all 300 mm) were etched on a commercial-grade SSEC 3300 ML single-wafer process tool. Process and equipment parameters were developed for optimum etch rate, surface roughness, and surface defects. The etch amount was determined using an ISIS StraDex f2-300 IR sensor by measuring the pre- and postetch wafer thickness. Surface roughness was measured using a KLA P16 surface profilometer, and reviewed with a Veeco Icon AFM. Surface defects and conditions were reviewed using a Hitachi S-3700N SEM. Finally, production TSV wafers were processed under the optimized chemical and equipment conditions determined using test wafers.

Results and Discussion

Etch Rates and Selectivities

For a successful wet process, a high silicon etch rate is preferable because it determines the throughput, one of the key cost factors for the process. Table 1 compares the [100] Si wafer, thermal oxide (Tox), and Cu (sputtered film) etch rates from exemplary beaker tests. Hydroxide ion, [OH—] is believed to be the dominant active silicon etch species in strong base solutions through the following general silicon etch reaction Si+2OH-+2H2O·Si(OH)2O22-+2H2

The [OH—] concentration was kept at the same level (<2M). Temperature was maintained at 75-80° C. As the table indicates, the SMC6-42-1 etch rate is about 2× and 4× faster than TMAH and KOH, respectively, at the same molar concentration. It should be mentioned that KOH etches Si (100) faster at higher concentrations, such as 2.2~3.6M (12.5-20%).

During the reveal etch, the etchant does not significantly etch the oxide liners that insulates plated copper TSVs from the bulk silicon in the TSV. This requirement is the main reason that the industry prefers strong base etchants to acidic etchants based on HF, such as HF/HNO3.

The data from Table 1 suggest that SMC6-42-1 has about the same Tox etch rate as TMAH and KOH, but 2× the selectivity due to a high Si etch rate. Cu etch rates among these etchants are comparable and at a low level of 1 nm/min. Under normal circumstances Cu TSVs are not exposed during the reveal etch since the TSVs are covered with oxide. Therefore the Cu etch rate is not as critical as the oxide etch rate.

TABLE 1

Comparison of Si, Tox, and Cu etch rates in beaker tests

| Etchant | Si (100) ER (nm/min) | Tox ER (nm/min) | Cu ER (nm/min) |
|---|---|---|---|
| SMC6 42-1 | 1600 | 0.11 | 1.05 |
| TMAH | 800 | 0.1 | 0.9 |
| KOH | 363 | 0.1 | 1.0 |

With the promising beaker test results, the new Si etchant was tested using an SSEC single-wafer processor on regular test wafers and ground wafers. The ground wafers were thinned by Strasbaugh using the same grinding parameters as for real TSV device wafers. Therefore, the surface roughness, waviness, texture, and thickness variations are the same as they would be for TSV wafers. Table 2 summarizes the etch data generated in the SSEC single-wafer tool.

TABLE 2

Ground wafer ER in a commercial-grade SSEC single-wafer tool

| Etchant | Ground Wafer ER (nm/min) | Tox ER (nm/min) | OH Conc (M) | Temp (° C.) |
|---|---|---|---|---|
| SMC6-42-1 | 800 | 0.12 | 1 | 95 |
| TMAH | 260 | 0.1 | 2.8 | 80 |
| KOH | 600 | 0.1 | 4.2 | 72 |

The data in table 2 indicate that the SMC6-42-1 etches Si significantly higher than TMAH and KOH at the conditions tested. It is especially interesting that the higher silicon etch rate of SMC6-42-1 was achieved with only 1/3 and 1/4 respectively of the TMAH and KOH molar concentrations.

Significant ER differences were observed between SMC6-42-1 in the commercial tool and in a beaker test. This is probably due to the temperature drop of the etching solution when spreading to a thin film on the wafer surface. In a lab setup, a small coupon is submerged in a relatively large amount of solution kept at constant temperature.

Surface Roughness

Figure 10:
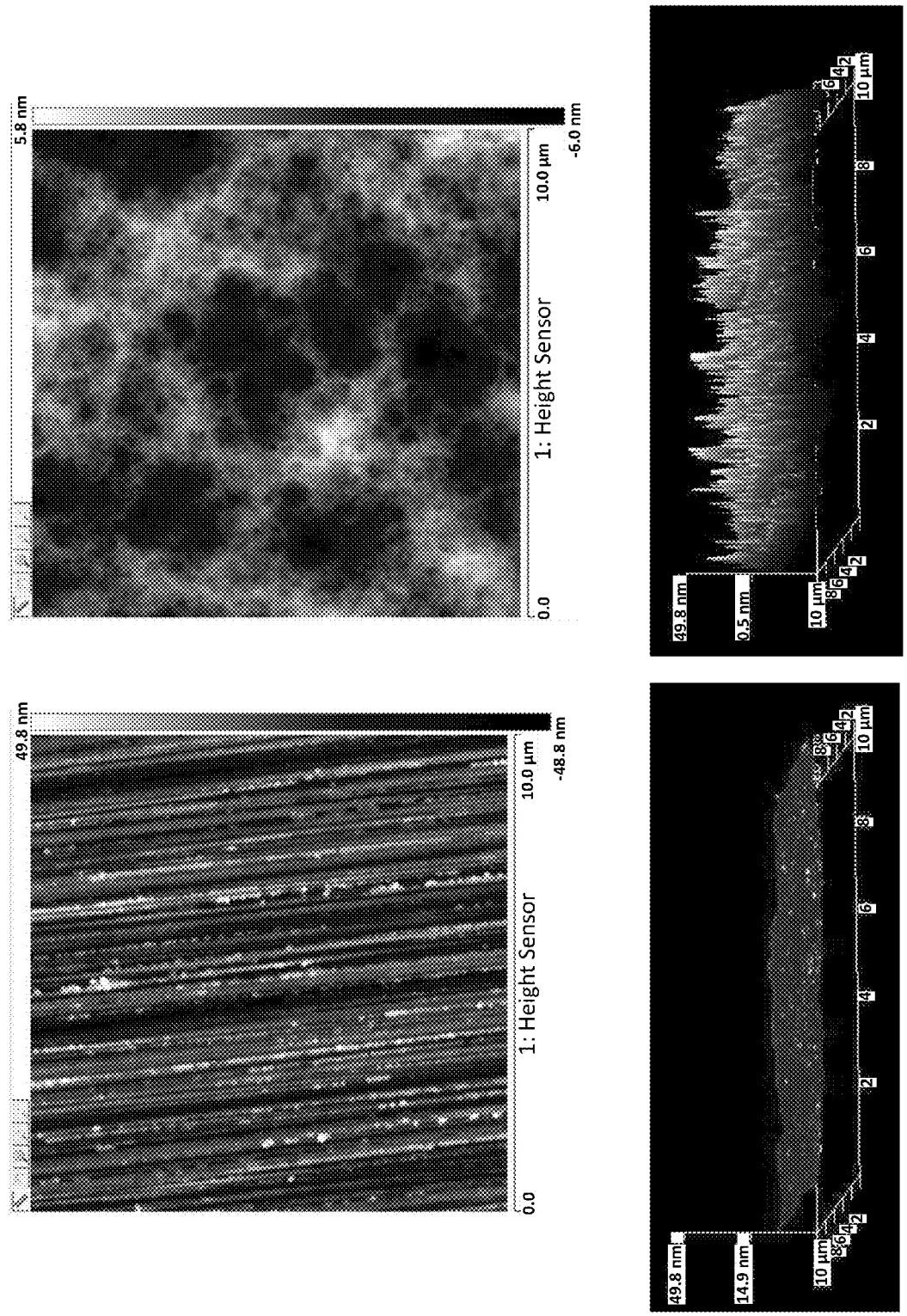
FIG. 10 shows AFM images of TSV wafer surface post grind (left) and post 10-μm etch (right))

Surface roughness affects film deposition following the TSV reveal process and is preferably tested and tightly controlled in high-volume production. Therefore surface roughness (pre and post etch process) was measured for all wafers tested on the commercial grade SSEC single-wafer processor using an AFM and/or a profilometer. FIG. 10 shows the surface of a TSV wafer after grinding and after the SMC6-42-1 etch (AFM images of TSV wafer surface post grind (left) and post 10-μm etch (right)).

As shown in the above images, post-grind TSV wafers appear rough, with visible grinding marks of maximum peak height up to 50 nm. After a 10 μm chemical etch, the maximum peak is below 15 nm. Most of this roughness is removed by the chemical etch. Here, the chemical etch process applied was a two-step approach. First, the wafer was etched using HF/HNO3 that etches silicon isotropically at a very fast etch rate, up to 10-μm/min., depending on the amount of silicon to be removed. The HF-based chemical cannot be used to reveal the TSV because it would etch the SiO2 liner and the Cu in the TSVs. The isotropic etch is used to quickly smooth out the peaks and valleys created during the grinding process. An anisotropic etchant is preferably used to finish etching the remaining silicon to reveal the TSV. As is well understood, anisotropic etching leaves well defined pyramids and pits on single crystalline silicon surfaces. SMC6-42-1 is specially formulated to prevent pit and pyramid formation. However, it will be appreciated as mentioned previously, that the above etchants are only exemplary and not limiting of the scope of the present invention which is broadly embodied in the method described herein.

Two wet chemical TSV reveal schemes were tested with the special formulation of SMC6-42-1. First, wafers were ground then CMP polished, and etched using SMC6-42-1. Second, wafers were ground, then etched using HF/HNO3 (isotropic) and followed by the anisotropic chemical etching process using SMC6-42-1. Both the isotropic and anisotropic etches were conducted in the SSEC single wafer tool. Pre and post etch wafer surface roughness was measured using a profilometer and reported in the below table. As the data demonstrated, for the Grinding/CMP/Etch process, the chemical etch increased the wafer surface roughness (Ra) from about 15 Å to about 23 Å. For the grinding/etch process however, the chemical etch process significantly reduced wafer surface roughness from about 75 Å to 22 Å, about the same with that obtained from the grinding-CMP-etch process.

| Wafer # | Process | Ra Pre (A) | Ra Post (A) |
|---|---|---|---|
| 1 | Grind/CMP/Etch | 19 | 23.55 |
| 2 | Grind/CMP/Etch | 12.5 | 24.85 |
| 3 | Grind/CMP/Etch | 14.9 | 26.25 |
| 4 | Grind/CMP/Etch | 11.55 | 18.05 |
| 5 | Grind/Etch | 86.9 | 22.25 |
| 6 | Grind/Etch | 62.4 | 21.65 |
| 7 | Grind/Etch | 73 | 27.5 |
| 8 | Grind/Etch | 77.5 | 16.45 |

One function of CMP or wet chemical process is to remove the mechanical subsurface damage and release subsurface stress caused from the grinding process. TEM was used to image the cross section of the wafers post grinding and post two step wet chemical etch. The TEM results are presented in the below images (top image below: TEM image of a ground wafer cross section close to the surface; and bottom image below: Cross section TEM image of a ground wafer after the two-steps wet etch (~10 μm Si removal).

Figure 11A:
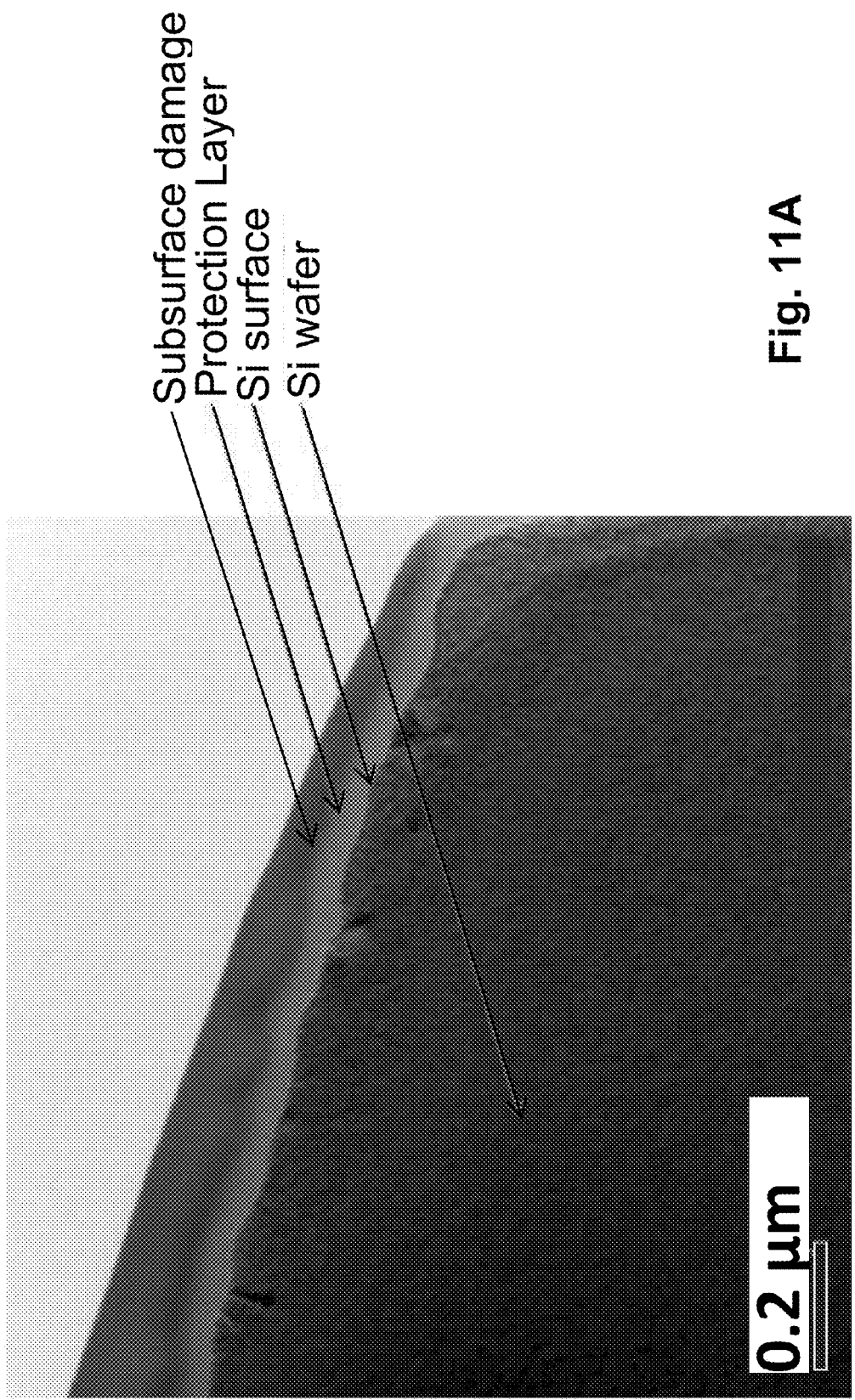
FIG. 11A is the TEM image of a wafer cross section close to the surface.
Figure 11B:
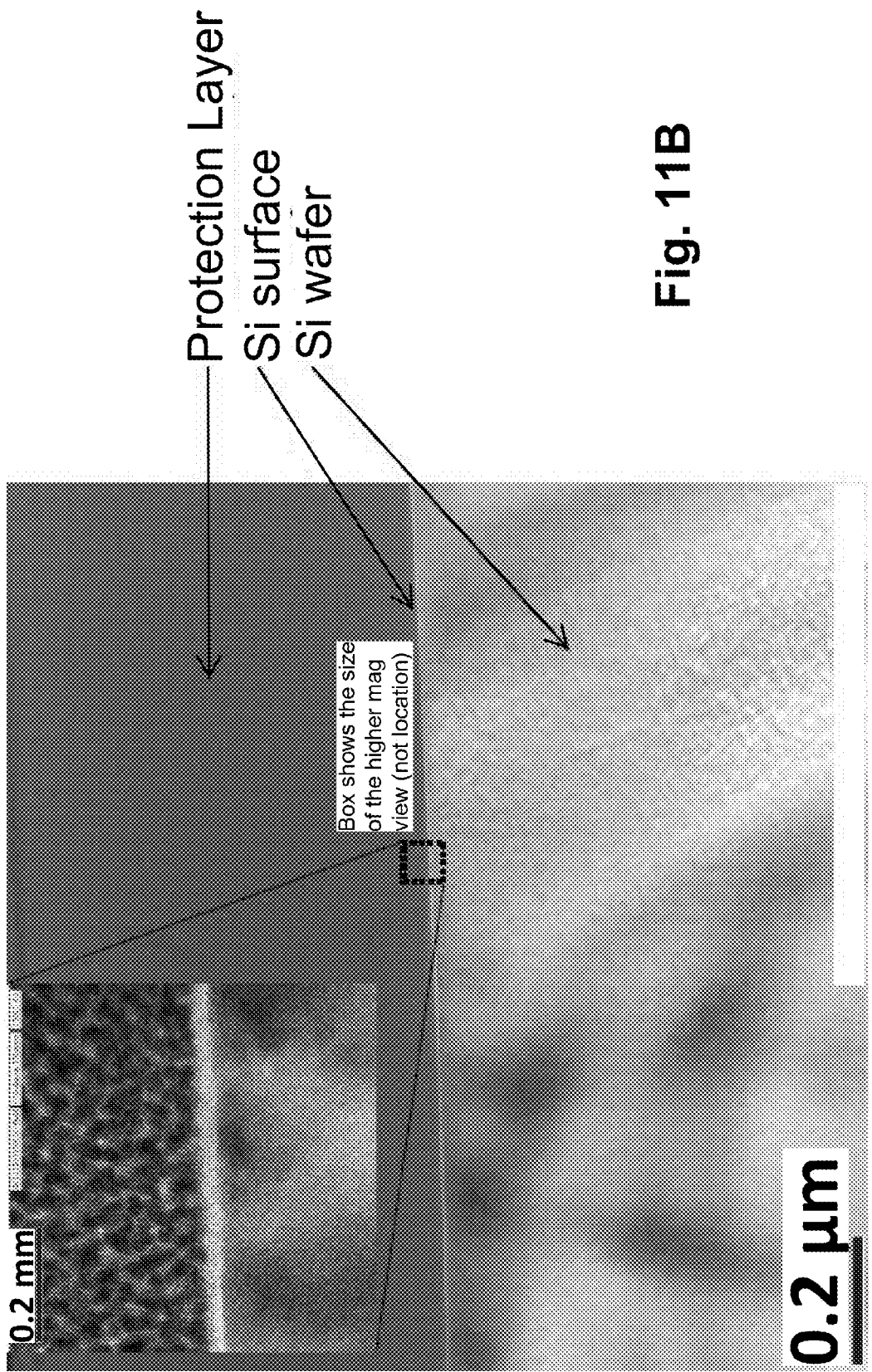
FIG. 11B is the TEM image of a ground wafer after the two step etch process.

FIG. 11A shows TEM images of a wafer cross section close to the surface. FIG. 11A clearly shows the subsurface damages up to about 100 nm deep. The subtle contrast change from the surface to the bulk suggests stress existing at the surface about 300 nm into the bulk. After the two step wet chemical etch the subsurface damages and stress are removed as shown in the TEM of FIG. 11B. This TEM and the roughness data demonstrate the CMP process step can be replaced with a wet etch process.

TSV Wafer Results

TSV production wafers were received after the grinding process. The wafers were processed using the two step chemical etch described herein and in this experiment using HF/HNO3 and SACHEM SMC6-42-1 as the two etchants. Wafers were successfully processed on the SSEC single-wafer tool with the optimum known parameters. The TSVs are revealed cleanly and the wafer surface is smooth.

SMC6-42-1 is formulated for fast etch rate and smooth surface finishing without the use of TMAH. The composition is listed in Table 4. Its toxicity data for rat dermal exposure, using LD50 as the indicator, is presented in Table 5.

TABLE 4

SMC6-42-1 Components

| Component | Conc (wt %) | Purpose |
|---|---|---|
| Organic Base (Non-TMAH) | 8-25 | etchant |
| Organic additive | <1 | Etch enhancement |
| DI Water | 74-91 | |

TABLE 5

Comparison LD50 for SMC6-42-1 and TMAH

| Component | LD50 (mg/kg) |
|---|---|
| SMC6-42-1 | 1000 |
| TMAH | 157 |

LD50 is the dosage for 50% or more of test rats to survive after skin contact with the test chemicals in a given time. Generally, the higher the LD50, the less toxic the chemical. As indicated in Table 5, SMC6-42-1 LD50 for rat dermal exposure is 1000 mg/kg and more than 5 times higher than that of TMAH.

Etch Profile Control

Figure 12:
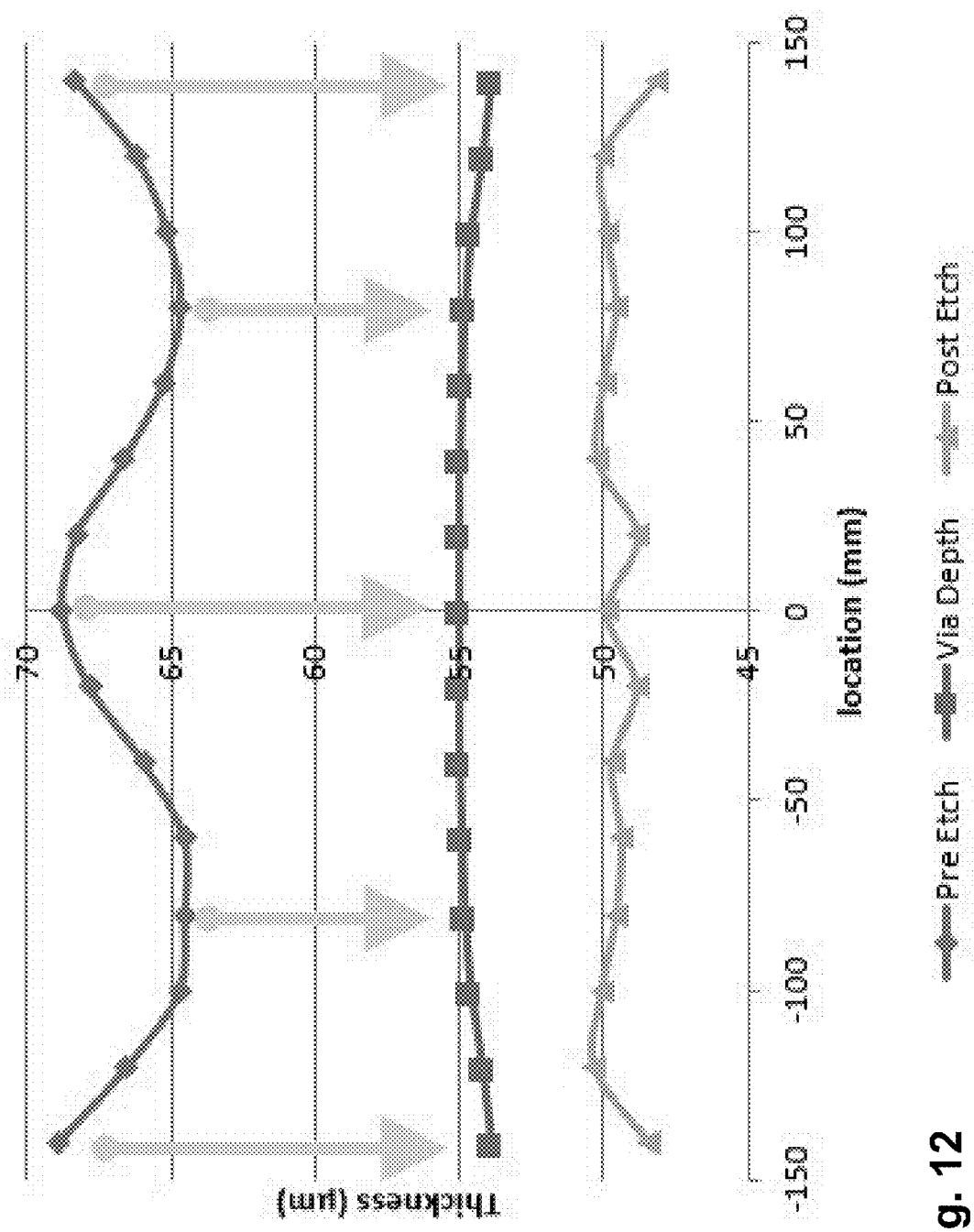
FIG. 12 shows the actual measurement results on a TSV wafer (below image: in-line-measured pre- and post-etch TSV wafer thickness)

Post-grind TSV wafers have significant thickness variations. These variations or non-uniformities may come from the grinders used and/or from thickness variations of the adhesive layer used for mounting the device wafer to a carrier. These non-uniformities are often radial in nature, due to the process that caused them, such as the top curve shown in FIG. 12. In other words, the thickness of the layer of residual substrate material (RST) is often generally consistent around a particular radial location (e.g., a ring shaped area that surrounds the center of the wafer at a given distance or ranges of distance from the center) but differs from the RST of one or more other radial locations. In this case, the wafer has a center and edge thicker profile. The incoming thickness variations could cause serious issues such as unrevealed TSVs. To address this non-uniformity issue, the exemplary single-wafer process system and methods integrates a wafer-thickness measurement sensor in the system, for example and without limitation, the ISIS StraDex f2-300. The sensor is incorporated in a separate chamber in the system design, thereby eliminating the need for off-line thickness metrology. The ISIS StraDex f2-300 sensor uses spectral coherence interferometry at a 1300-nm wavelength to obtain thickness measurements. The control system utilizes measurements taken across the diameter of the wafer, for example. A feed-forward control system uses pre-processing thickness measurements to adjust the etch depth for specific radial locations to compensate for incoming thickness variation. In addition, a feedback control mechanism utilizes thickness measurements taken post processing to adjust etch times for the subsequent wafers, thus addressing variations in etch rate. This closed-loop process control is especially important for high-volume manufacturing. In FIG. 12, (bottom curve) shows the actual measurement results on a TSV wafer after the reveal etch (FIG. 12 illustrates values for the in-line-measured initial thickness (top curve), via depth/height (middle curve) and post-reveal-etch TSV wafer thickness).

As shown in the above figure, by measuring the incoming wafer thickness and forward feeding this data to the control algorithm the single-wafer process system automatically adjusts the process parameters to compensate for the thicker edge region (e.g., the radial locations in the range of 100-150 mm from center) and the thicker center region (e.g., the radial locations in the range of 0-50 mm from center). The result is a reduction in the post etch thickness variation and uniformly revealed TSVs to within ±1.0 μm of the desired reveal height. The capability of measuring incoming wafer thickness, and controlling post-etch wafer thickness and radial profile provides a great advantage in high-volume production.

Figure 13:
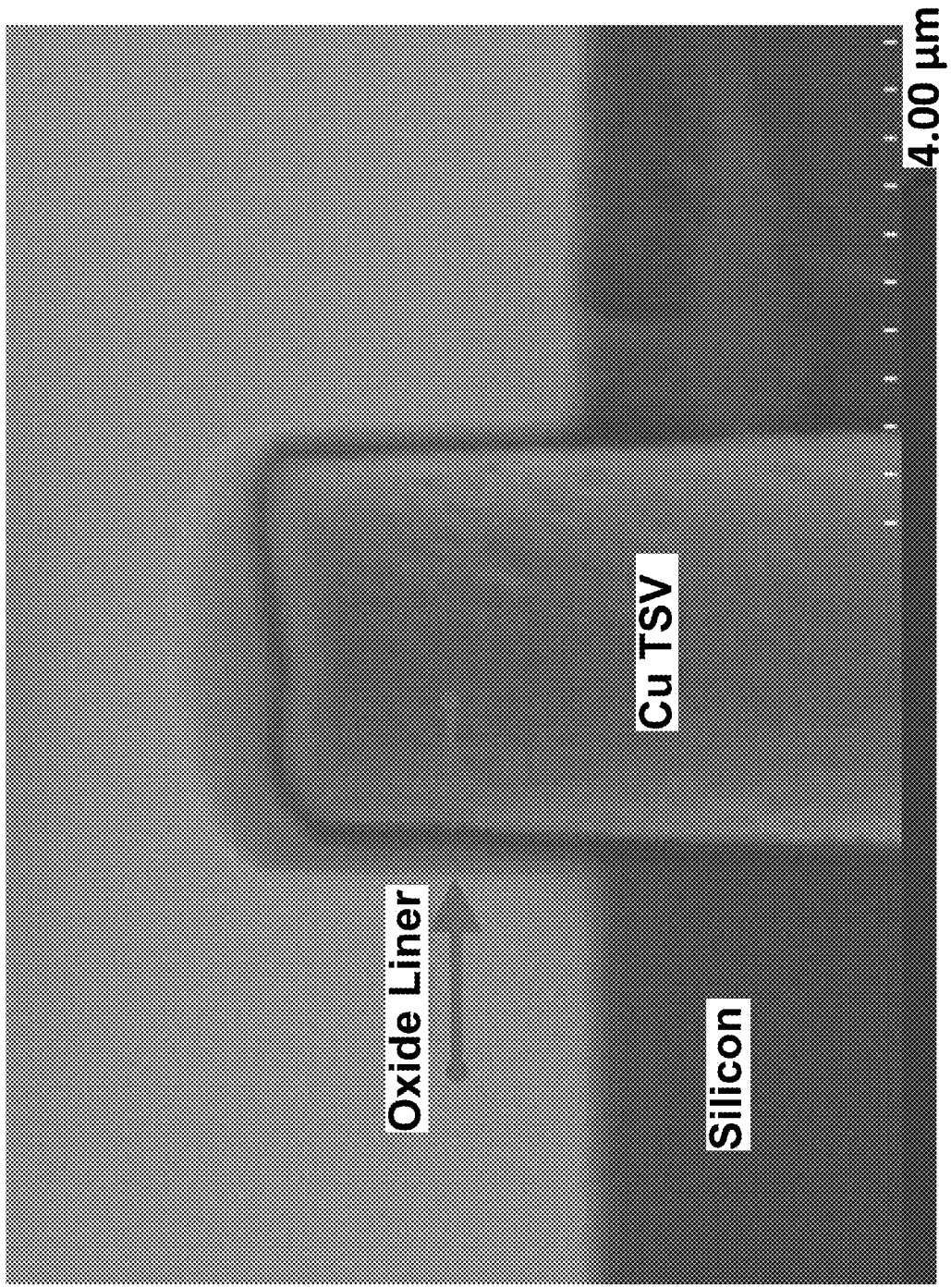
FIG. 13 shows a fractured cross-section of a TSV that has been revealed.

The reveal etchant does not preferentially attack along the sidewall of the TSVs as the etch reveals the TSV. FIG. 13 shows a fractured cross-section of a TSV that has been revealed. The oxide liner and barrier metal are intact. No dishing is observed at the intersection between the silicon and TSV.

As described herein, the present invention is directed to a wet etch process as a simple and cost-effective alternative to the CMP/plasma etch TSV reveal process. The process described herein uses two etching stages and provides an overall fast etch rate and high selectivity, within a single-wafer process tool. The present process improves the etch rate by 50% or more over traditional Si etchants currently used in the industry. By combining silicon-thickness measurement and wet etch in a single-wafer process system, this platform provides a lower cost of ownership and excellent process control capability for high-volume production.

As mentioned previously, the foregoing example and data is merely exemplary in nature and not limiting of the scope of the present invention.

As described, the two-step (two-stage) etch process includes a first step that is focused on smoothing the surface and eliminating radially dependent wafer thickness non-uniformities at a high etch rate (SPIN-D etch). The second step is selective to the substrate material (e.g., silicon) and without attacking both the oxide liner and the metal studs. For the first step, isotropic wet etching of silicon is used to provide a smoothing of the surface roughness, as well as to effect a high etch rate. Any number of different etchants can be used, such as an etchant that contains a mixture of nitric and hydrofluoric acids as active etch ingredients. The nitric acid acts as an oxidizer to convert the surface into silicon oxide and then the HF etches the oxide. For use in a single-wafer spin processor, the addition of chemicals with higher viscosities provides a more uniform etch of the wafer surface. Phosphoric and sulfuric acids can be added for their viscosity and do not chemically participate in the etching reaction. The addition of these viscous acids does not alter the chemical kinetics, but does increase the mass-transfer resistance as a result of the increase in viscosity. In addition, the ratios of the chemicals can affect the surface roughness. At high HF and low nitric acid concentrations, the process is very temperature dependent. Further, the reaction rate cannot be easily controlled, resulting in unstable silicon surfaces. At low HF and high nitric acid content, smooth, polished surfaces result because of the more diffusion-limited reaction. With the addition of the viscous acids, the surface roughness decreases more efficiently for the same removal rate. The use of a spin etch system allows the optimization of this step. Further, the rate of chemical reaction, along with the spin process parameters, has significant effect on the overall uniformity and surface finish. Process conditions can be selected to tailor the etch rate for a smoother surface and to compensate for the non-uniformities of the postgrind wafer.

For the second step, as mentioned above, a selective etch process is used to reveal the metal TSVs. The chemistry is selective in that it etches the wafer substrate material and does not attack the oxide liner or metal of the TSV. The silicon surface is clean and smooth, removing the stress related to grinding. Compensation for radial nonuniformities in the silicon thickness and via depths is accomplished by modifications in the radial etch profile. An integrated wafer thickness measurement system provides critical information to control the etching process. The oxide isolation liner remains intact because of the selectivity of the chemical etching process.

Single-wafer etch processing can compensate for radial non-uniformities by etching more or less a specific radial locations across the surface of the wafer, depending on the process parameters. This is achieved using controllable nonlinear motion profiles for chemical dispense as described herein. In fact, this method of compensation is important in order to provide the etch process. The tools described herein determine the silicon thickness with integrated infrared measurements. The integrated thickness measurement allows a tailored etch recipe to be calculated for each wafer immediately prior to the etch process. The post-etch measurement confirms the proper amount of silicon was etched. Measurement of the silicon thickness prior to etching is critical to the reveal process, but must be combined with prior knowledge of the depth of the TSV from the surface. Preferably, the manufacturer has accurate dimensions of the metal stud that forms the TSV. The amount of silicon to be etched is determined based on the depth of the TSV and the desired height of the revealed Cu studs after processing.

For the tools described above, a wafer thickness measurement sensor has been incorporated in a separate chamber in the system design in order to provide closed-loop feed-forward control of the etching process. The sensor measures the actual thickness of the device wafer, not the entire stack, which includes the carrier and adhesive. Multiple measurements are taken across the diameter of the wafer. The measurement of the via depth must be done previously in the front end-of-line (FEOL) process when the vias are etched and filled. The data are combined to allow for the calculation of the silicon etch depth and radial profile.

In one example, the etch rate in a single-wafer etch tool can decrease over time because of the chemical reactions changing the chemistry. A constant etch rate can be maintained by incorporating chemical replenishment. To ensure the proper chemical replenishment is taking place, the etch rate is monitored by measuring the amount of silicon that was etched on the previous wafer. Thus, the etch rate can be computed and used for the next wafer to provide closed-loop process control. The projected etch time with radial variation is calculated using this etch rate. The variation in radial etch rate is selected based on the thickness of the silicon wafer, minus the depth of the TSV, plus the amount of TSV to be revealed. In this example, the TSVs were to be exposed by 5 $\mu$m. The initial thickness variation of the silicon after grinding was 4.4 $\mu$m. However, the TSV depth variation was 1.5 $\mu$m, which must also be factored into the etch calculation. Using the same 5 $\mu$m-reveal example, if the etch had been done without compensation for the radial variations, the reveal heights would have varied by the initial 4.4 $\mu$m of silicon non-uniformity, as well as the 1.5 $\mu$m variation of the TSVs. Some of the TSVs could be exposed by over 10 $\mu$m and could result in mechanical failure during subsequent redistribution layer (RDL) processing. Using an etch profile to compensate for the incoming silicon thickness variation and the known variation of the TSVs, the resulting reveal heights were within a ±1 $\mu$m window around the desired 5 $\mu$m-reveal height.

Continual thickness measurement allows the etch rate to be determined and not only fed forward for the next wafer to be processed, but also factored into the processing of the current wafer. If the final silicon thickness measurement after an etching stage is not within specification, the wafer can return to the etch chamber for further processing.

In one or more embodiments, the software modules 730 can also include an arm scan profile module 782 for generating custom arm scan profiles, as described above and as further described herein.

Custom Arm Scanning Profiles allow the user to graphically create and modify the path that a dispense arm will travel over a substrate, including at what velocity the arm will be moving at a given point in the profile. Profiles are dynamically created by the configured processor based on user-interaction with a line chart. The line can be shaped into the desired arm motion profile by click and dragging the points that define the line until the desired dispense path is created. Each point in the profile represents the arm's velocity at a given location along the path.

The custom arm scan profiles can be created/modified by the process controller 705 based on inputs from the user using the user interface and received by the processor 710, which is configured by executing one or more software modules 730, including, preferably the user interface module 780 and the wafer profile module 772 and the arm scan profile module 782.

More specifically, the configured processor can display a graphical user interface referred to herein as the arm scanning profile wizard through which the user can interact with the system. The "Arm Scanning Profile Wizard" is used to generate a new arm scanning profile that is based on a predefined template. After generation, the default profile can be altered to fit the dispense application's specific requirements. In addition, the user can also input wafer data/parameters. For instance, a "Wafer Information" page can be used to enter, among other things, the wafer's diameter. The diameter units can be selected as either "mm" or "in".

Figure 14A:
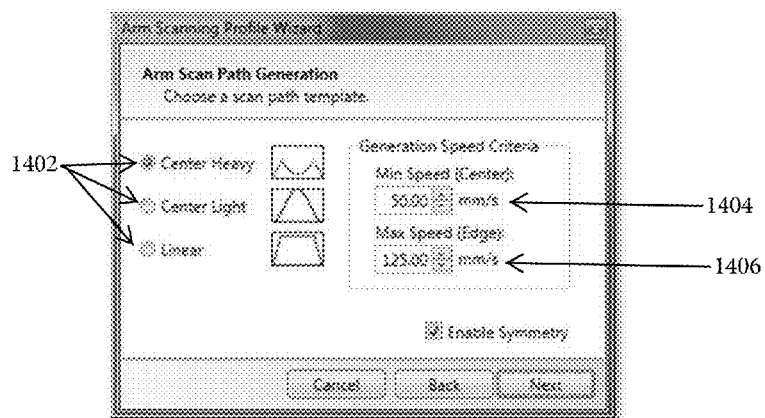
FIG. 14A is a screenshot of a graphical user interface in accordance with at least one embodiment disclosed herein.

In regard to the arm scanning profile, the profile can be based on an arm scan template. The configured processor can prompt the user to select a template and the user can customize the profile after it has been generated from the chosen template. FIG. 14A depicts an exemplary GUI for the scan path template selection. For example, the template choices 1402 can include "Center Heavy", "Center Light", and "Linear" (e.g., uniform) that correspond to a characteristic variation in thickness across the surface of the wafer.

When choosing the "Center Heavy" and "Center Light" template, the user can be prompted to enter the "Min Speed" 1404 and "Max Speed" 1404 that will be generated for the profile. For the "Center Heavy" profile, the "Min Speed" represents the arm velocity at the center of the wafer and the "Max Speed" represents the arm velocity at the edge of the wafer. It is the opposite case for the "Center Light" profile, where the "Min Speed" represents the arm velocity at the edge of the wafer while the "Max Speed" represents the arm velocity at the center of the wafer.

When choosing the "Linear" template, the user can be prompted to enter the "Max Speed". The "Max Speed" represents the arm velocity that will be generated in the profile across all locations over the wafer. If all arm motions performed on the left side of the wafer surface will also be performed on the right side of the wafer surface, then the time to create the final profile can be reduced by a user enabling the Symmetry feature. The Symmetry feature causes the configured processor to reflect all point placements made on the graph for the left side of the wafer surface onto the right side of the wafer surface. A user can click the "Enable Symmetry" checkbox to activate the symmetry function, as shown in FIG. 14A. Based on the received information the graph is displayed to the user and all point editing operations performed on the left half of the graph will be reflected on the right half of the graph. Symmetry can be toggled ON/OFF at any time for each profile graph. If Symmetry is not enabled, then all areas of the profile graph are available for point placement and editing.

The configured processor can generate and display a "Profile Summary" page which displays the list of choices made during the wizard and these settings will be used to generate the arm scanning profile. In addition the configured processor can automatically save a profile when it is created with the "Arm Scanning Profile Wizard".

In addition, arm scan profile data can be automatically imported by the configured processor, for example, based on information set forth in the wafer profile described in conjunction with FIG. 8B, in addition or alternatively, the template profile can be imported from the etch profile, including the arm scan profile generated at step 870.

In addition, arm scan profile data can be imported from a table or file as provided by the user. In general arm scan profile data can include locations on the surface of the wafer, and corresponding velocity of the head at that location. Although such information can be displayed in tabular form, the configured processor can display the arm scan profile in graphical form.

The arm scanning profile graph contains a continuous line (either linear or curved) that represents the path of motion that a dispense arm will follow, including the velocity of the arm at each of a plurality of point locations along the path. As further described herein, in accordance with one or more of the embodiments of the invention, the profile path can be changed by editing and deleting existing points and by adding new points by a user interacting with the graphical representation of the path. The user interactions are received by the configured processor and the interactions are converted into corresponding adjustments to the arm scan profile by modifying the locations that the point corresponds to and corresponding speed based on the user interaction with the point on the graph as further described herein. Several features allow for a high-degree of customization. Moreover, in accordance with the disclosed embodiments, the present application operates beyond simple drag-and-drop functionality, for example by tracking a relative position where a selection is initiated and a subsequent relative position where the selection is completed (i.e. the click is released) and determining the validity of such modifications. At the point of release, the adjustment can be translated into corresponding arm scan parameters and upon completion of the modifications to the arm scan profile, updated instructions can be generated and can be sent to one or more devices configured to carry out the process.

Figure 14B:
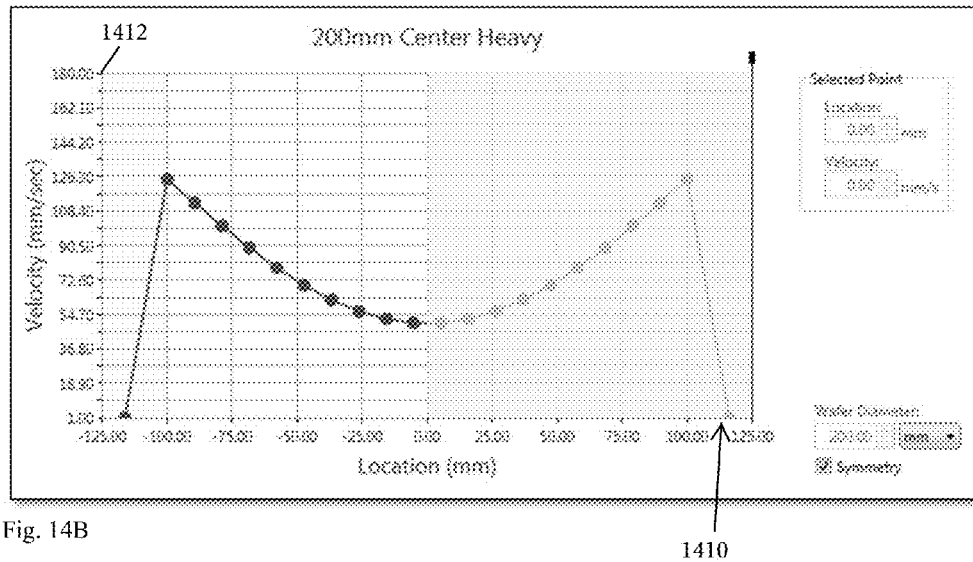
FIG. 14B is a screenshot of a graphical user interface in accordance with at least one embodiment disclosed herein.

FIG. 14B depicts an exemplary graph of an arm scan profile displayed to the user via the GUI. The graph's x-axis 1410 represents the location of the dispense arm across a diameter of the wafer surface. Location values are relative to the center of the wafer, with 0.00 shown at the midpoint of the axis. Referencing locations in this manner allows a single profile to be applied to multiple process chambers.

The example shown in FIG. 14B and further described here represents a 200 mm wafer. Note that the x-axis appears to be set to a 250 mm wafer, as the axis values range from −125.00 mm to 125.00 mm. This is due to the fact that extra distance is added at the end of each side of the axis to allow the arm to begin and end motion beyond the wafer edges and to give the arm the distance required to be at full speed when the wafer edge (represented as the point at −100 mm and 100 mm) is reached during the dispense function. The areas of the graph that represent locations that are not coincident with the wafer surface (e.g., beyond 100 mm from center) can be colored with a light-yellow fill or shading.

The graph's y-axis represents the velocity that the arm will be moving at the given x-axis location value. Please note that although the location values of the first and last points in the graph can be changed, their velocity values are preferably set to the allowed minimum and the graph can be configured to not allow the velocity value to be altered for these points.

Figure 14C:
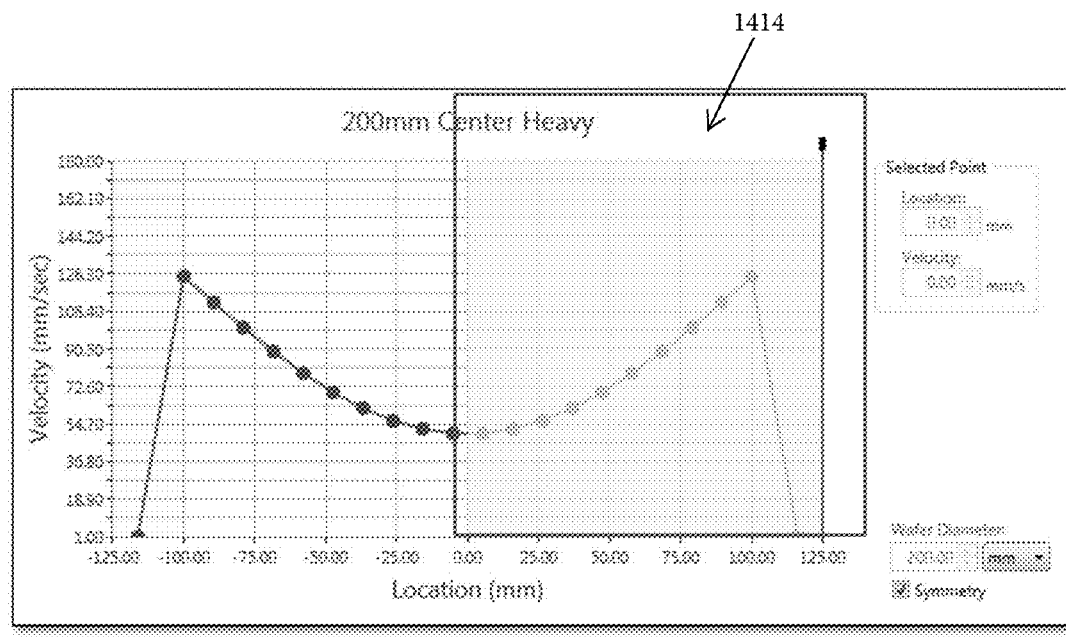
FIG. 14C is a screenshot of a graphical user interface in accordance with at least one embodiment disclosed herein.

As previously noted, the Symmetry feature automatically reflects changes made to the profile on the left half of the wafer over to the right half of the wafer. This allows for a symmetric profile path across the center of the wafer. With Symmetry enabled, the right half of the graph can becomes disabled and point changes are not allowed in that area (or vice versa). The area is shaded a light gray to further indicate that Symmetry is active. FIG. 14C depicts the graph and outlines the disabled right half of the graph 1414.

A user can also click the "Symmetry" checkbox to disable Symmetry. With Symmetry disabled, the right side of the profile graph will become enabled and the points reflected from the left half of the graph will be available for individual editing. If Symmetry is re-enabled, then all points on the right half of the graph will be replaced with reflected points from the left half of the graph.

Figure 14D:
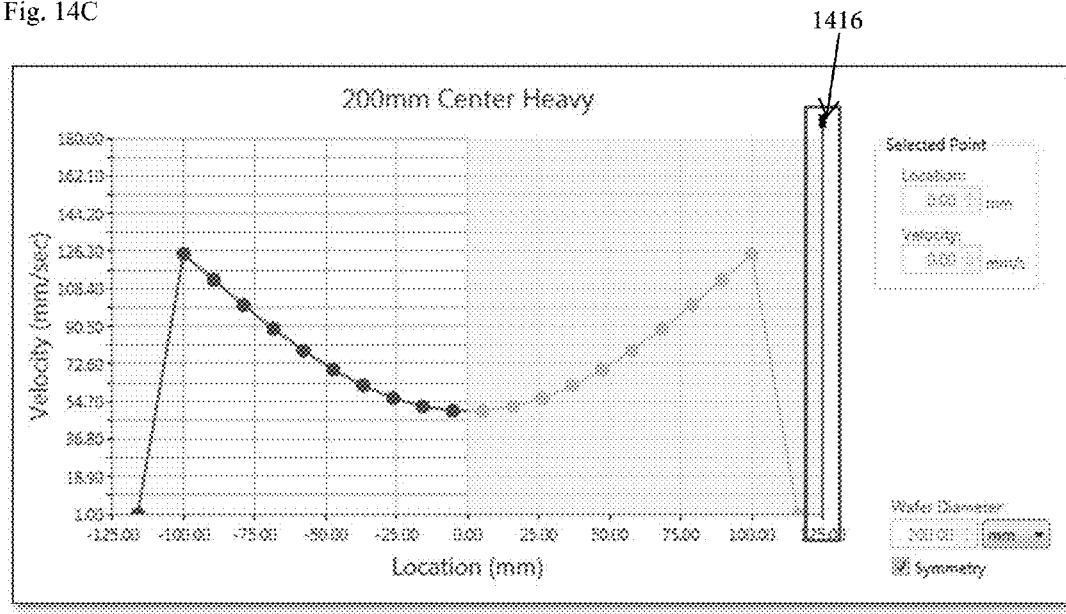
FIG. 14D is a screenshot of a graphical user interface in accordance with at least one embodiment disclosed herein.

If the Symmetry feature is enabled, the configured processor will reflect all point locations on the left half of the graph onto the right half of the graph. As the dispense arm sweeps back and forth, dispensing may occur near edge locations for a longer period of time as the arm decelerates to a stop and then again accelerates to move in the opposite direction. To help alleviate over-etching in this case, an exclusion area can be created or modified by the user by sliding the Exclusion Border to the desired place on the graph. The exclusion border 1416 is highlighted in FIG. 14D. Points within the exclusion area are not included when the dispense path is executed, meaning the nozzle does not dispense etchant over the locations within the dispense path.

Figure 14E:
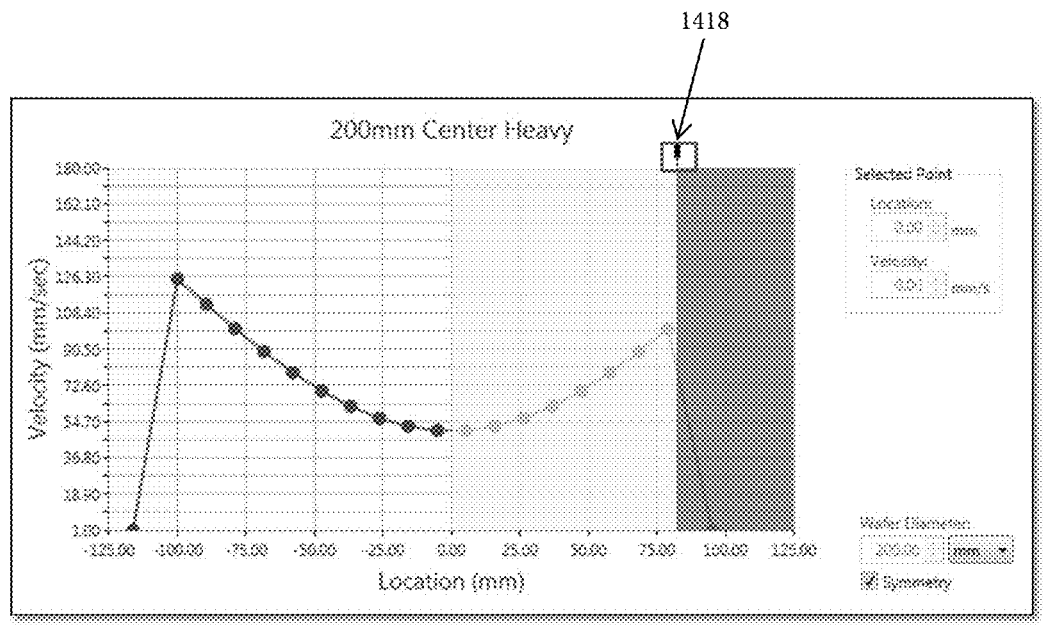
FIG. 14E is a screenshot of a graphical user interface in accordance with at least one embodiment disclosed herein.

As shown in FIG. 14C, the top of the Exclusion Border contains a grab bar 1418. A user can click and hold the grab bar and then move the mouse across the x-axis of the graph to change the position of the Exclusion Border. On the GUI, the exclusion area can appear dark grey and all locations within the exclusion area will be removed, except for a single location, placed at the minimum allowed velocity value, so that deceleration/acceleration of the arm as direction is changed can properly occur. An example of an applied exclusion area (greyed out) is shown in FIG. 14E. Accordingly, such graphically input instructions are received by the configured processor and corresponding adjustments are made to the corresponding points of the arm scan profile.

In addition, the configured processor facilitates a system in which profile points along the arm scan path can be added, edited and deleted in order to create an arm scanning profile that fits the requirements of a given process.

Figure 14F:
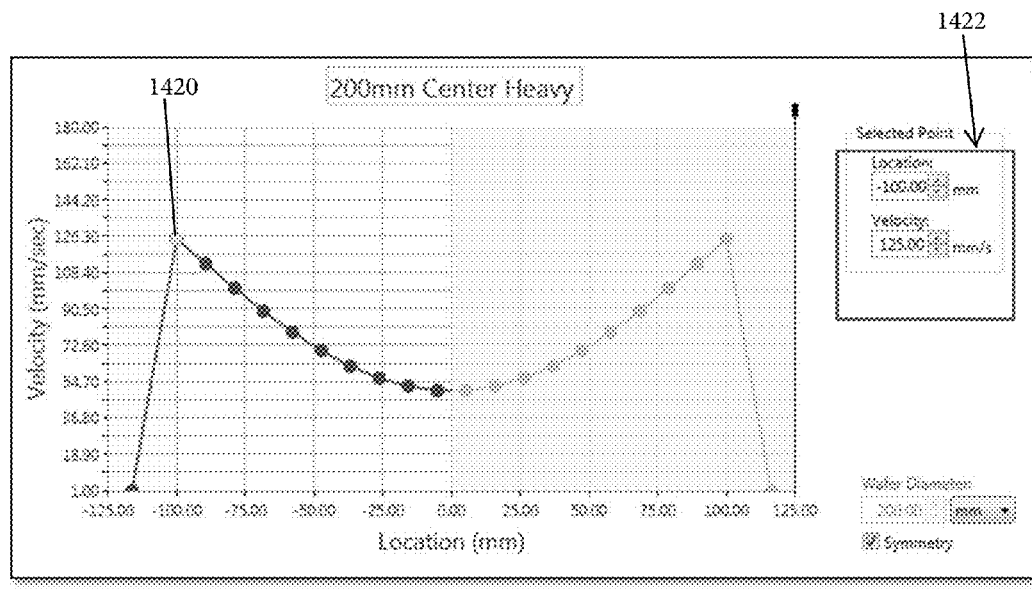
FIG. 14F is a screenshot of a graphical user interface in accordance with at least one embodiment disclosed herein.

Via the user interface a user can click on a point in the graph area to select it. As shown in FIG. 14F the selected point 1420 will appear highlighted and its location and velocity values will appear in the "Location" and "Velocity" edit boxes in the "Selected Point" area 1422 to the right of the graph. If Symmetry is enabled, only points on the left half of the graph may be selected. If no point is currently selected, then the "Selected Point" edit boxes will become disabled.

A point's location and velocity value can be changed using two different methods. A user can click and drag a point horizontally across the graph to change the arm location for that point in the arm scanning profile. A user can click and drag a point vertically to change the arm velocity at that point's location in the profile. As a point is dragged, its changing location and velocity values will be displayed in the "Selected Point" edit boxes.

Figure 14G:
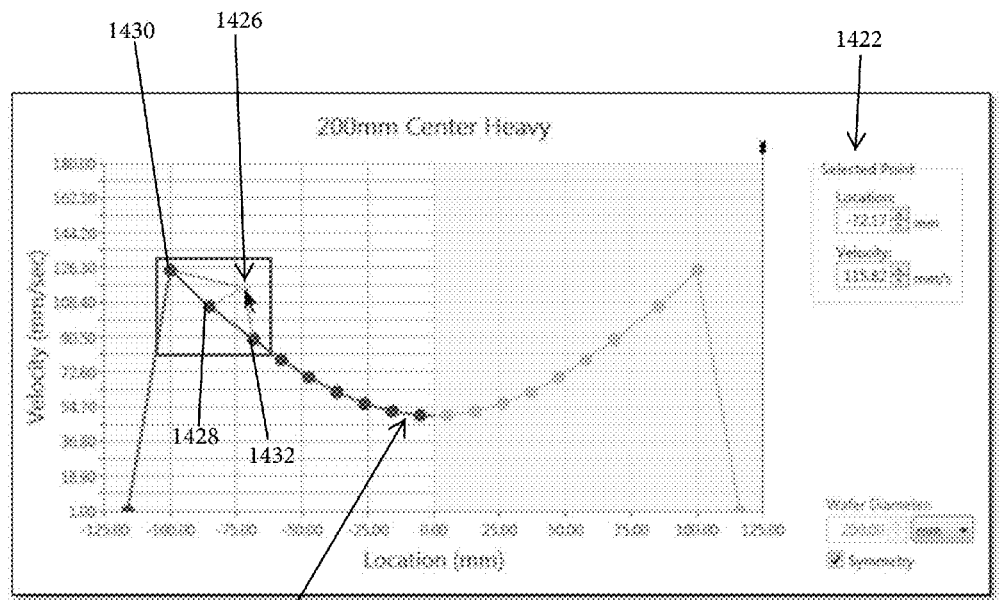
FIG. 14G is a screenshot of a graphical user interface in accordance with at least one embodiment disclosed herein.

As shown in FIG. 14G, a point 1426 will appear highlighted as it is being dragged with the mouse cursor, and a dashed line will connect it to the point at its original position 1428. Solid lines will also connect the point being dragged to the points adjacent to it, so that the user can get a visual feel for what the result will be when the mouse button is released. The configured processor will receive the user input and convert the user input into corresponding location and velocity values so as to update the profile according to the user input. In addition the configured processor can also verify the validity of the user's input and corresponding change to the velocity and location. For example, the operational constraints of the arm can include a maximum acceleration over a given distance. Accordingly, the configured processor can determine if the change in location and change in velocity between the point being adjusted 1428 and the preceding point 1430 or subsequent point 1432 violates any such constraint. It can be appreciated that other such processing constraints can be monitored by the configured processor. For example, the system can also prevent a point from being moved to a location beyond the preceding or subsequent point.

As a warning, the configured processor can display an alert, for example, a point will appear in a different color if it is dragged to a position where the value of the acceleration to or from the point is greater than the recommended maximum. Relocation of a point to such a position is not required to be prevented by the system. However, the dispense arm may not be able to execute the motion successfully.

In addition, changes to location and velocity can be adjusted manually using the selected point area on the GUI. For example a user can click a point 1428 to select it and the point's location and velocity values will appear in the "Selected Point" area 1422. The user can then enter the desired location and velocity values for the selected point into the edit boxes. The user may also use the up/down arrows in each edit box to change the location and velocity values. If symmetry is enabled, then any point changes made on the left half of the graph will automatically reflected by the configured processor onto the right half of the graph.

Figure 14H:
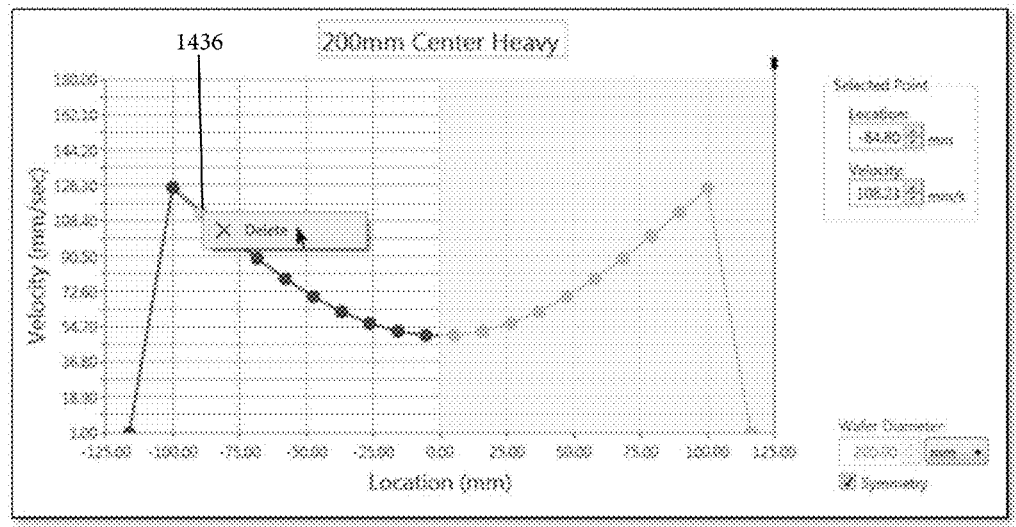
FIG. 14H is a screenshot of a graphical user interface in accordance with at least one embodiment disclosed herein.

In addition, points may be added to the graph line, for example to increase the resolution of the arm scan profile by placing the mouse pointer over any line segment between two adjacent points (e.g., segment 1434) and providing a user input instructing the processor to add a point, say, clicking the left mouse button. The added point will be automatically selected and can appear lime-green. As a result, the configured processor will update the arm scan with the new point and corresponding velocity by inserting an entry into the arm scan profile with the corresponding location and velocity value between the existing points. Similarly, a point may be deleted from the line graph by a user placing the mouse pointer over the desired point and then clicking the right mouse button. For example, as shown in FIG. 14H, the point 1436 will be selected and a context menu will appear. The user can then select "Delete" from the context menu to delete the point and then confirm deletion.

In addition, the graph's current units selection can be changed between "mm" and "inches" at any time by a user interacting with the dropdown list located near the bottom right corner of the window. Based on such input, all point values and graph axes values will be converted to the new units being selected by the configured processor and automatically save the updated units to the arm scanning profile.

The Arm scan profile module also configures the processor to provide a number of Arm Scanning Profile Configuration Options. Profile configuration options can include defining the number of points to generate for center heavy and center light profiles.

Figure 14I:
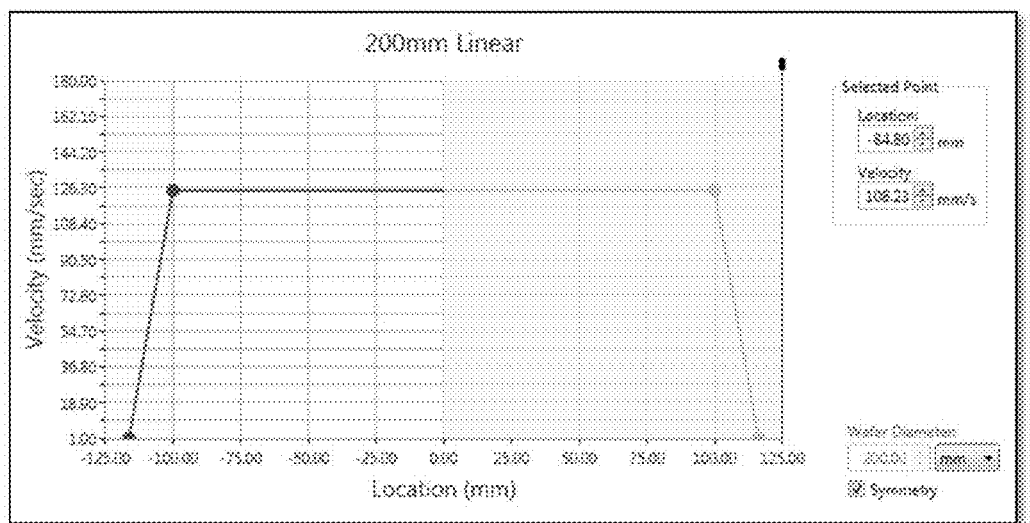
FIG. 14I is a screenshot of a graphical user interface in accordance with at least one embodiment disclosed herein.

In some implementations, by default, twenty profile points along the continuous arm scan path are generated when the "Center Heavy" or "Center Light" template has been selected in the "Arm Scanning Profile Wizard". However, the default number of points to generate can be changed to any value, for instance, between 10 and 64 points, inclusive. Profiles generated using the Linear template are created with four points. In some implementations, this value cannot be changed, however, points can be edited, added and deleted from the profile after it has been generated. FIG. 14I depicts an exemplary graphical display of a linear template.

As noted above, the configured processor can enforce restrictions on the modifications to the location and corresponding velocity of a point on the path. By default, the user can drag and drop points anywhere on the graph, without regard to the location of adjacent points. This freehand approach allows the user the most flexibility when creating an arm scanning profile. However, it would be the user's responsibility to ensure that all points are placed in increasing location value from left to right. However, the configured processor can evaluate the modified profile and, if this criteria is not met, display a dialog warning the user attempts to implement the profile in the system 100. The ability to enforce relative point placement can be enabled by a user input/command, for instance, clicking an "Enforce Relative Point Placement" checkbox in the GUI. When checked, the processor prevents a point from being moved to the other side of each of its adjacent points.

At this juncture, it should be noted that although much of the foregoing description has been directed to a system for performing a wet etching process and methods for wet etching wafers to reveal TSVs, the systems and methods disclosed herein can be similarly deployed and/or implemented in scenarios, situations, and settings far beyond the referenced scenarios. It can be readily appreciated that the system for performing a wet etching process can be effectively employed in practically any scenario in which a wafer is to be etched in a single wafer wet etching station to a desired surface uniformity and thickness.

It can also be readily appreciated that one or more of the steps described in relation to the step of generating an etch recipe, modifying wafer profiles and arm scan profiles and the like are not limited to wet etching processes. In particular, generating an arm scan profile, as described above, can be implemented in practically any scenario where it is desirable to create a customized path for an arm to travel in a processing environment. For example, an arm scan profile can be generated substantially in the same manner as described above can be applied to wafer cleaning applications in which the arm scan profile controls the dispensing of cleaning solution onto a wafer.

It is to be understood that like numerals in the drawings represent like elements through the several figures, and that not all components and/or steps described and illustrated with reference to the figures are required for all embodiments or arrangements.

Thus, illustrative embodiments and arrangements of the present systems and methods provide a system, processes and computer implemented control methods, computer system, and computer program product for wet etching wafers. The flowchart and block diagrams in the figures illustrate the architecture, functionality, and operation of possible implementations of systems, methods and computer program products according to various embodiments and arrangements. In this regard, each block in the flowchart or block diagrams as it relates to a computer implemented method can represent a module, segment, or portion of code, which comprises one or more executable instructions for implementing the specified logical function(s).

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The subject matter described above is provided by way of illustration only and should not be construed as limiting. Various modifications and changes can be made to the subject matter described herein without following the example embodiments and applications illustrated and described, and without departing from the true spirit and scope of the present invention, which is set forth in the following claims.

What is claimed:

1. A method for wet-etching a wafer according to a customized arm scan profile using a wafer wet etching processing system that includes a plurality of stations, the method comprising the steps of:

providing, at a process controller including a memory and a processor configured by executing instructions in the form of code therein, a wafer profile defining a target thickness of the wafer at each of a plurality of radial locations on a surface of the wafer after a first etching step and an initial thickness of the wafer at each of the plurality of radial locations;

identifying, with the processor, a characteristic variation in thickness across each of the plurality of radial locations, wherein the variation in thickness is determined based on a respective difference between the measured initial thickness and the target thickness of the wafer at each of the plurality of radial locations;

selecting, using the configured processor, an arm scan profile according to the identified characteristic variation in thickness across each of the plurality of radial locations;

displaying, by the processor on a display, an interactive graphical representation of the arm-scan profile, wherein the arm scan profile is represented as a chart including a plurality of points each of which has a respective first value on a first axis that corresponds to a respective radial location parameter and a respective second value on a second axis that corresponds to a respective arm scan speed parameter at the respective radial location of the plurality of radial locations;

receiving at the processor, a user interaction with a particular point on the graphical representation of the arm scan profile, wherein the user interaction includes a manipulation of one or more of the respective first value and the respective second value for the particular point;

updating, with the processor according to the manipulation of the one or more of the respective first value and the respective second value for the particular point, one or more of the respective radial location parameter and the arm scan speed parameter in the arm scan profile; and etching the wafer using the wafer wet etching apparatus according to the updated arm scan profile, wherein the arm scan profile controls movement of the arm during the first etching step causing a nozzle to selectively dispense a first etchant onto each of the plurality of radial locations thereby selectively thinning the wafer at each radial location.

2. The method of claim 1, wherein each of the plurality of radial locations is an annular area on the surface of the wafer that surrounds the center at a given radial distance or range of radial distances from the center.

3. The method of claim 1, wherein the arm scan profile causes the nozzle to selectively dispense a respective amount of the first etchant onto each of the plurality of radial locations, wherein the respective amount of the first etchant dispensed onto a particular radial location is a function of the respective arm scan speed parameter.

4. The method of claim 1, wherein providing the initial thickness at each of the plurality of radial locations comprises:

measuring, at a measuring station, the thickness of the substrate at each of the plurality of radial locations and recording the measured thicknesses.

5. The method of claim 1, wherein the characteristic variation in thickness comprises one or more of: uniform, edge heavy, edge light, center heavy, and center light.

6. The method of claim 1, wherein identifying the characteristic variation in thickness comprises:

calculating, with the processor, an etch depth for each of the plurality of radial locations, wherein the etch depth for a particular radial location is the difference between the measured initial thickness at the particular radial location and the target thickness at the particular radial location of the wafer, and wherein the etch-depths are non-uniform; and comparing the calculated etch depths for each of the plurality of radial locations to identify variations in etch depth as a function of radial location.

7. The method of claim 6, further comprising:

calculating a first etch time as a function of the calculated first etch depths and a first etch rate for the first etchant, and wherein the wafer is etched during the etching step according to the arm scan profile and for the calculated first etch time.

8. The method of claim 7, further comprising:

defining the radial location parameters of the arm scan profile to position the nozzle over each of the plurality radial locations;

defining, for each of the plurality of radial locations, the corresponding arm scan speed parameter as a function of the calculated etch depths; and wherein the radial location parameters, the arm scan speed parameters and the etch time controls the amount of etchant that is dispensed onto respective radial locations during etching and the etch depth at respective radial locations.

9. The method of claim 1, wherein the user interaction is a selection of the particular point of the chart and a relocation of the particular point along one or more of the axes, and further comprising:

tracking a change in position between where the selection of the particular point is initiated to a relocated position upon completion of the selection; and wherein the updating step further comprises: translating the change in position of the point along one or more of the axes into a modified value for one or more of the respective radial location parameter and the respective arm scan speed parameter.

10. The method of claim 9, wherein the updating step further comprises:

updating one or more of a respective radial location parameter and a respective arm scan speed parameter for one or more of the plurality of radial locations that precede or follow the particular point in the arm scan profile.

11. The method of claim 9, wherein the updating step further comprises:

determining, by the processor prior to the etching step, whether the modified value of the one or more of the respective radial location parameter and the respective arm scan speed parameter is valid according to pre-defined criteria; and if the parameter is valid, updating the arm scan profile with the modified value, and otherwise, rejecting the modification and providing a notification on the display.

12. The method of claim 11, wherein the predefined constraints include one or more of: a limit of the speed of the arm, a limit of the acceleration of the arm, a conflict between the modified radial location parameter and a respective radial location of the plurality of radial locations for one or more other points in the arm scan profile, and wherein the limit of the acceleration of the arm is determined as a function of a radial location parameter and an arm scan speed parameter at another point in the arm scan profile that precedes or follows the particular point.

13. The method of claim 1, wherein selecting an arm scan profile further comprises:

receiving, with the processor from a user interface, a selection of the arm scan profile template; and selecting the arm scan profile according to the wafer profile and the user selection.

14. A method for wet-etching a wafer according to a customized arm scan profile using a single wafer wet etching processing system, the method comprising the steps of:

selecting, using the configured processor, an arm scan profile;

displaying, by the processor on a display, an interactive graphical representation of the selected arm-scan profile, wherein the arm scan profile is represented as a chart including a plurality of points each of which has a respective first value on a first axis that corresponds to a respective radial location parameter and a respective second value on a second axis that corresponds to a respective arm scan speed parameter at the respective radial location of a plurality of radial locations;

receiving at the processor, a user interaction with a particular point on the graphical representation of the arm scan profile, wherein the user interaction includes a manipulation of one or more of the respective first value and the respective second value for the particular point;

updating, with the processor according to the manipulation of the one or more of the respective first value and the respective second value for the particular point, one or more of the respective radial location parameter and the arm scan speed parameter in the arm scan profile; and etching the wafer using the single wafer wet etching apparatus according to the updated arm scan profile, wherein the arm scan profile controls movement of the arm during the first etching step causing a nozzle to selectively dispense a first etchant onto each of the plurality of radial locations thereby selectively thinning the wafer at each radial location.

15. The method of claim 14, wherein each of the plurality of radial locations is an annular area on the surface of the wafer that surrounds the center at a given radial distance or range of radial distances from the center.

16. The method of claim 14, wherein the arm scan profile causes the nozzle to selectively dispense a respective amount of the first etchant onto each of the plurality of radial locations, wherein the respective amount of the first etchant dispensed onto a particular radial location is a function of the respective arm scan speed parameter.

17. The method of claim 14, further comprising:
measuring, at a measuring station, the thickness of the wafer at each of the plurality of radial locations and recording the measured thicknesses.

18. The method of claim 17, further comprising:
calculating, with the processor, an etch depth for each of the plurality of radial locations, wherein the etch depth for a particular radial location is the difference between the measured initial thickness at the particular radial location and a target thickness at the particular radial location of the wafer, and wherein the etch-depths are non-uniform.

19. The method of claim 18, further comprising:
calculating a first etch time as a function of the calculated first etch depths and a first etch rate for the first etchant, and wherein the wafer is etched during the etching step according to the arm scan profile and for the calculated first etch time.

20. The method of claim 19, further comprising:
defining the radial location parameters of the arm scan profile to position the nozzle over each of the plurality of radial locations;
defining, for each of the plurality of radial locations, the corresponding arm scan speed parameter as a function of the calculated etch depths; and
wherein the radial location parameters, the arm scan speed parameters and the etch time controls the amount of etchant that is dispensed onto respective radial locations during etching and the depth of wafer material etched at respective radial locations.

21. The method of claim 14, wherein the user interaction is a selection of the particular point of the chart and a relocation of the particular point along one or more of the axes, and further comprising:
tracking a change in position between where the selection of the particular point is initiated to a relocated position upon completion of the selection; and
wherein the updating step further comprises: translating the change in position of the point along one or more of the axes into a modified value for one or more of the respective radial location parameter and the respective arm scan speed parameter.

22. The method of claim 21, wherein the updating step further comprises:
updating one or more of a respective radial location parameter and a respective arm scan speed parameter for one or more of the plurality of radial locations that precede or follow the particular point in the arm scan profile.

23. The method of claim 21, wherein the updating step further comprises:
determining, by the processor prior to the etching step, whether the modified value of the one or more of the respective radial location parameter and the respective arm scan speed parameter is valid according to pre-defined criteria; and
if the parameter is valid, updating the arm scan profile with the modified value, and otherwise, rejecting the modification and providing a notification on the display.

24. The method of claim 23, wherein the predefined constraints include one or more of: a limit of the speed of the arm, a limit of the acceleration of the arm, a conflict between the modified radial location parameter and a respective radial location for one or more other points in the arm scan profile, and wherein the limit of the acceleration of the arm is determined as a function of a radial location parameter and an arm scan speed parameter at another point in the arm scan profile that precedes or follows the particular point.

25. The method of claim 17, wherein selecting the arm scan profile further comprises:
receiving, with the processor from a user interface, a user selection of the arm scan profile template; and
selecting, with the processor from database of arm scan profiles, the arm scan profile according to the wafer profile and the user selection.

26. A method for performing an operation on a wafer using a dispensing arm and according to a customized arm scan profile using a processing system that includes a plurality of stations and includes a process controller having a memory and a processor configured by executing instructions in the form of code therein, the method comprising the steps of:
selecting, using the configured processor, an arm scan profile;
displaying, by the processor on a display, an interactive graphical representation of the arm-scan profile, wherein the arm scan profile is represented as a chart including a plurality of points each of which has a respective first value on a first axis that corresponds to a respective radial location parameter relative to a surface of the wafer and a respective second value on a second axis that corresponds to a respective arm scan speed parameter at the respective radial location;
receiving at the processor, a user interaction with a particular point on the graphical representation of the arm scan profile, wherein the user interaction includes a manipulation of one or more of the respective first value and the respective second value for the particular point;
updating, with the processor according to the manipulation of the one or more of the respective first value and the respective second value for the particular point, one or more of the respective radial location parameter and the arm scan speed parameter in the arm scan profile; and performing the operation on the wafer using the processing system according to the updated arm scan profile, wherein the arm scan profile controls movement of the dispensing arm during performance of the operation.

27. The method of claim 26, wherein the operation comprises wet-etching the wafer.

* * * * *